(12) United States Patent
Ogiwara et al.

(10) Patent No.: US 9,966,136 B2
(45) Date of Patent: May 8, 2018

(54) SEMICONDUCTOR MEMORY DEVICE INCLUDING VARIABLE RESISTANCE ELEMENT

(71) Applicant: TOSHIBA MEMORY CORPORATION, Minato-ku, Tokyo (JP)

(72) Inventors: Ryu Ogiwara, Kanagawa (JP); Daisaburo Takashima, Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days. days.

(21) Appl. No.: 15/443,084

(22) Filed: Feb. 27, 2017

(65) Prior Publication Data

US 2018/0075903 A1    Mar. 15, 2018

Related U.S. Application Data

(60) Provisional application No. 62/385,364, filed on Sep. 9, 2016.

(51) Int. Cl.
*G11C 13/00* (2006.01)
*H01L 45/00* (2006.01)
*H01L 27/24* (2006.01)

(52) U.S. Cl.
CPC ........ *G11C 13/004* (2013.01); *H01L 27/2436* (2013.01); *H01L 45/12* (2013.01)

(58) Field of Classification Search
CPC ............ G11C 13/0069; G11C 13/0004; G11C 13/0007; G11C 2213/79
USPC ........................................................ 365/148
See application file for complete search history.

(56) References Cited

U.S. PATENT DOCUMENTS

| 5,894,447 A | 4/1999 | Takashima |
| 8,923,050 B2 | 12/2014 | Cernea et al. |
| 2013/0077383 A1* | 3/2013 | Huang ............... G11C 13/0004 365/148 |

(Continued)

FOREIGN PATENT DOCUMENTS

| JP | 2015-103271 A | 6/2015 |
| WO | WO-2013/183101 A1 | 1/2016 |

OTHER PUBLICATIONS

Kinoshita, et al.: "Scalable 3-D vertical chain-cell type phase-change memory with $4F^2$ poly-Si diodes", Symposium on VLSI Technology Digest of Technical Papers, pp. 35-36, 2012.

(Continued)

*Primary Examiner* — Huan Hoang
*Assistant Examiner* — Minh Dinh
(74) *Attorney, Agent, or Firm* — Foley & Lardner LLP

(57) ABSTRACT

According to one embodiment, a variable resistance memory includes first to third insulating layers, first and second variable resistance layers, first and second semiconductor layers, and first and second electric conductors. The first insulating layer extends in a first direction. The first and second electric conductors are in contact with the second and third insulating layers respectively. The first to third insulating layers, the first and second variable resistance layers and the first and second semiconductor layers are disposed between the first and second electric conductors in a second direction different from the first direction.

16 Claims, 40 Drawing Sheets

(56) References Cited

U.S. PATENT DOCUMENTS

| | | | |
|---|---|---|---|
| 2014/0063912 A1* | 3/2014 | Aiga | ........................ H01L 45/08 |
| | | | 365/148 |
| 2015/0146474 A1 | 5/2015 | Murooka | |
| 2015/0155479 A1 | 6/2015 | Sasago | |
| 2015/0206580 A1* | 7/2015 | Toriyama | ............ G11C 13/0007 |
| | | | 365/148 |
| 2015/0249113 A1* | 9/2015 | Takagi | ................ H01L 45/1233 |
| | | | 257/5 |

OTHER PUBLICATIONS

Nitayama, et al.: "Bit Cost Scalable (BiCS) Technology for Future Ultra High Density Memories", Symposium on VLSI Technology Digest of Technical Papers, 2013.

Nowak et al.: "Intrinsic Fluctuations in Vertical NAND Flash Memories", Symposium on VLSI Technology Digest of Technical Papers, pp. 21-22, 2012.

Sasago et al.: "Phase-change memory driven by poly-Si MOS transistor with low cost and high-programming gigabyte-per-second throughput", Symposium on VLSI Technology Digest of Technical Papers, 5B-2, pp. 96-97, 2011.

* cited by examiner

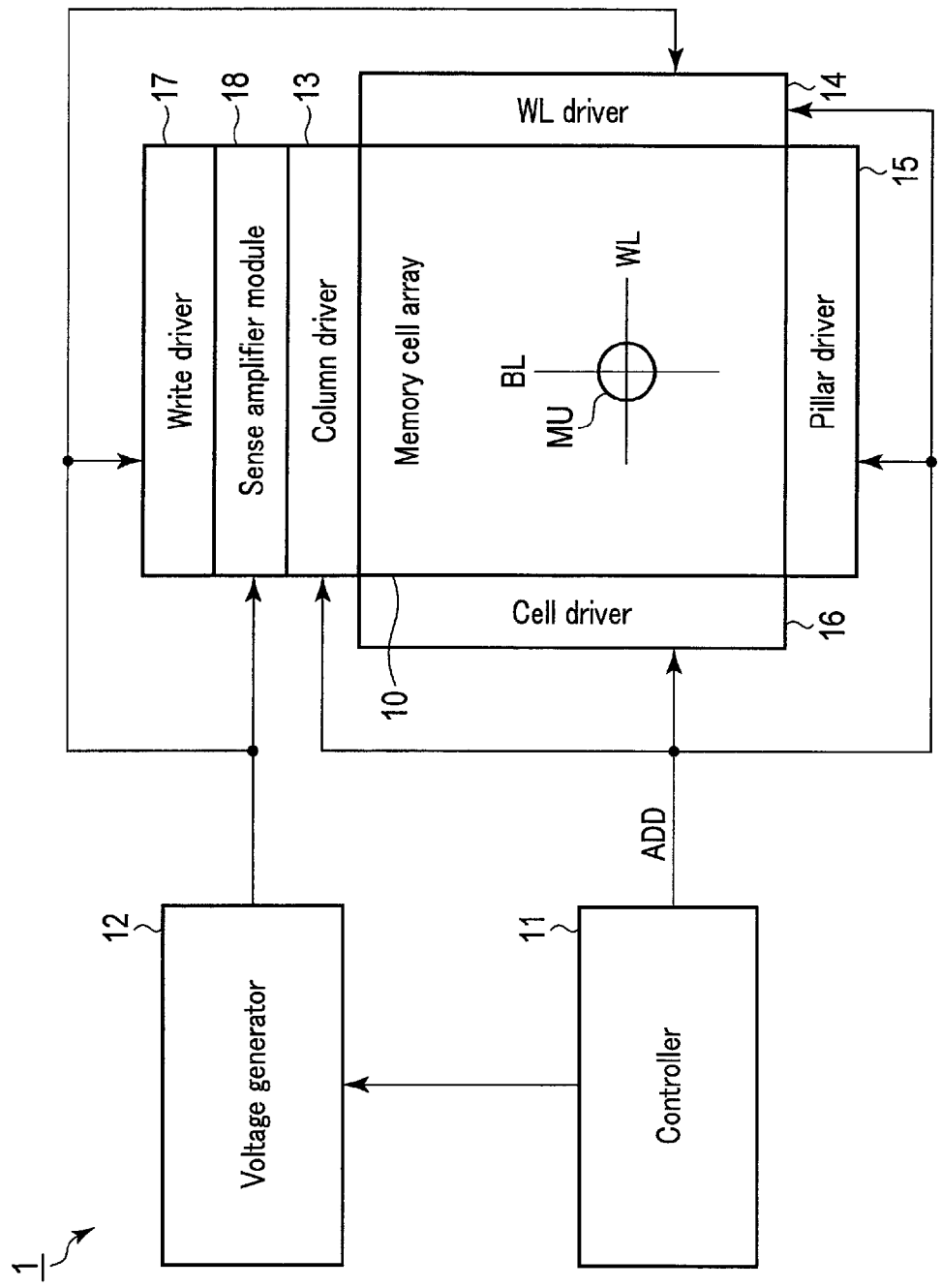
F I G. 1

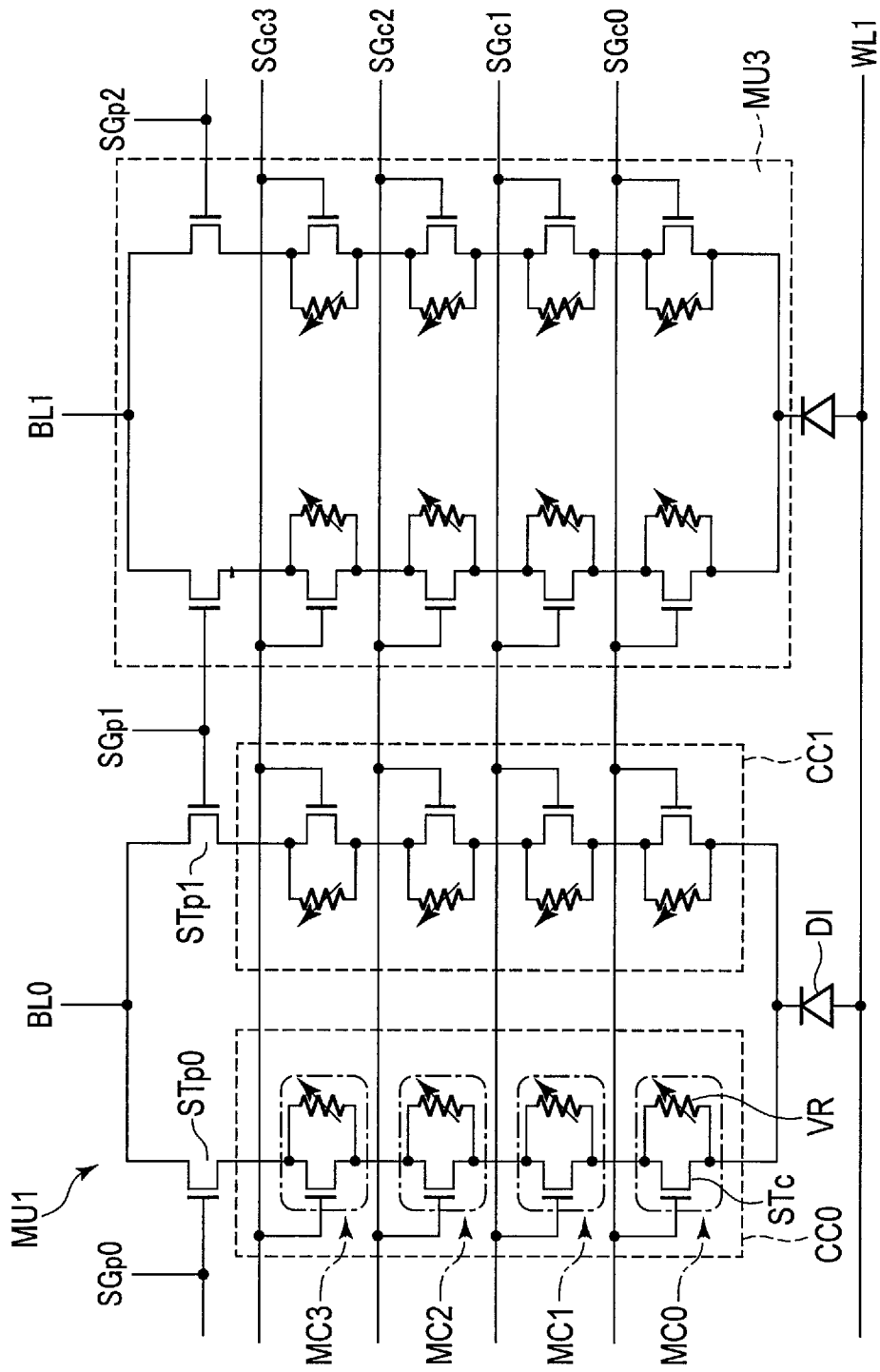
F I G. 3

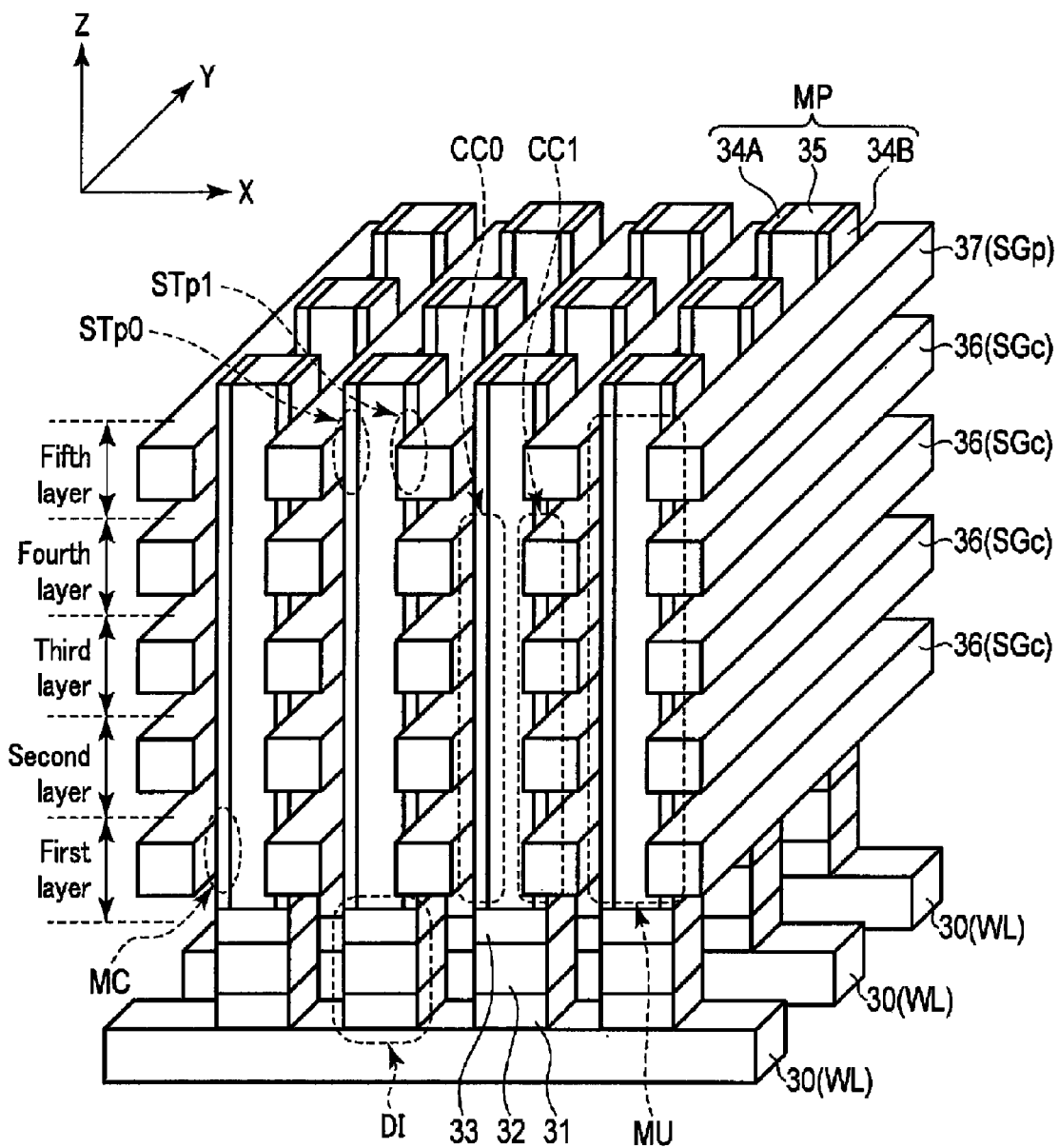
F I G. 6

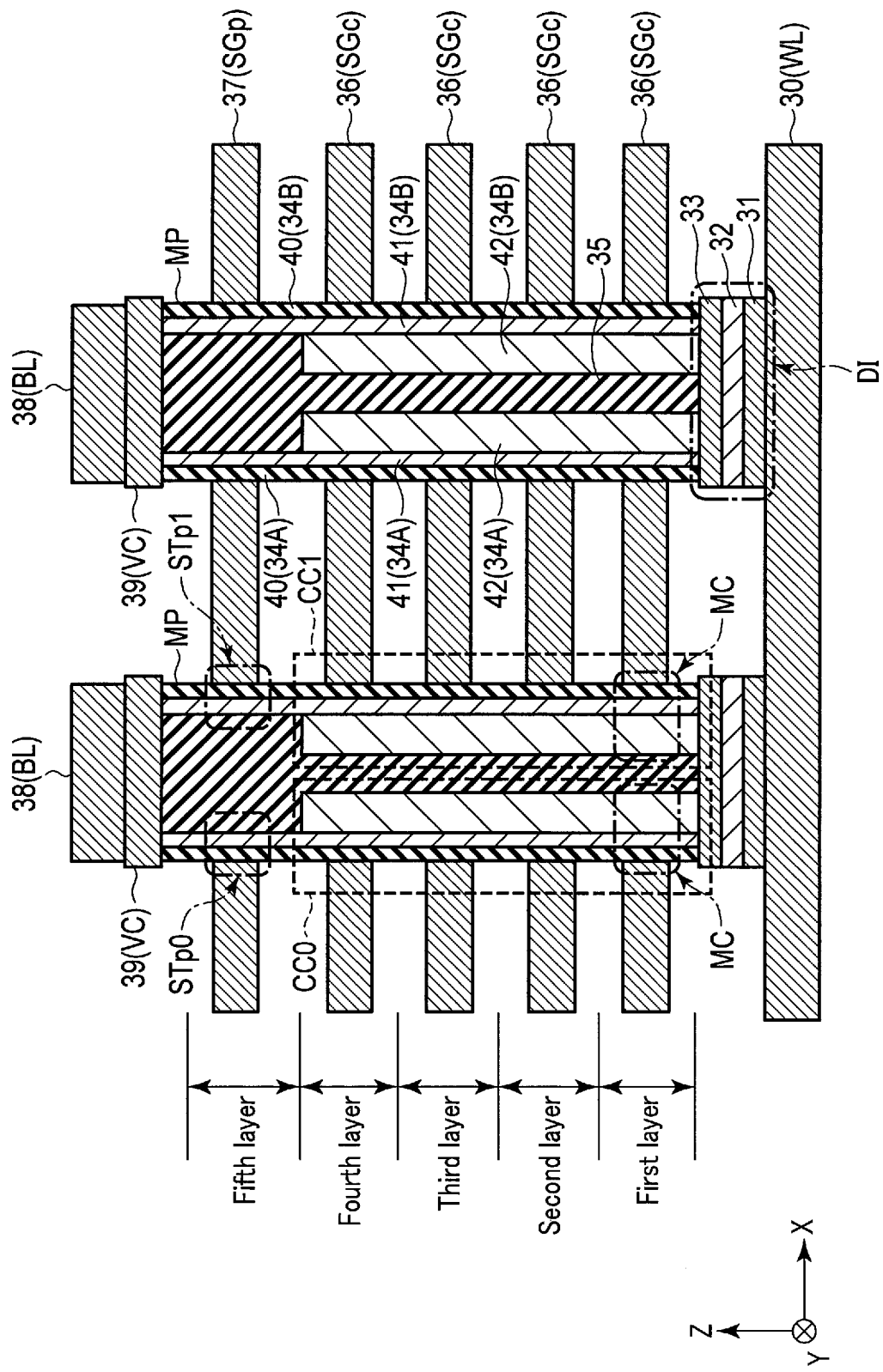
F I G. 8

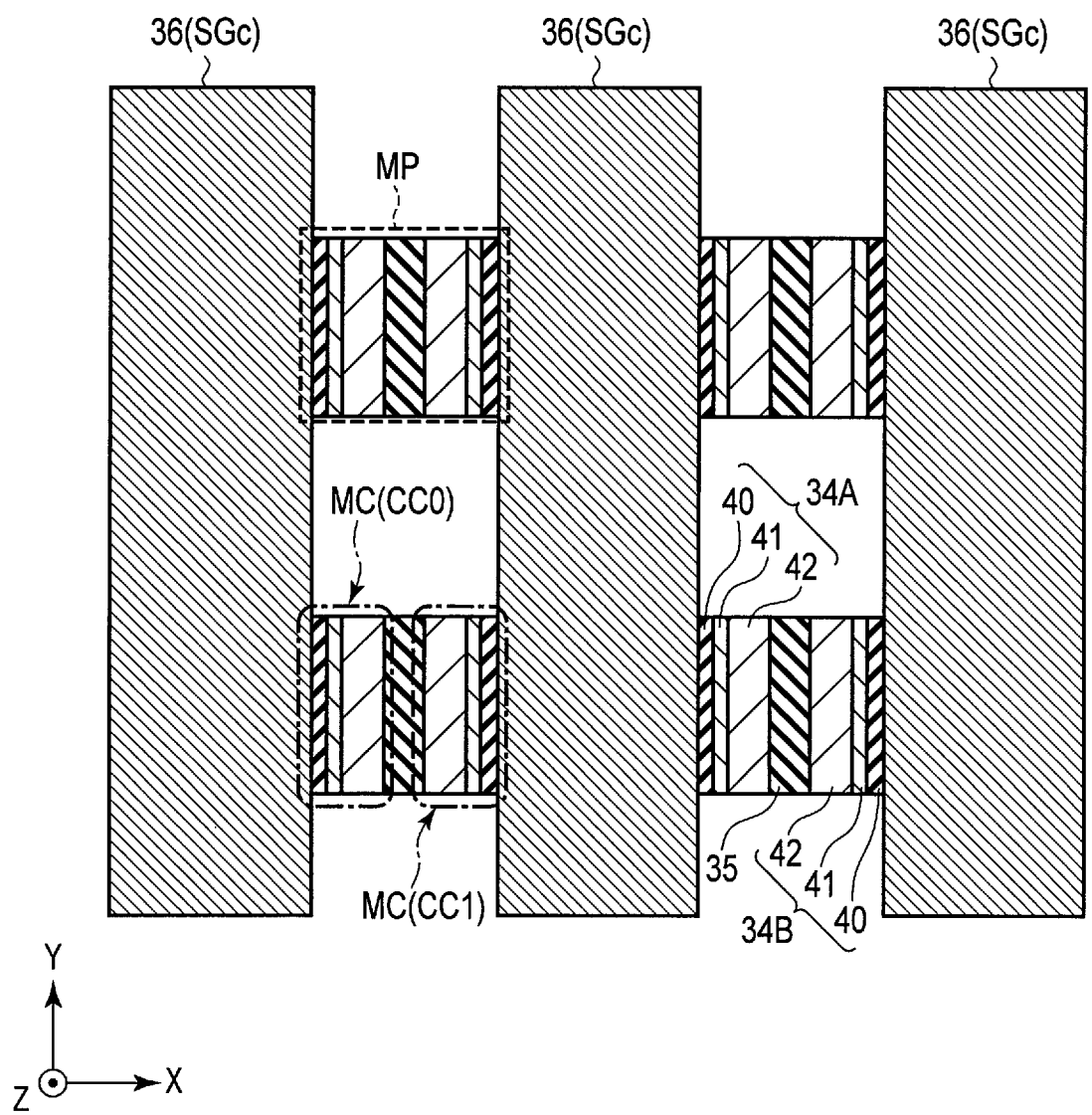
F I G. 9

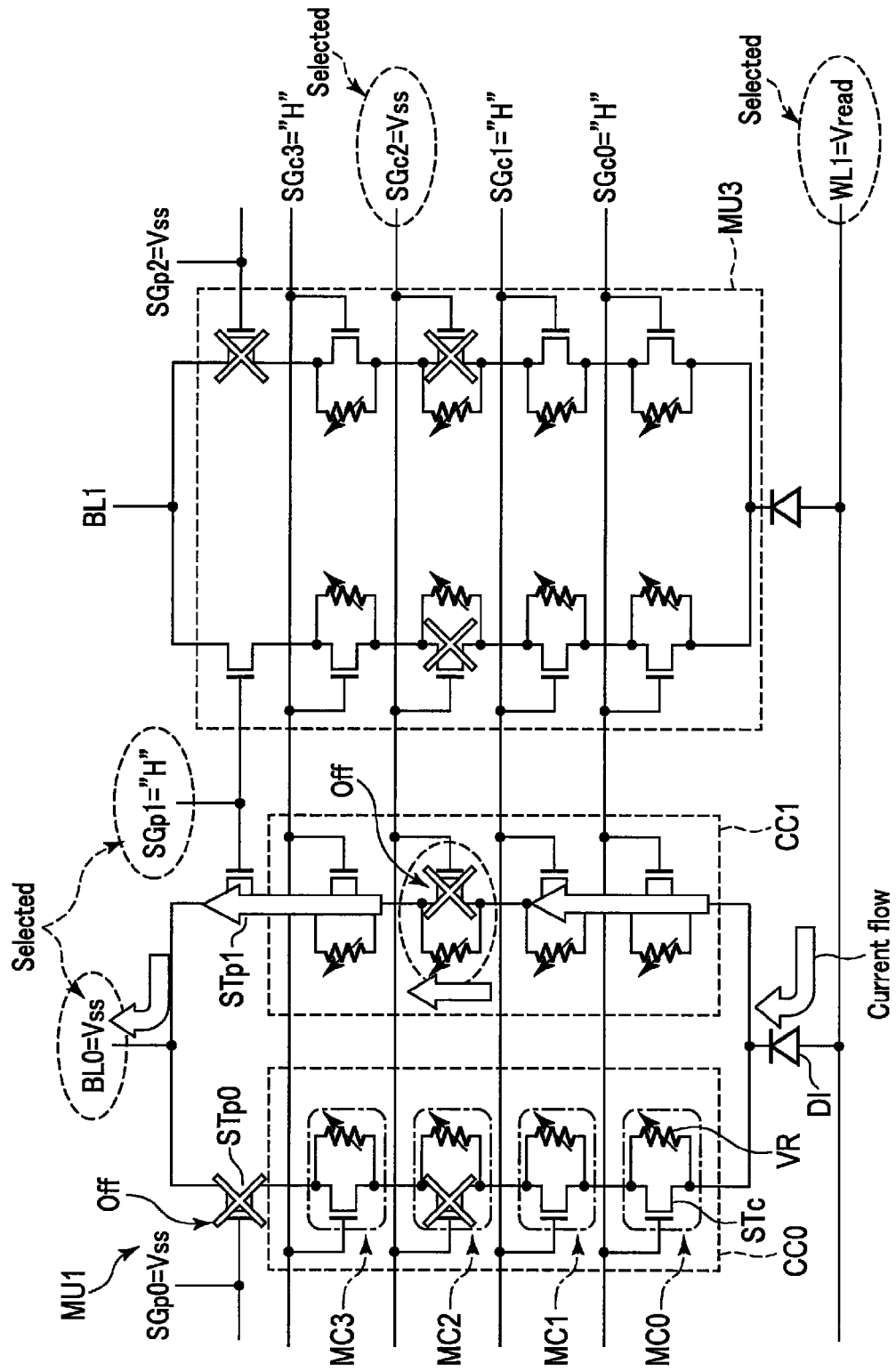
F I G. 12

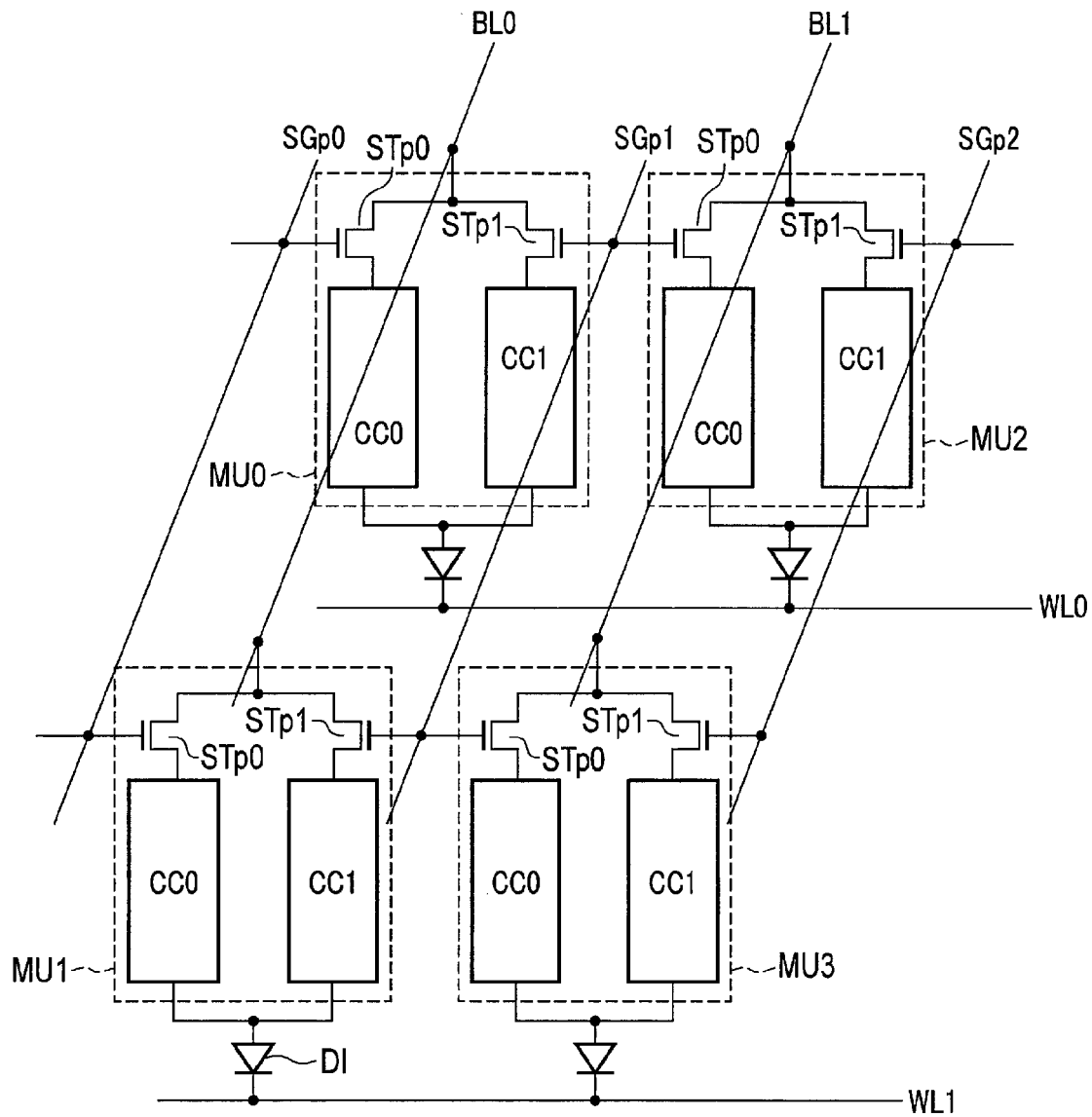
F I G. 15

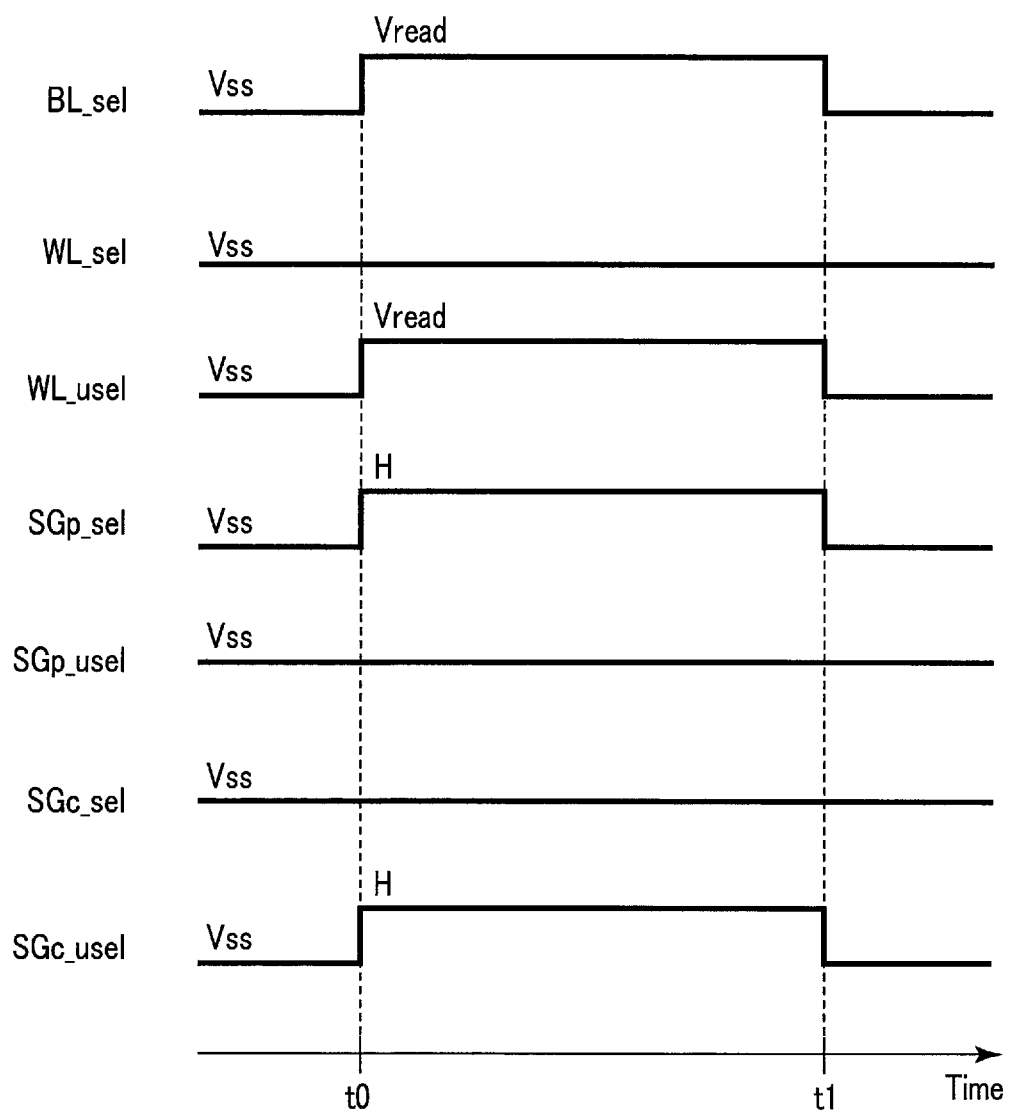
F I G. 16

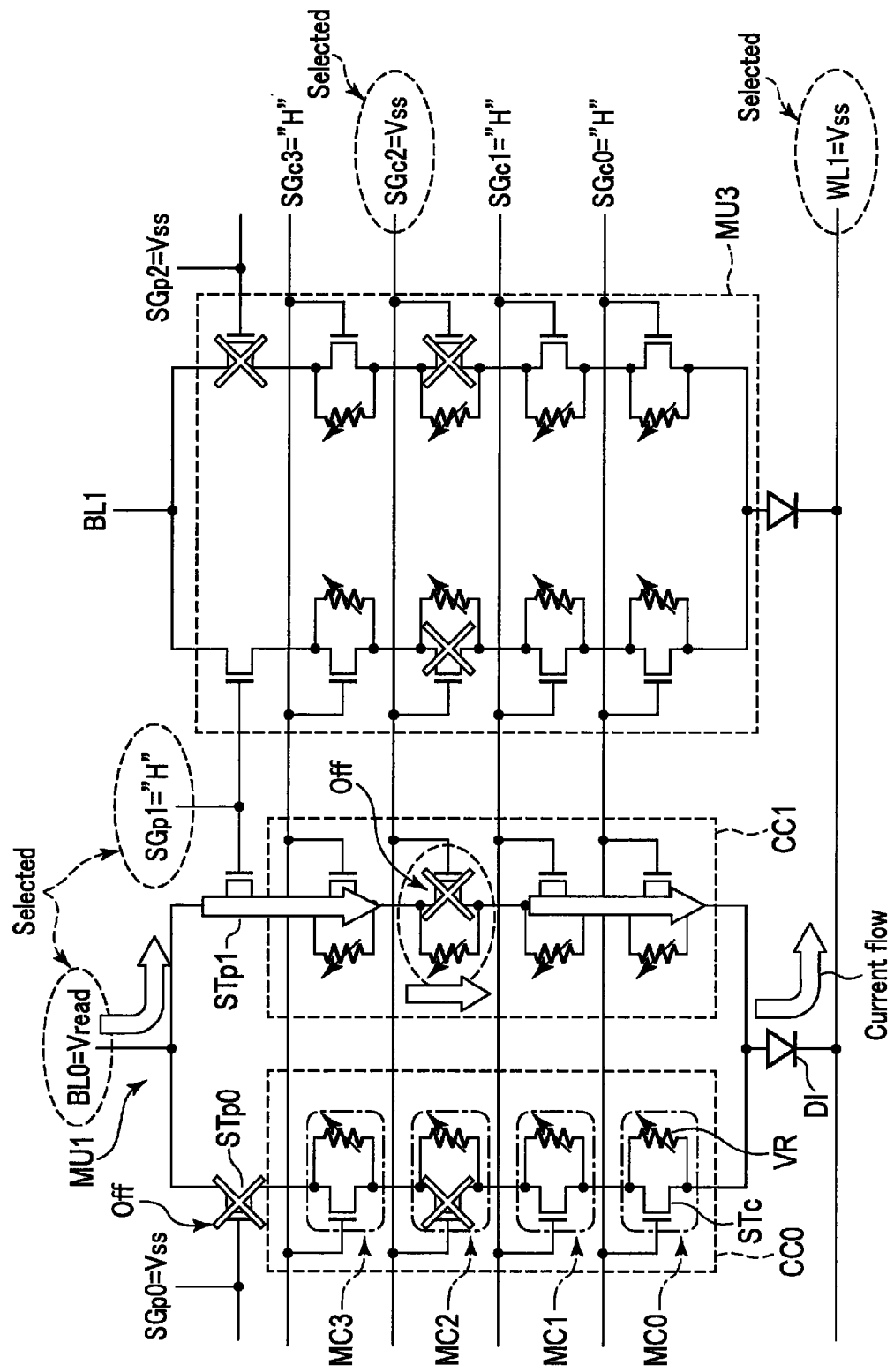
F I G. 17

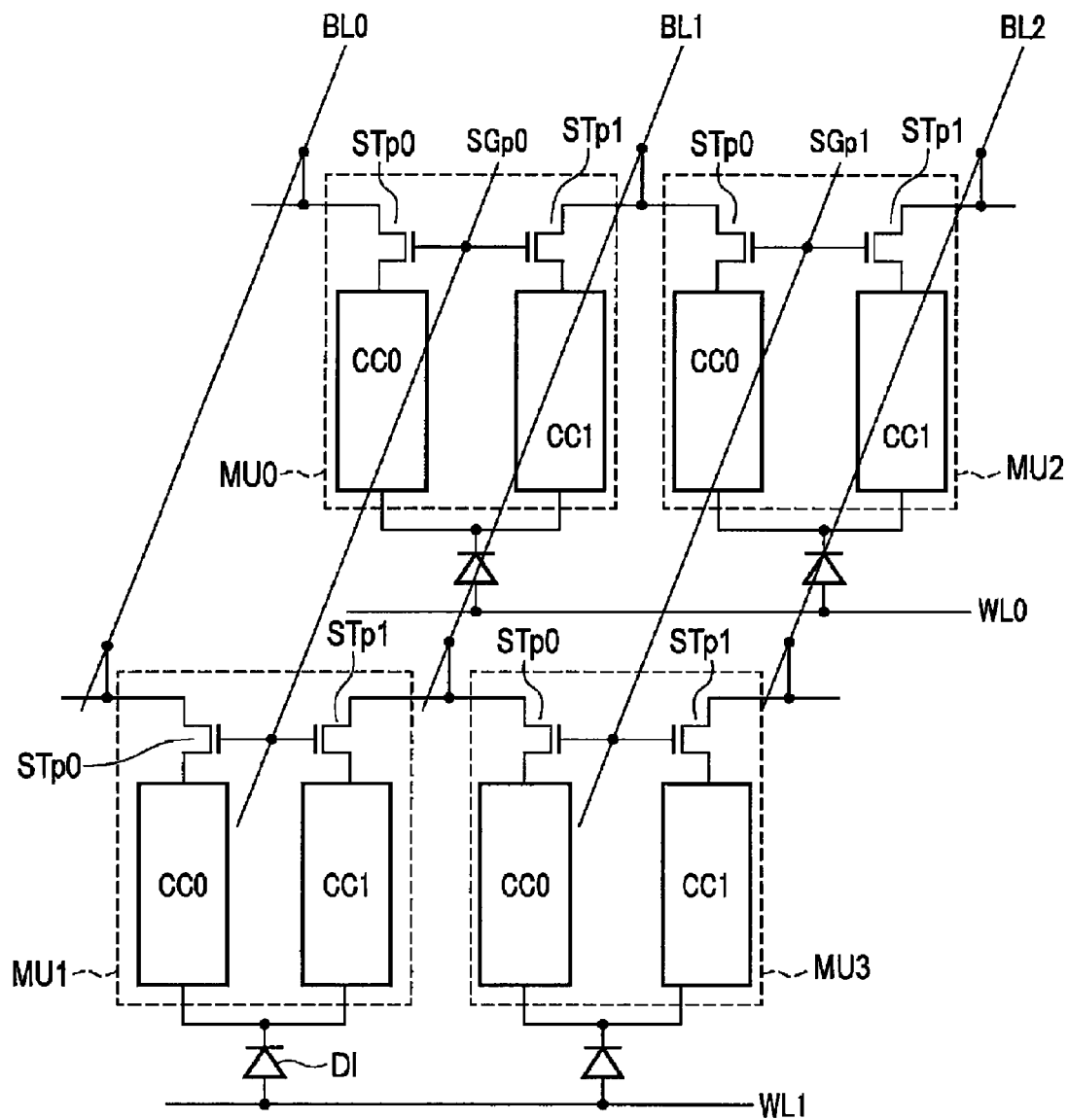
F I G. 18

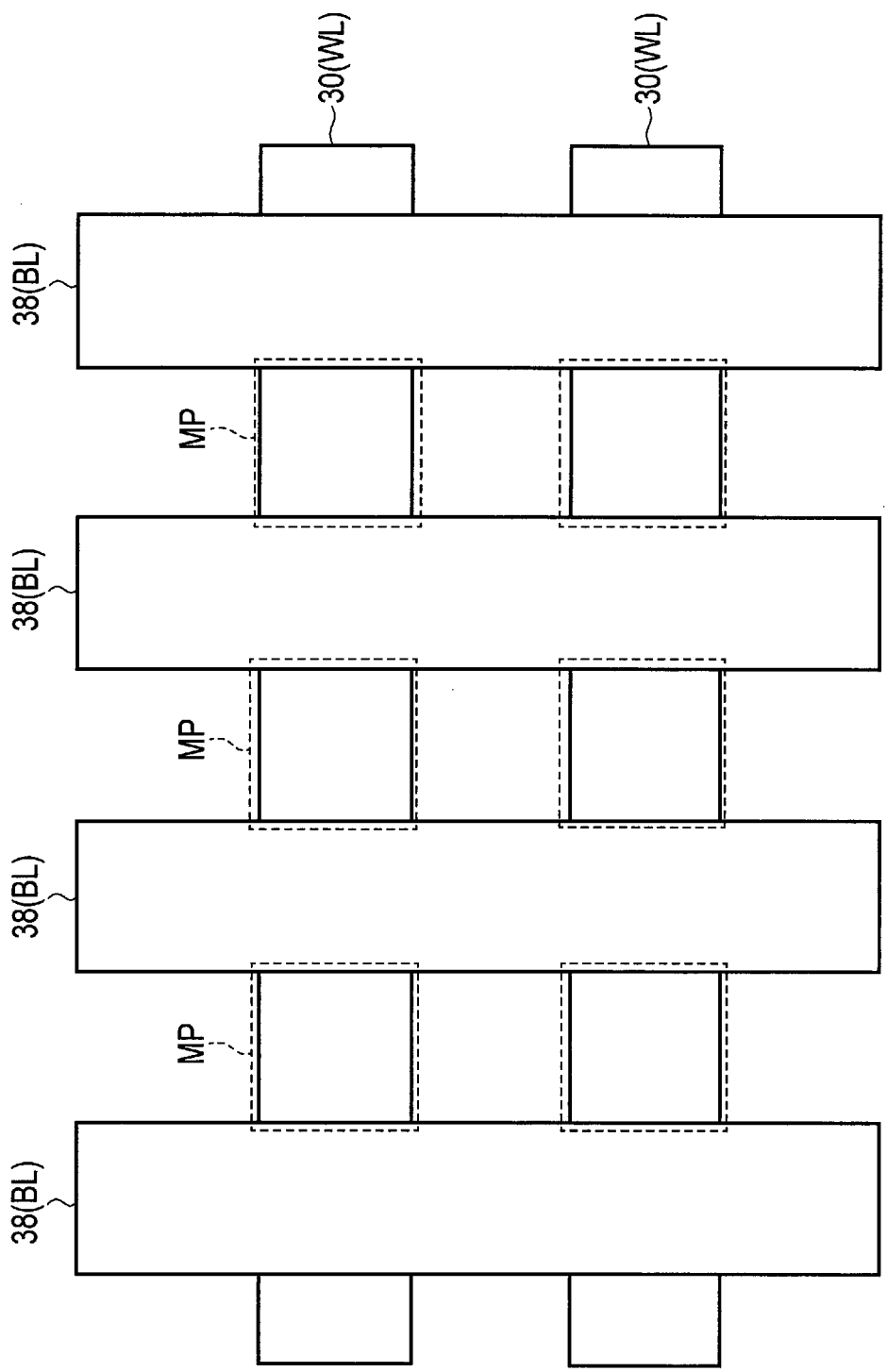
F I G. 20

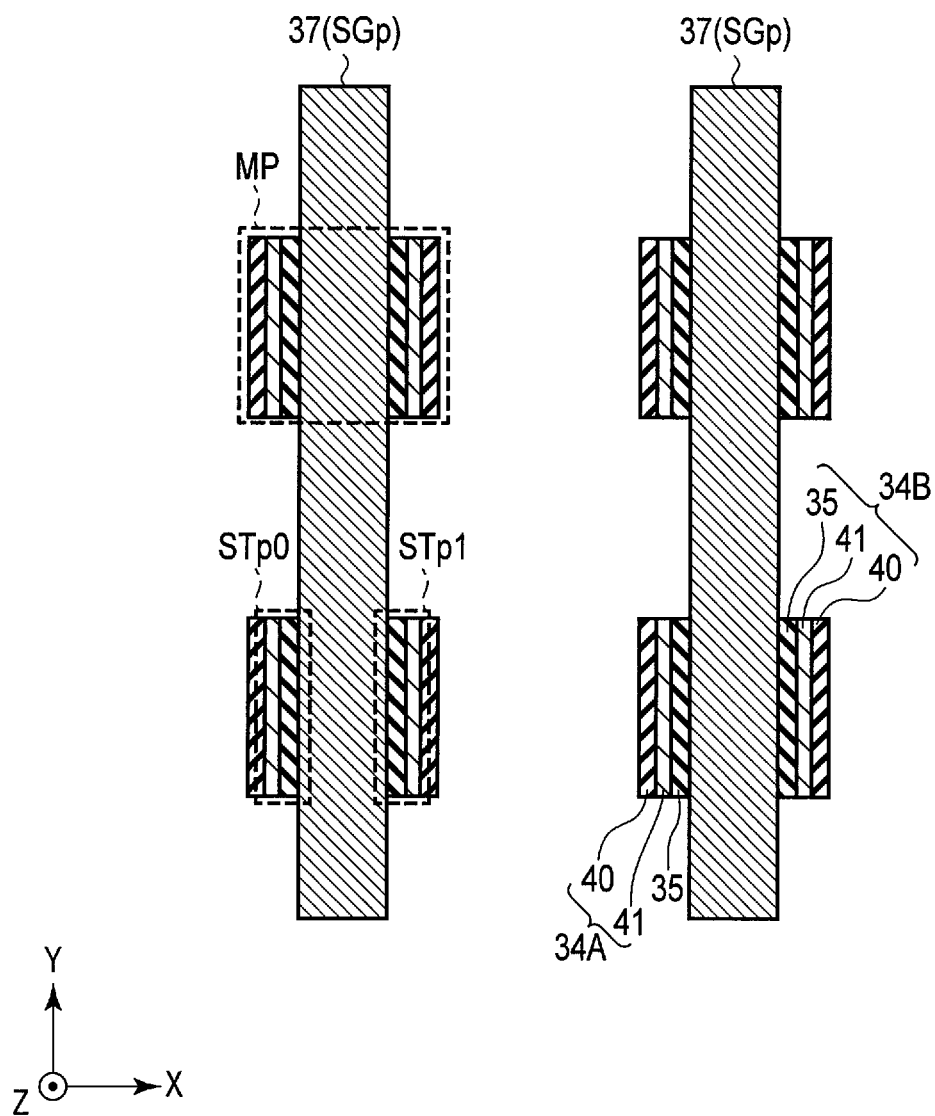
F I G. 22

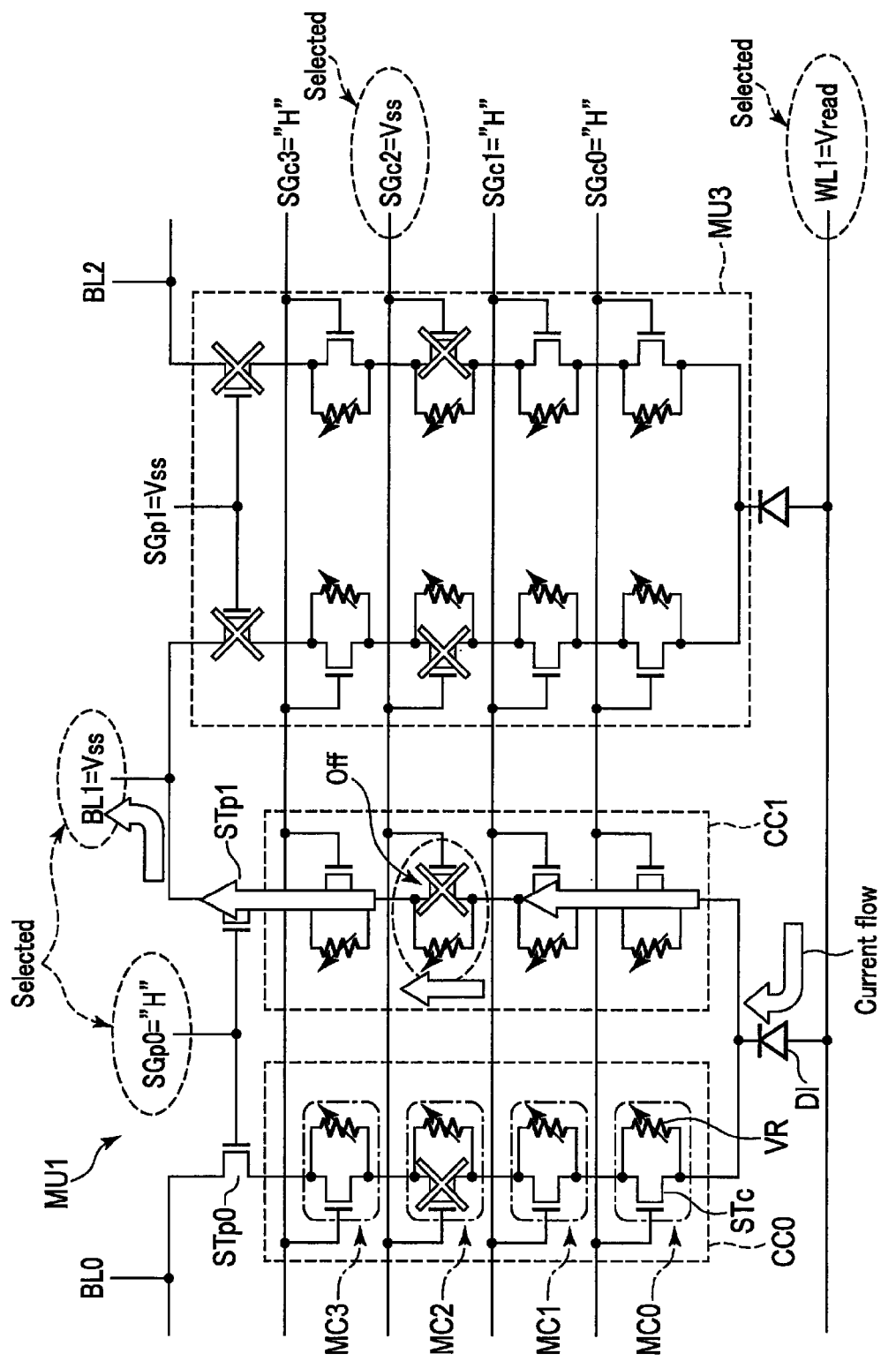
F I G. 23

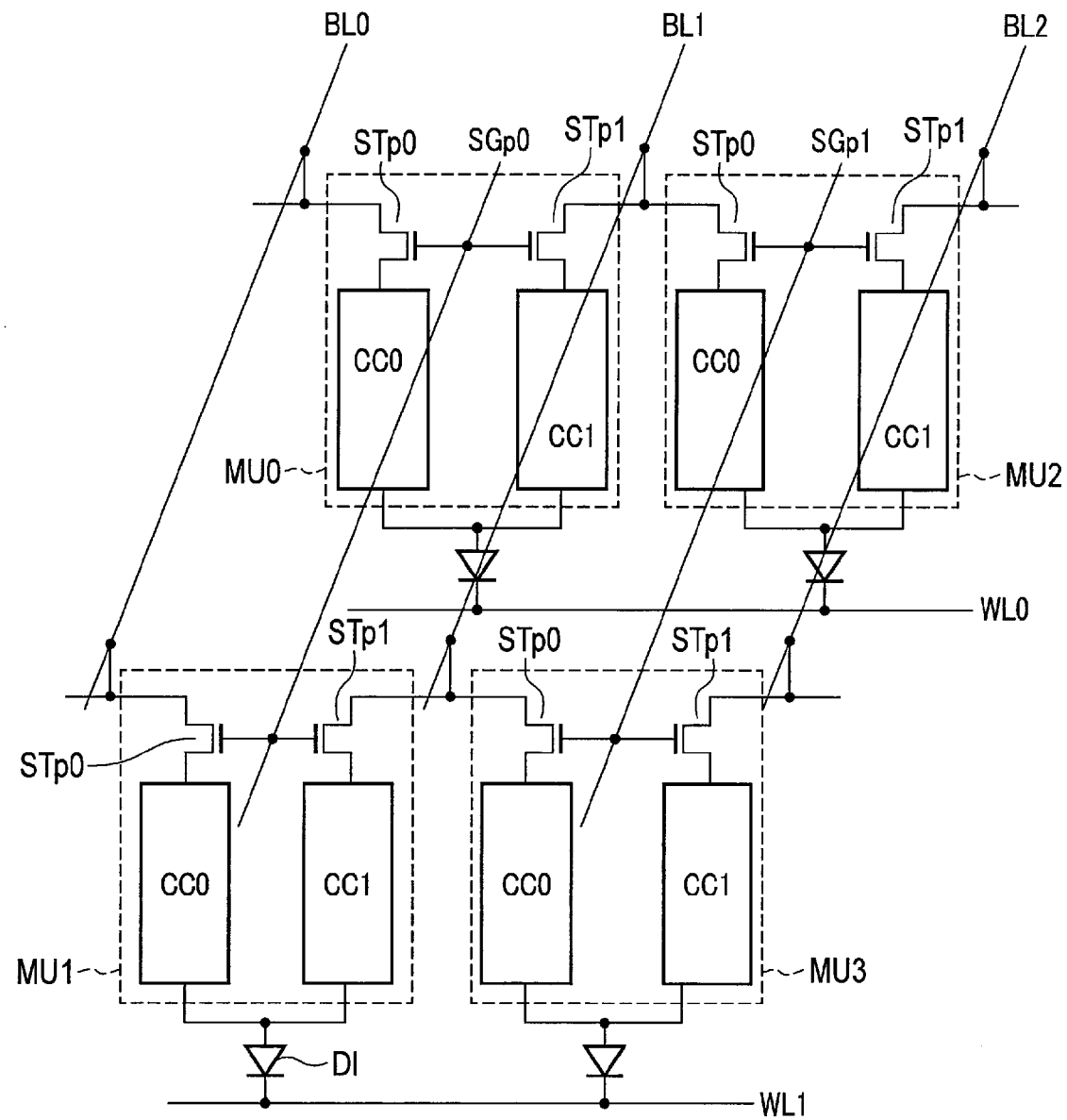
F I G. 24

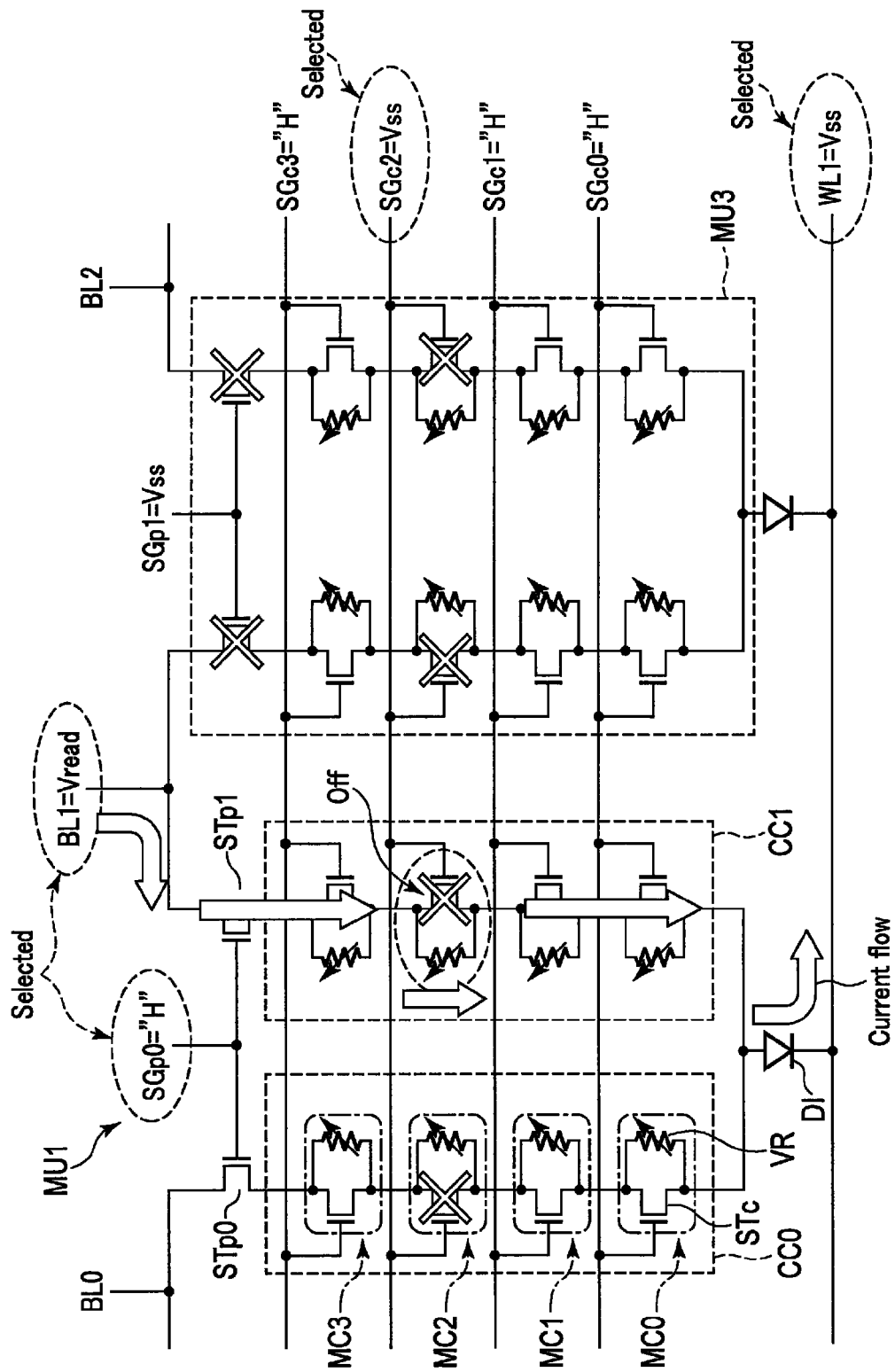
F I G. 25

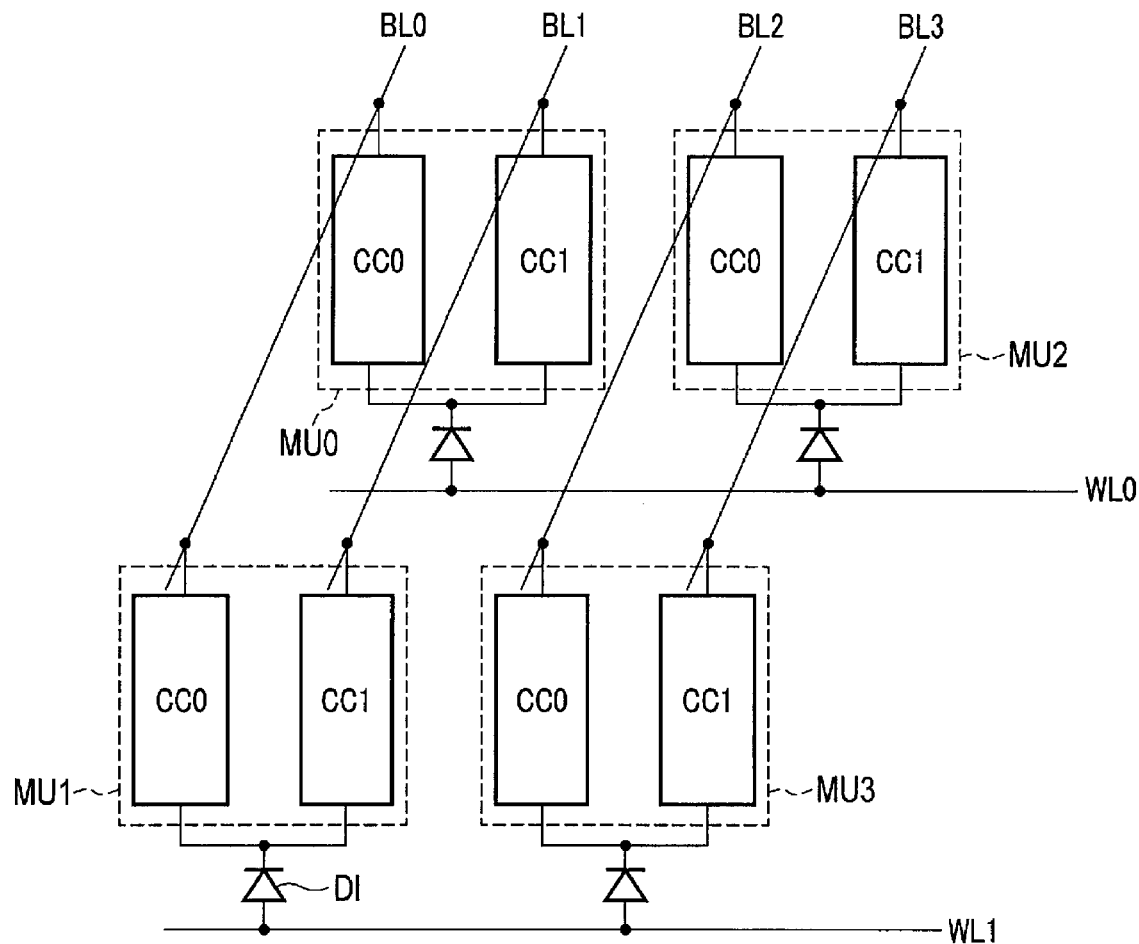
F I G. 26

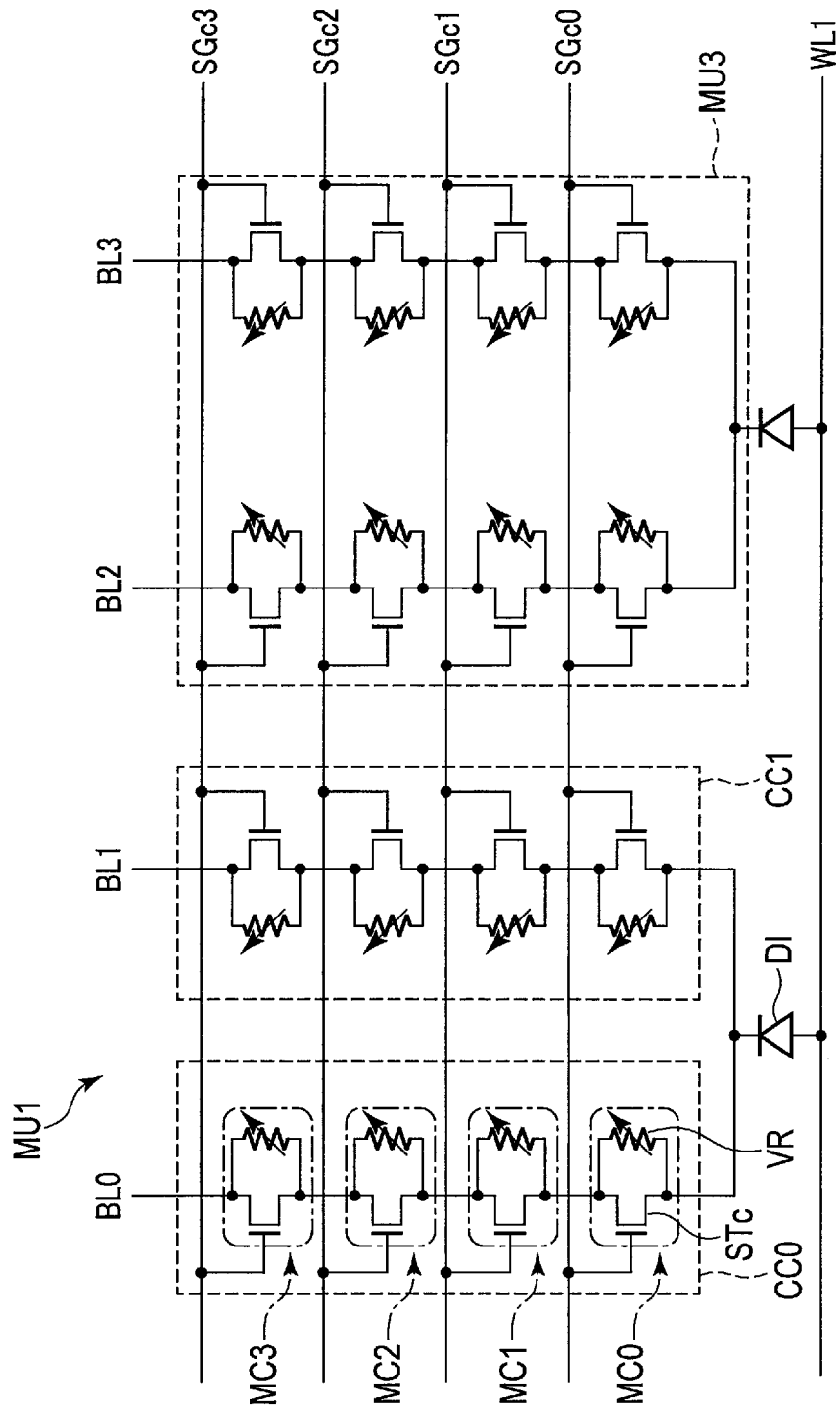
F I G. 27

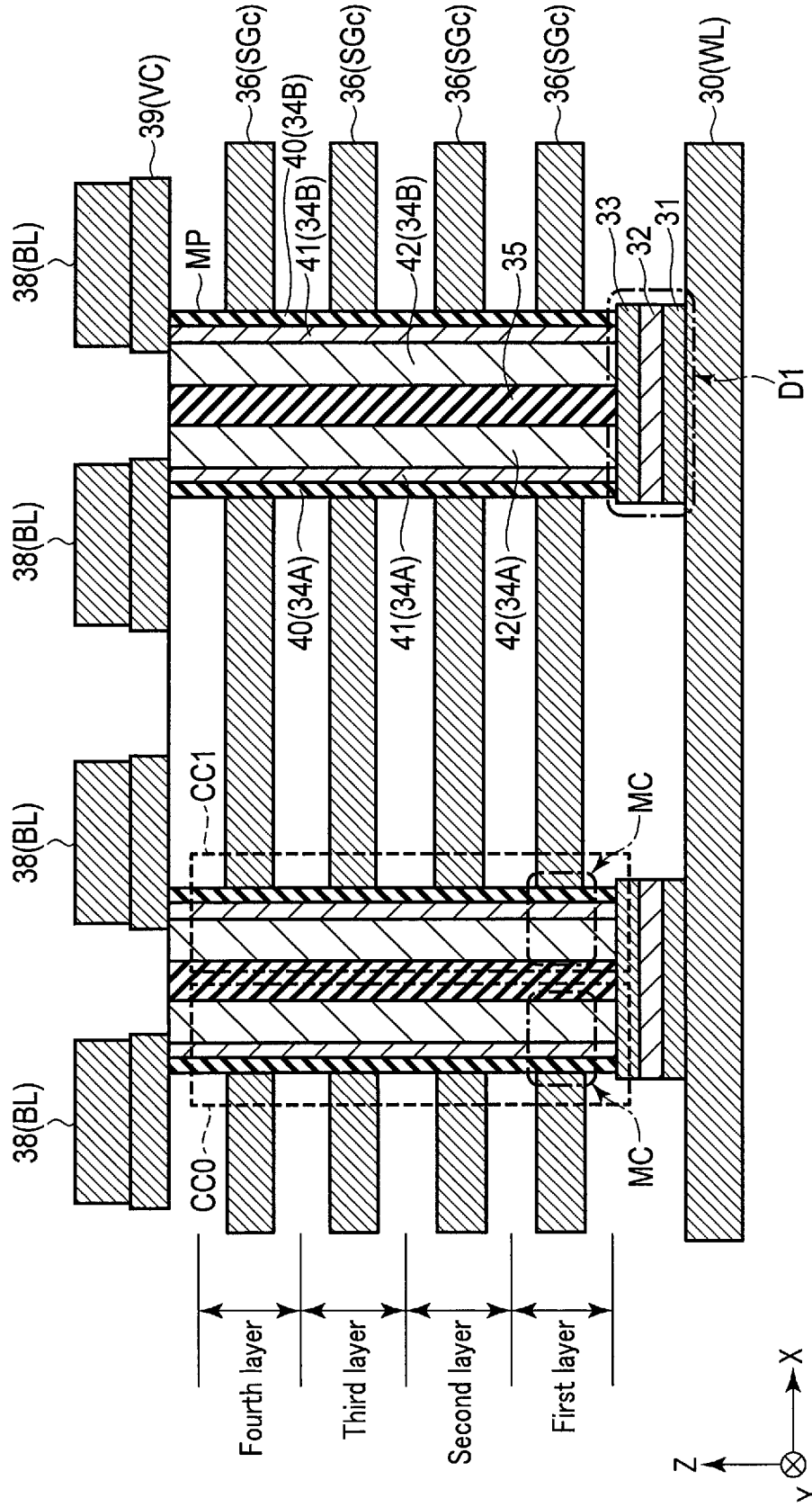
F I G. 29

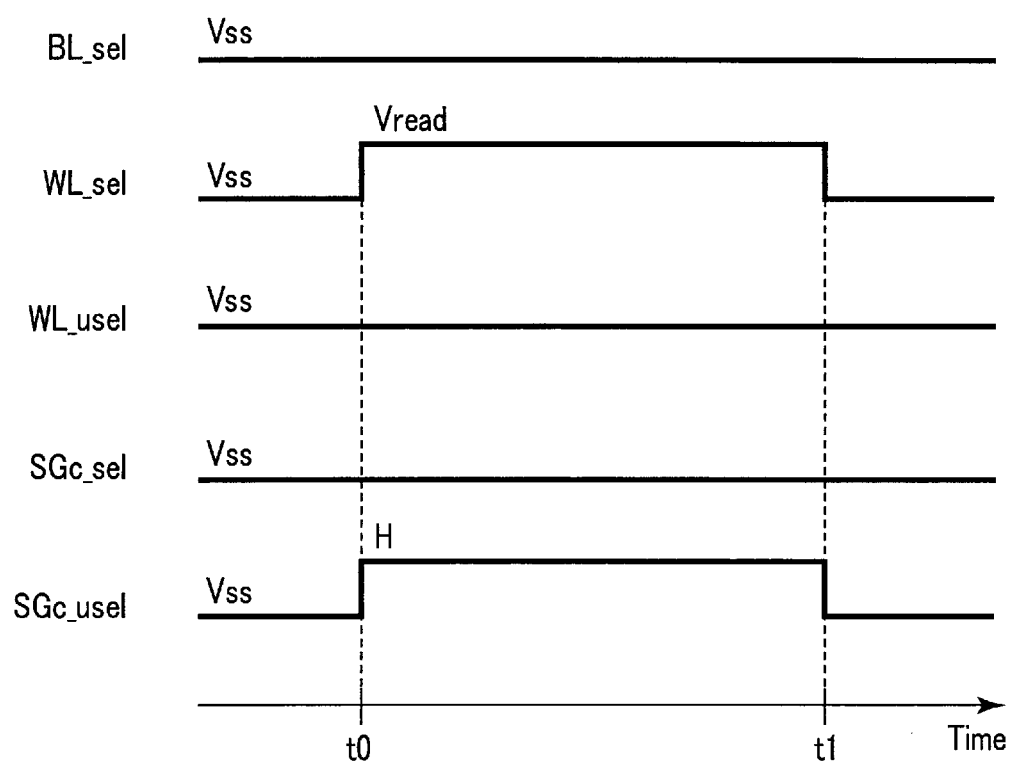
F I G. 30

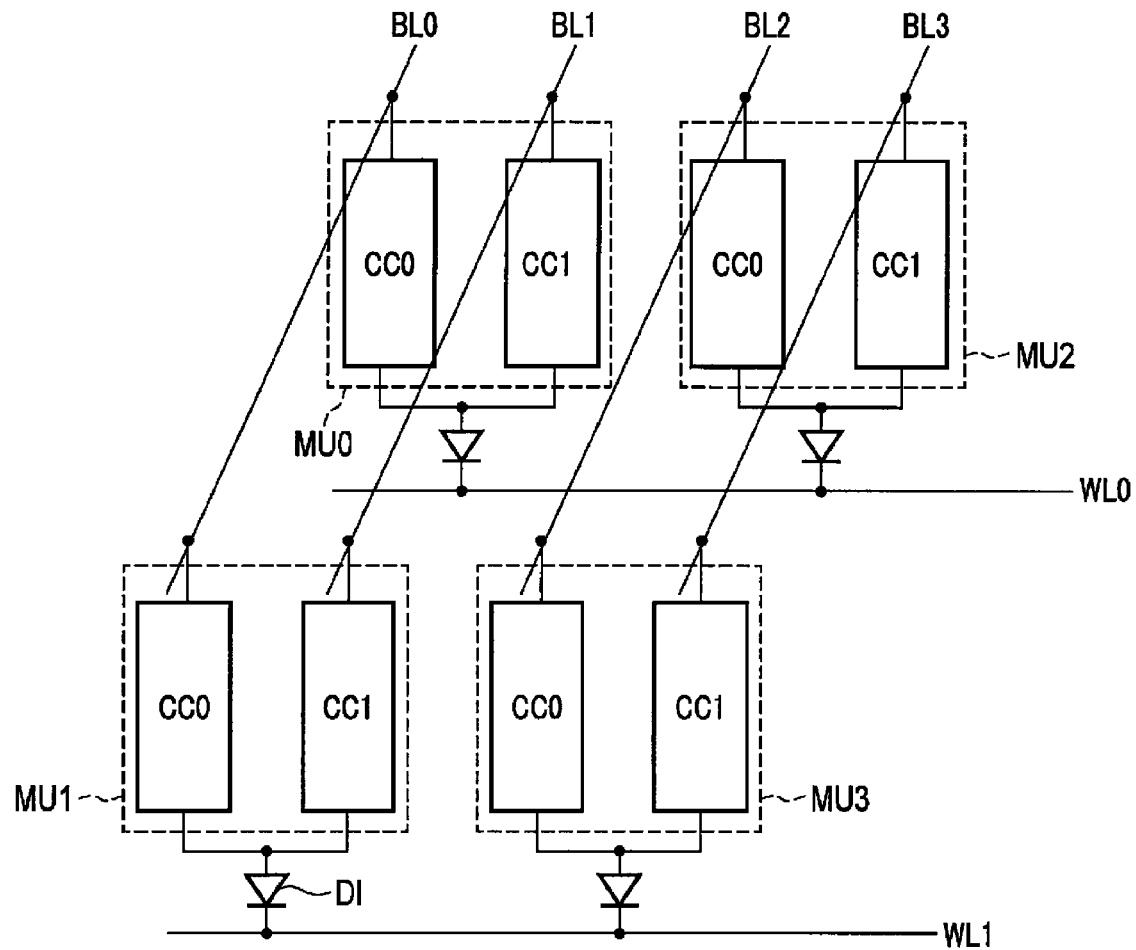
F I G. 32

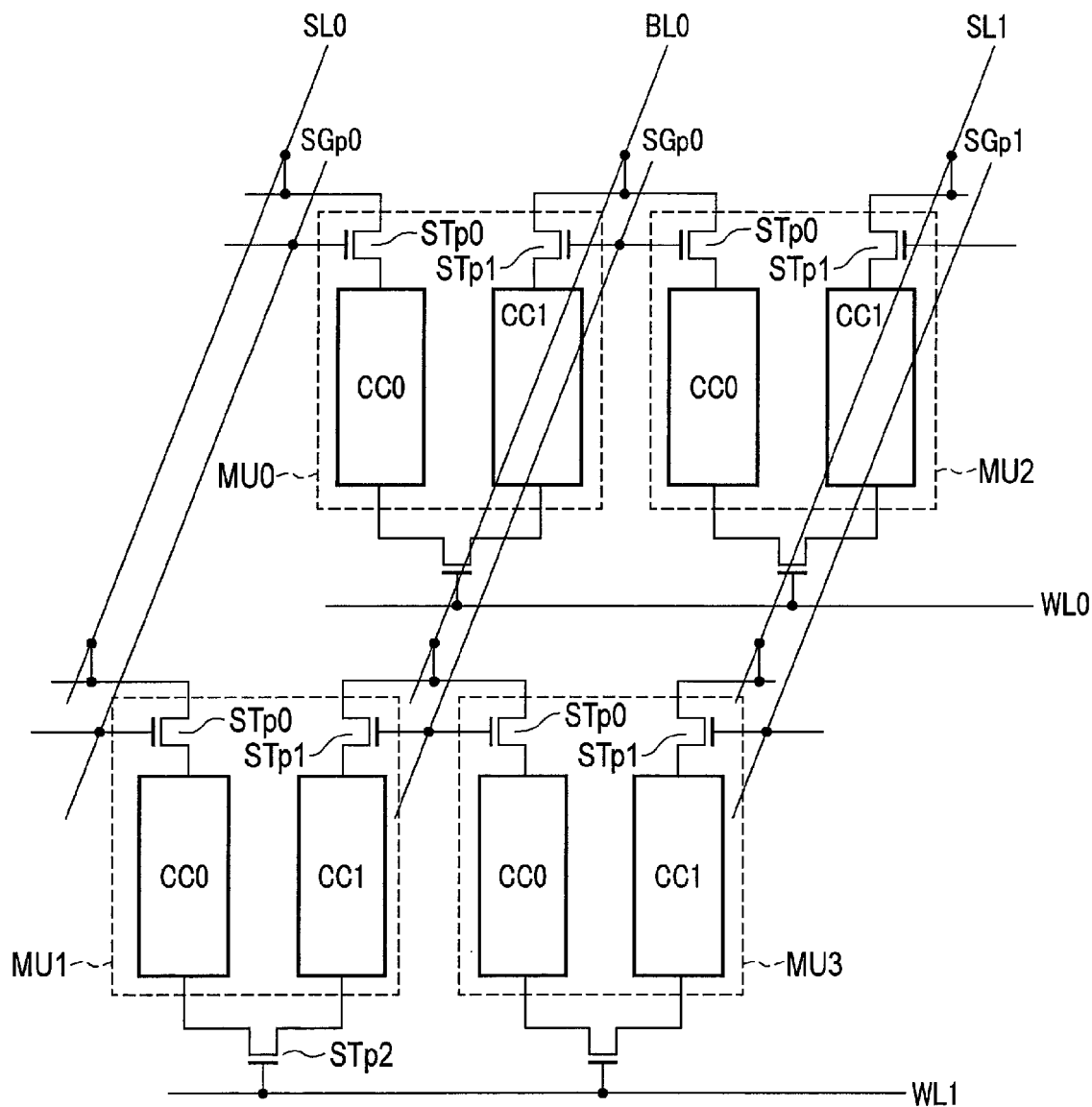
F I G. 34

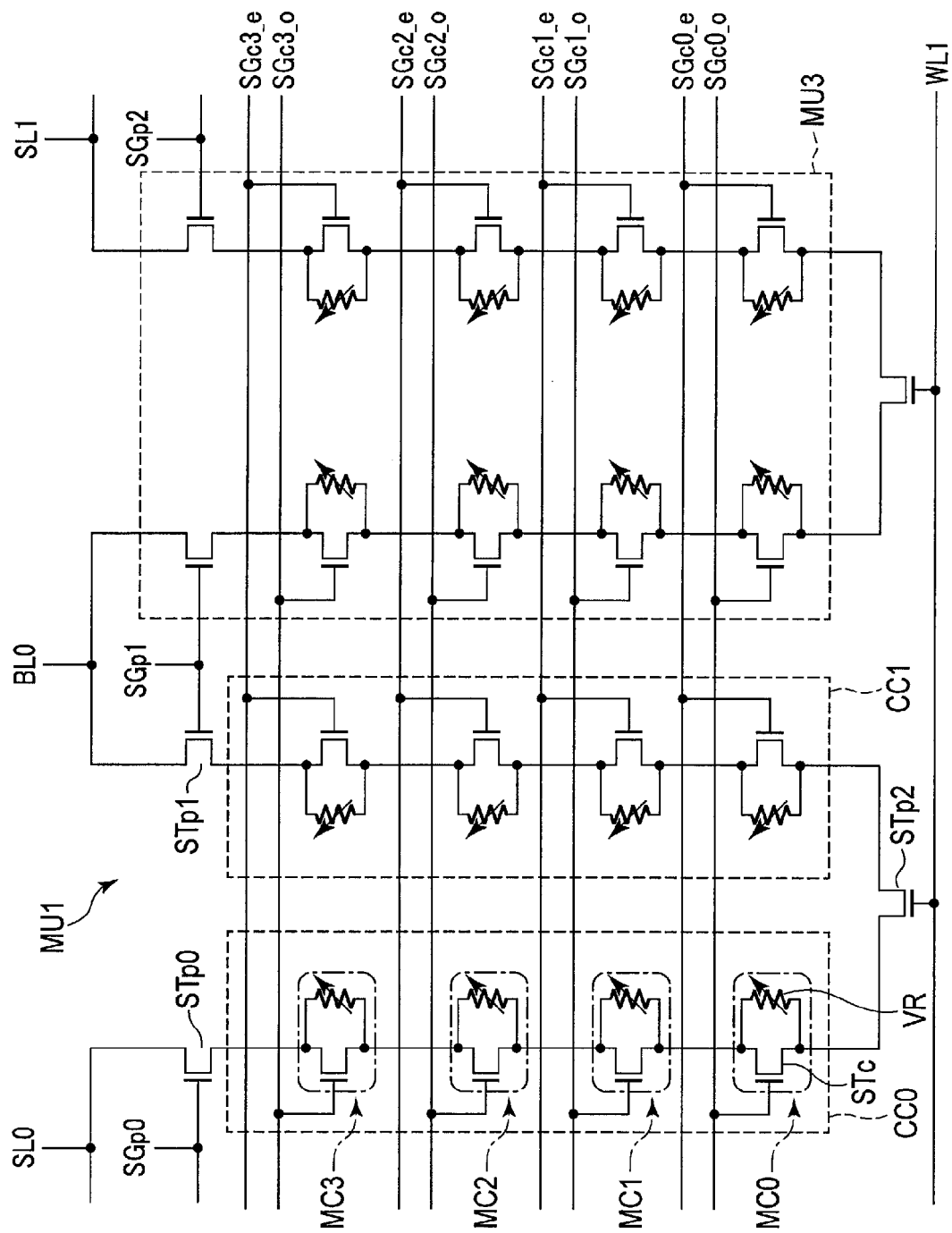
F I G. 35

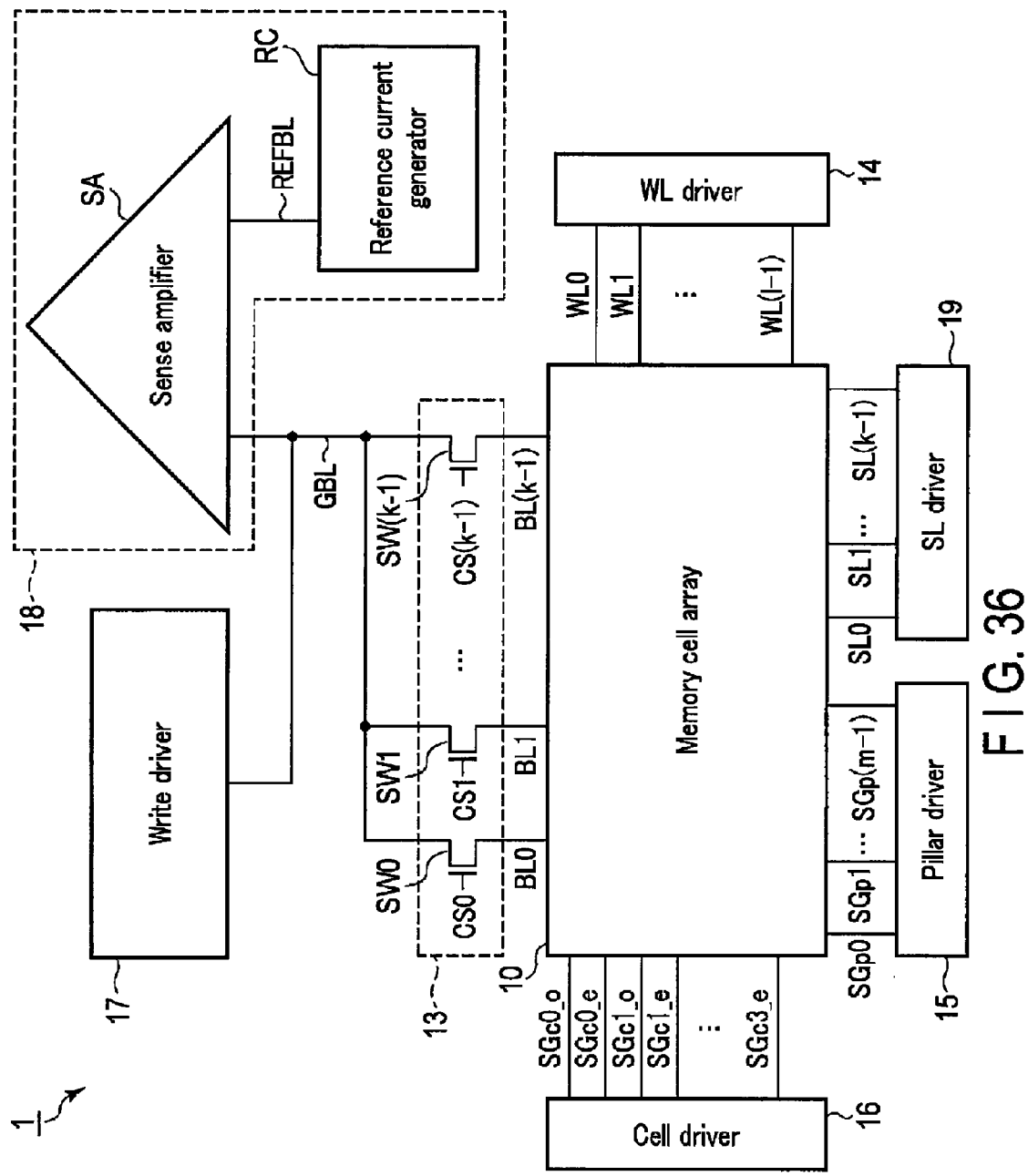
F I G. 36

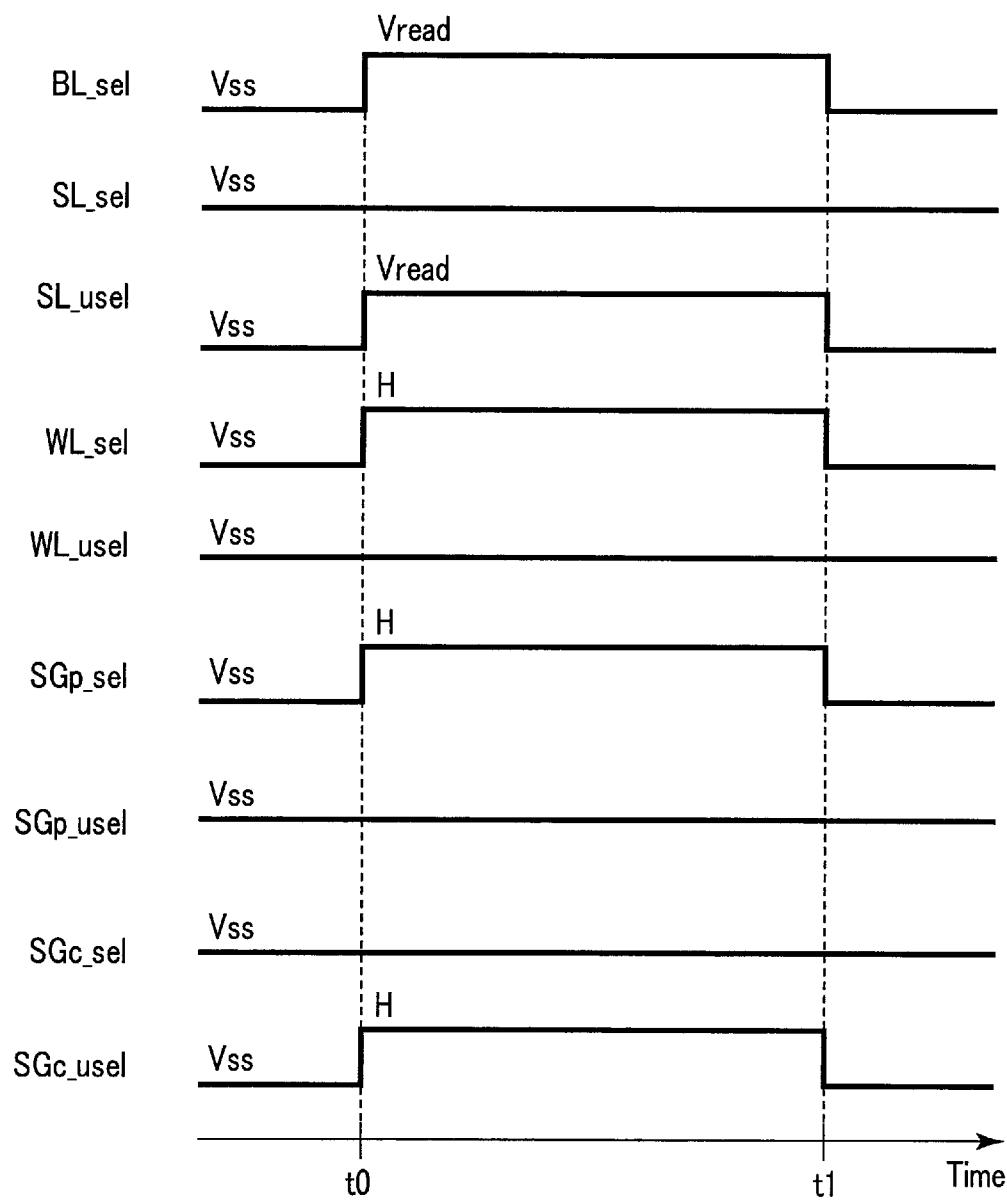
F I G. 39

SEMICONDUCTOR MEMORY DEVICE INCLUDING VARIABLE RESISTANCE ELEMENT

CROSS-REFERENCE TO RELATED APPLICATIONS

This application claims the benefit of U.S. Provisional Application No. 62/385,364, filed Sep. 9, 2016, the entire contents of which are incorporated herein by reference.

FIELD

Embodiments described herein relate generally to a semiconductor memory device including variable resistance element.

BACKGROUND

A variable resistance memory is known as a type of semiconductor memory device.

BRIEF DESCRIPTION OF THE DRAWINGS

FIG. 1 is a block diagram of a semiconductor memory device according to a first embodiment;

FIGS. 2 and 3 are circuit diagrams of a memory cell array included in the semiconductor memory device according to the first embodiment;

FIG. 6 is a perspective view of the memory cell array included in the semiconductor memory device according to the first embodiment;

FIGS. 8 to 10 are sectional views of the memory cell array included in the semiconductor memory device according to the first embodiment;

FIG. 12 is a circuit diagram for describing the read operation in the semiconductor memory device according to the first embodiment;

FIG. 15 is a circuit diagram of a memory cell array included in a semiconductor memory device according to a modification of the first embodiment;

FIG. 16 is a timing chart of the read operation in the semiconductor memory device according to the modification of the first embodiment;

FIG. 17 is a circuit diagram for describing the read operation in the semiconductor memory device according to the modification of the first embodiment;

FIGS. 18 and 19 are circuit diagrams of a memory cell array included in a semiconductor memory device according to a second embodiment;

FIG. 20 is a plan layout diagram of the memory cell array included in the semiconductor memory device according to the second embodiment;

FIGS. 21 and 22 are sectional views of the memory cell array included in the semiconductor memory device according to the second embodiment;

FIG. 23 is a circuit diagram for describing a read operation in the semiconductor memory device according to the second embodiment;

FIG. 24 is a circuit diagram of a memory cell array included in a semiconductor memory device according to a modification of the second embodiment;

FIG. 25 is a circuit diagram for describing the read operation in the semiconductor memory device according to the modification of the second embodiment;

FIGS. 26 and 27 are circuit diagrams of a memory cell array included in a semiconductor memory device according to a third embodiment;

FIG. 29 is a sectional view of the memory cell array included in the semiconductor memory device according to the third embodiment;

FIG. 30 is a timing chart of a read operation in the semiconductor memory device according to the third embodiment;

FIG. 32 is a circuit diagram of a memory cell array included in a semiconductor memory device according to a modification of the third embodiment;

FIGS. 34 and 35 are circuit diagrams of a memory cell array included in a semiconductor memory device according to a fourth embodiment;

FIG. 36 is a block diagram of the semiconductor memory device according to the fourth embodiment;

FIG. 39 is a timing chart of a read operation in the semiconductor memory device according to the fourth embodiment.

DETAILED DESCRIPTION

Figure 2:
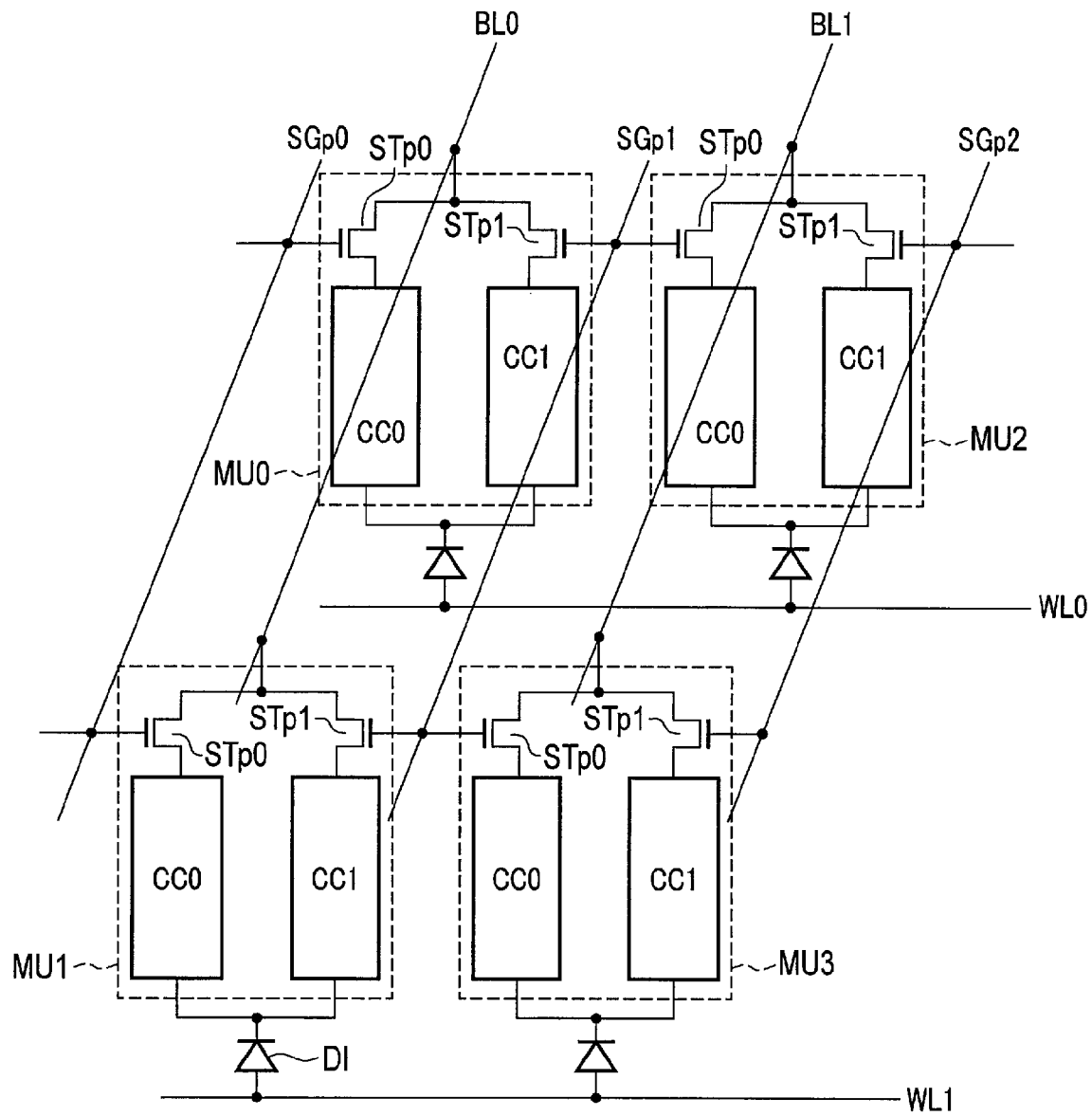

In general, according to one embodiment, a variable resistance memory includes first to third insulating layers, first and second variable resistance layers, first and second semiconductor layers, and first and second electric conductors. The first insulating layer extends in a first direction. The first insulating layer is disposed between the first and second variable resistance layers in a second direction different from the first direction. The first insulating layer and the first and second variable resistance layers are disposed between the first and second semiconductor layers in the second direction. The first insulating layer, the first and second variable resistance layers and the first and second semiconductor layers are disposed between the second and third insulating layers in the second direction. First and second electric conductors provided in a first layer. The first and second electric conductors are in contact with the second and third insulating layers respectively. The first to third insulating layers, the first and second variable resistance layers and the first and second semiconductor layers are disposed between the first and second electric conductors in the second direction.

Hereinafter, embodiments will be described with reference to the drawings. The drawings are schematically illustrated. The respective embodiments show exemplary devices and methods to embody technical ideas of the embodiments. The technical ideas of the embodiments are not limited to the following materials, shapes, structures, and arrangements of the components.

Furthermore, the components having similar functions and configurations will be denoted with the same symbols in the following description. Numbers attached after the characters of the symbol are referred to by the symbols containing the same characters, and used to identify the elements having similar configurations. In a case where there is no need to differentiate the elements indicated by the symbols containing the same characters from each other, these elements will be referred to using the symbols only containing the characters.

[1] First Embodiment

Hereinafter, a semiconductor memory device according to a first embodiment will be described.

[1-1] Configuration of Semiconductor Memory Device 1

[1-1-1] Entire Configuration of Semiconductor Memory Device 1

First, the entire configuration of the semiconductor memory device 1 according to the first embodiment will be described using FIG. 1. As illustrated in FIG. 1, the semiconductor memory device 1 includes a memory cell array 10, a controller 11, a voltage generator 12, a column driver 13, a word line driver 14, a pillar driver 15, a cell driver 16, a write driver 17, and a sense amplifier module 18.

The memory cell array 10 includes a plurality of memory units MU. Each memory unit MU is associated with a bit line BL and a word line WL. In addition, each memory unit MU includes, for example, two cell chains. The cell chain is a set of plurality of memory cells connected in series. The memory cell includes a variable resistance element, and stores data in a nonvolatile manner by changing a resistance value of the variable resistance element.

The controller 11 controls the entire operation of the semiconductor memory device 1. The controller 11 transmits an address signal ADD received from an external controller to the column driver 13, the word line driver 14, the pillar driver 15, and the cell driver 16. In addition, the controller 11 controls the voltage generator 12 to generate a voltage necessary for the operation of the voltage generator 12.

The voltage generator 12 supplies the voltage generated on the basis of the control of the controller 11 to the word line driver 14, the write driver 17, and the sense amplifier module 18.

The column driver 13 selects one bit line BL on the basis of the address signal ADD received from the controller 11. The selected bit line is electrically connected to the write driver 17 or the sense amplifier module 18.

The word line driver 14 selects one word line WL on the basis of the address signal ADD received from the controller 11. The word line driver 14 transmits a desired voltage to a selected word line and a unselected word line.

The pillar driver 15 selects the memory unit MU and the cell chain on the basis of the address signal ADD received from the controller 11. In various operations, the selected bit line and the selected word line are electrically connected through a cell chain.

The cell driver 16 selects one of memory cells contained in each cell chain on the basis of the address signal ADD received from the controller 11.

The write driver 17 applies a desired voltage to the selected bit line BL in a write operation of the semiconductor memory device 1.

The sense amplifier module 18 determines data stored in the memory cell by sensing the voltage or the current of the selected bit line BL in a read operation of the semiconductor memory device 1.

[1-1-2] Circuit Configuration of Memory Cell Array 10

Next, a circuit configuration of the memory cell array 10 will be described. In the memory cell array 10, for example, k bit lines BL, l word lines WL, m pillar select lines SGp, and n cell select lines SGc are provided (k, l, m, and n each are an integer of 2 or more).

A connection relation between the memory unit MU and various wires is illustrated in FIG. 2. FIG. 2 is a circuit diagram of a part of the region of the memory cell array 10. FIG. 2 illustrates that the memory units MU (MU0 to MU3) corresponding to the bit lines BL0 and BL1 among the plurality of bit lines BL and the word lines WL0 and WL1 among the plurality of word lines WL are extracted. Furthermore, FIG. 2 schematically illustrates a cell chain CC in the memory unit MU in which the cell select line SGc is omitted.

As illustrated in FIG. 2, the memory unit MU is provided in correspondence with one bit line BL and one word line WL, and a diode DI having a rectifying function is provided between each memory unit MU and the word line WL. Hereinafter, the description will be given focusing on the memory unit MU1 corresponding to the bit line BL0 and the word line WL1. The memory unit MU1 includes the cell chains CC0 and CC1, and pillar select transistors STp0 and STp1.

One ends of the cell chains CC0 and CC1 are connected to the word line WL1 through the diode DI. Specifically, the cathode of the diode DI is connected to the other ends of the cell chains CC0 and CC1, and the anode of the diode DI is connected to the word line WL1. The other ends of the cell chains CC0 and CC1 are connected to one ends (sources) of the transistors STp0 and STp1 respectively. The other ends (drains) of the transistors STp0 and STp1 are connected to the bit line BL0. The gates of the transistors STp0 and STp1 are connected to the pillar select lines SGp0 and SGp1 respectively.

Furthermore, the gate of the transistor STp1 in the memory unit MU1 is connected to the gate of the transistor STp0 in the memory unit MU3. In other words, in the memory units MU which share the word line WL and are connected to the adjacent bit lines BL, the gate of the transistor STp0 in one memory unit MU and the gate of the transistor STp1 in the other memory unit MU are commonly connected. In other words, the pillar select transistors STp facing each other share the pillar select line SGp in the memory units MU which share the word line WL and are adjacent.

In addition, the gates of the transistors STp0 and STp1 in the memory unit MU1 are connected to the gates of the transistors STp0 and STp1 in the memory unit MU0 respectively. In other words, the gate of the transistor STp0 is commonly connected, and the gate of the transistor STp1 is commonly connected in the memory units MU which share the bit line BL and are connected to the different word lines WL. In other words, the pillar select transistors STp0 and STp1 each share the different pillar select lines SGp in the memory units MU sharing the bit line BL.

FIG. 3 is a circuit diagram illustrating a detail circuit configuration of the cell chain CC and the cell select line SGc which are contained in the memory unit MU. FIG. 3 illustrates a specific circuit configuration of the cell chain CC and the cell select line SGc focusing on the memory units MU connected to the word line WL1 in FIG. 2.

As illustrated in FIG. 3, the cell chain CC includes four memory cells MC (MC1 to MC3) for example. Each the memory cell MC includes a variable resistance element VR and a cell select transistor STc. The memory cell MC stores data by a resistance value of the variable resistance element VR. The details will be described below. One end (one of source and drain) of the transistor STc is connected to one end of the variable resistance element VR, and the other end (the other one of source and drain) of the transistor STc is connected to the other end of the variable resistance element VR. The gate of the transistor STc is connected to the cell select line SGc corresponding to the gate. Specifically, the gates of the transistors STc of the memory cells MC1 to MC3 are connected to the cell select lines SGc0 to SGc3 respectively.

In addition, the one end of the transistor STc in the memory cell MC1 is connected to the cathode of the diode DI, and the other end of the transistor STc in the memory cell MC1 is connected to one end of the transistor STc in the memory cell MC1. The other end of the transistor STc in the memory cell MC1 is connected to one end of the transistor STc in the memory cell MC2, and the other end of the transistor STc in the memory cell MC2 is connected to one end of the transistor STc in the memory cell MC3. The other end of the transistor STc in the memory cell MC3 is connected to one end of the transistor STp corresponding to the other end of the transistor STc. In other words, the memory cells MC0 to MC3 contained in the same cell chain CC are connected in series between the pillar select transistor STp and the diode DI.

Furthermore, the above description has been made about an example in which the number of memory cells MC contained in the cell chain CC is "4", but the invention is not limited thereto. For example, the cell chain CC may contain three, or five or more memory cells MC, or may contain at least two or more. In addition, the number of cell select lines SGc is also changed according to the number of memory cells MC contained in the cell chain CC. For example, in a case where the cell chain contains five memory cells MC, five cell select lines SGc are provided in the memory cell array 10.

[1-1-3] Configuration of Memory Cell MC

Next, a detailed configuration of the memory cell MC will be described. The variable resistance element VR contained in each memory cell MC may become two states of a high resistance state and a low resistance state. The variable resistance element VR may transition bidirectionally between the high resistance state and the low resistance state by a change in phase. Then, the memory cell MC stores one bit of data by the resistance state of the variable resistance element VR. Specifically, for example, the high resistance state of the variable resistance element VR is defined as data "1", and the low resistance state as data "0". The data allocation is not limited to the above example, and may be defined as an arbitrary value.

The cell transistors STc contained in each memory cell MC are used to select the memory cell MC. For example, in the selected memory cell MC, the cell transistor STc enters an OFF state. In the unselected memory cell MC, the cell transistor STc enters an ON state. Herein, the selected memory cell indicates a target memory cell MC to which the read operation or the write operation is performed.

Figure 4:
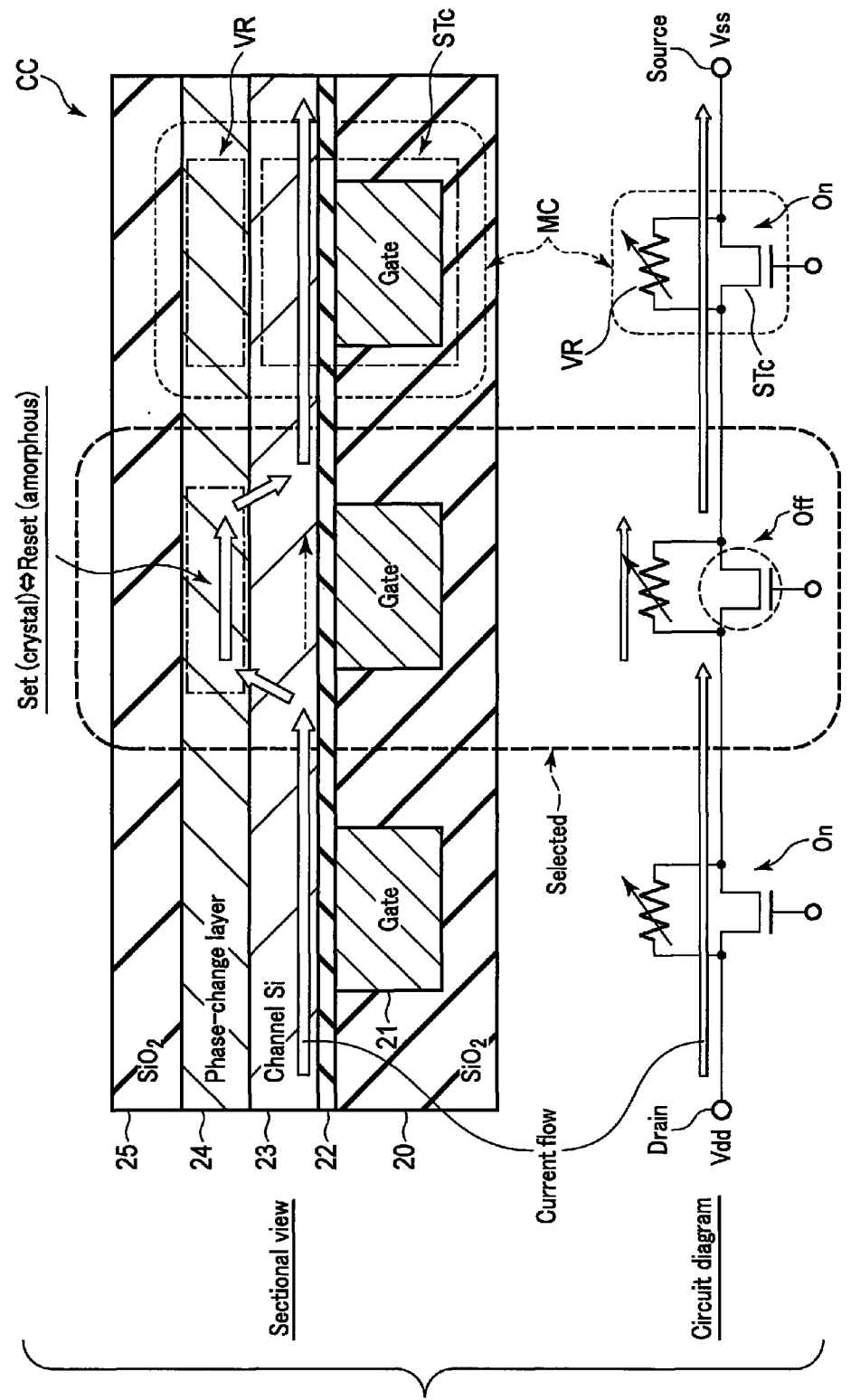
FIG. 4 is a sectional view and a circuit diagram for describing a variable phase memory.

Hereinafter, a specific example of the operation of selecting the memory cell MC will be described using FIG. 4. A sectional view on the upside of FIG. 4 illustrates an example of a sectional structure of the cell chain CC in a phase-change memory, and a circuit diagram illustrated on the lower side of FIG. 4 illustrates a circuit configuration corresponding to the structure illustrated on the upside.

First, the structure of the cell chain CC will be schematically described. As illustrated in a sectional view of FIG. 4, the cell chain CC includes insulating layers 20 and 25, a gate electrode 21, a gate insulating film 22, a channel layer 23, and a variable resistance layer 24.

The gate electrode 21 is provided in the surface of the insulating layer 20. The gate insulating film 22 is provided on the insulating layer 20 and the gate electrode 21. The channel layer 23 is provided on the gate insulating film 22. A set of the gate electrode 21, the gate insulating film 22, and the channel layer 23 forms the cell transistor STc. The variable resistance layer 24 and the insulating layer 25 are sequentially provided on the channel layer 23. A region on the cell transistor STc in the variable resistance layer 24 forms a variable resistance element VR. Furthermore, as a material for the insulating layers 20 and 25 and the gate insulating film 22, a silicon oxide ($SiO_2$) may be used for example. As a material for the gate electrode 21 and the channel layer 23, polysilicon may be used for example. The variable resistance layer 24 contains, for example, germanium (Ge), antimony (Sn), and tellurium (Te). In addition, the memory cells MC are directly connected in the cell chain CC as illustrated in a circuit diagram of FIG. 4. One end and the other end of the cell chain CC are called a drain and a source respectively.

Next, the description will be given about a specific example of the read operation in a case where the memory cell MC in the cell chain CC is selected. FIG. 4 illustrates a current path in the cell chain CC in a case where the memory cell MC in the center is selected.

As illustrated in a circuit diagram of FIG. 4, a voltage Vdd and a voltage Vss are applied to the drain and the source of the cell chain CC respectively. The transistor STc in the selected memory cell MC enters the OFF state. The transistors STc in the other memory cells MC enter the ON state. For example, the voltage Vdd is a power source voltage of the semiconductor memory device 1, and the voltage Vss is a ground voltage of the semiconductor memory device 1 (Vdd > Vss). A channel resistance value of the transistor STc in the OFF state may be higher than that of the transistor STc in the ON state. In addition, even when being any one of the low resistance state and the high resistance state, the resistance value of the variable resistance element VR may be lower than the channel resistance value of the transistor STc in the OFF state and may be higher than the channel resistance value of the transistor STc in the ON state.

Therefore, the current path depicted by a white arrow in FIG. 4 is formed. As illustrated in the drawing, the current flowing in the cell chain CC passes through the channel layer 23 in the region of the unselected memory cell MC, and passes through the variable resistance layer 24 in the region of the selected memory cell MC. In other words, when the transistor STc enters the OFF state, the current flows to the variable resistance layer 24 having a relatively low resistance value. In this way, the semiconductor memory device 1 selects the memory cell MC in various operations to make the current flow to the corresponding variable resistance element VR.

At this time, the amount of current flowing to the selected memory cell MC is changed according to data stored in the selected memory cell MC. For example, in a case where the selected memory cell MC stores data "1", the flowing current is less because the variable resistance element VR is in the high resistance state. On the other hand, in a case where the selected memory cell MC stores data "0", the flowing current is large because the variable resistance element VR is in the low resistance state. In other words, data "1" and data "0" can be determined according to the magnitude of current flowing in the selected memory cell MC.

Furthermore, in the following, the state that the variable resistance element VR of the memory cell MC is in the low resistance state is called a set state, and in the high resistance state, it is called a reset state. In addition, the variable resistance layer 24 in the set state is in a crystalline state, and the variable resistance layer 24 in the reset state is in an amorphous state. As illustrated in FIG. 4, in the variable phase memory, the variable resistance layer 24 can be bidirectionally transferred in phase between the crystalline state (set state) and the amorphous state (reset state) by making the current flowing in the variable resistance layer 24 of the memory cell MC.

In addition, the memory cell MC is not limited to the above configuration, and may be configured in various forms. For example, a variable resistance memory element used in a resistance random access memory (ReRAM) or an interfacial phase-change memory (iPCM) may be used.

[1-1-4] Configuration of Memory Cell Array 10 and Peripheral Circuit

Figure 5:
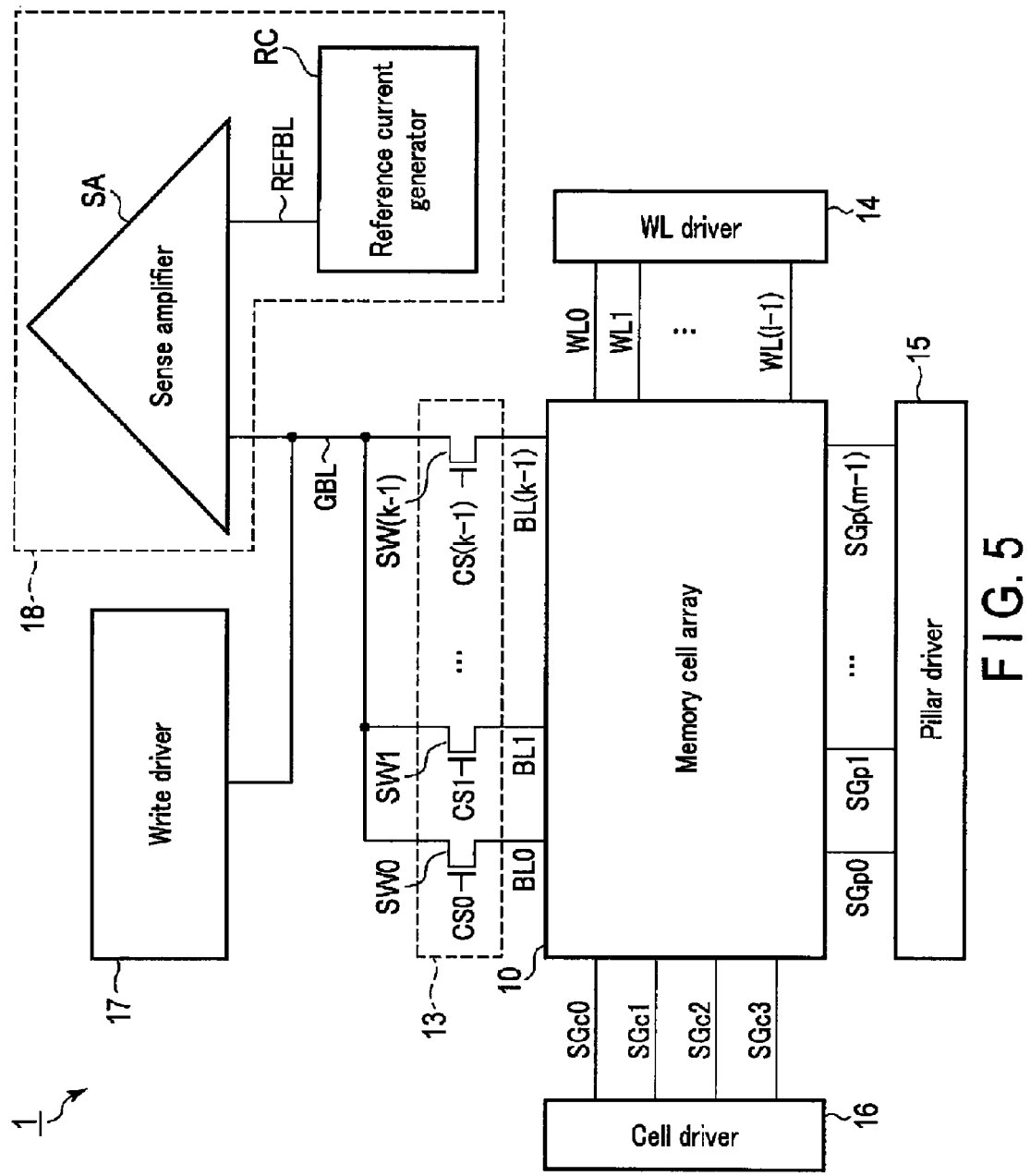
FIG. 5 is a block diagram of the semiconductor memory device according to the first embodiment.

Next, the description will be given about a detail configuration of the memory cell array 10 and the peripheral circuit using FIG. 5. FIG. 5 illustrates a connection relation between various wires provided in the memory cell array 10, the column driver 13, the word line driver 14, the pillar driver 15, the cell driver 16, the write driver 17, and the sense amplifier module 18. In addition, FIG. 5 illustrates a more detailed configuration of the column driver 13 and the sense amplifier module 18.

As illustrated in FIG. 5, the column driver 13 includes column select transistors SW0 to SW(k−1). The transistor SW is, for example, an n-channel MOS transistor. One ends of the transistors SW0 to SW(k−1) are connected to the bit lines BL0 to BL(k−1) respectively. The other ends of the transistors SW0 to SW(k−1) are commonly connected to a global bit line GBL. Column control signals CS0 to CS(k−1) are input to the gates of the transistor SW0 to SW(k−1) respectively. The column control signal CS is a signal which is obtained when a column decoder (included in the column driver 13, not illustrated) decodes a column address in the address signal ADD, and is used to select one of the plurality of column select transistors SW. Then, the column driver 13 electrically connects the selected bit line BL and the global bit line GBL on the basis of the column control signal CS.

The word line driver 14 is connected to the word lines WL0 to WL(l−1), and selects one word line WL. The pillar driver 15 is connected to the pillar select lines SGp0 to SGp(m−1), and selects one pillar select line SGp. The cell driver 16 is connected to the cell select lines SGc0 to SGc3, and selects one cell select line SGc. The write driver 17 is connected to the global bit line GBL.

As illustrated in FIG. 5, the sense amplifier module 18 includes a reference current generator RC and a sense amplifier SA. The reference current generator RC generates a reference current to be used in the read operation. The reference current is larger than the current flowing in a case where the variable resistance element VR of the selected memory cell MC is in the high resistance state in the read operation, and is smaller than the current flowing in a case where the variable resistance element VR is in the low resistance state. The sense amplifier SA applies a voltage to the global bit line GBL in the read operation. Then, the sense amplifier SA compares the current (or voltage) flowing in the global bit line GBL with the output current (or voltage) of the reference current generator RC, and determines the data stored in the memory cell MC.

Specifically, in a case where the current flowing in the selected memory cell MC is smaller than the reference current, the sense amplifier SA in the read operation determines that the variable resistance element VR of the selected memory cell MC is in the high resistance state. In a case where the current flowing in the selected memory cell MC is larger than the reference current, the sense amplifier SA determines that the variable resistance element VR of the selected memory cell MC is in the low resistance state. In other words, the sense amplifier SA can determine whether the memory cell MC stores data "1" or data "0" by determining whether the current flowing in the selected memory cell MC is small or large compared to the reference current.

[1-1-5] Structure of Memory Cell Array 10

Next, the description will be given about the entire structure of the memory cell array 10 using FIG. 6. FIG. 6 is a perspective view of the memory cell array 10. However, the bit line BL is omitted in the drawing. In addition, an X direction, a Y direction, and a Z direction illustrated in the respective drawings used in the following explanation intersect to each other. In addition, it is assumed that an interlayer dielectric is formed in the regions not referred to using the symbols in a perspective view and a sectional view used in the following explanation. As illustrated in FIG. 6, the memory cell array 10 includes a plurality of memory pillars MP, a plurality of electric conductors 30 to 33, 36, and 37.

The electric conductors 30 extend in the X direction, and are disposed in the Y direction for example. Each electric conductor 30 serves as the word line WL. A plurality of sets of electric conductors 31 to 33 is provided on each electric conductor 30. These sets are disposed on the electric conductor 30 at an equal interval. The electric conductors 31 to 33 extend in the Z direction from the electric conductor 30, and are sequentially stacked thereon. The electric conductors 31 to 33 each serve as the diode DI. For example, the electric conductors 31 to 33 serve as an anode electrode, a semiconductor layer containing a PN conjunction, and a cathode electrode, respectively. Furthermore, the diode DI is not limited to the above structure, and may be structured such that each electrode is omitted. In addition, a diode having other configurations such as a Schottky diode may be used as the diode DI.

The memory pillar MP is provided to be extended in the Z direction from each electric conductor 33. The memory pillar MP is disposed in a matrix shape in the XY plane together with the diode DI. Each memory pillar MP includes a film 34A corresponding to the cell chain CC0, a film 34B corresponding to the cell chain CC1, and an insulating layer 35 interposed between the films 34A and 34B in the X direction. One memory pillar MP corresponds to one memory unit MU. A detailed structure in the memory pillar MP will be described below.

The electric conductors 36 extended in the Y direction are provided between the adjacent memory pillars MP in the X direction. These electric conductors 36 are arranged along the X direction. In this way, the electric conductors 36 arranged along the X direction are provided in a plurality of layers, and arranged along the Z direction. Each electric conductor 36 serves as the cell select line SGc. The electric conductor 37 extending in the Y direction is provided above each uppermost electric conductor 36. These electric conductors 37 are arranged along the X direction. Each electric conductor 37 serves as the pillar select line SGp. Furthermore, four electric conductors 36 are provided along the Z axis in the example of FIG. 6. These layers where the electric conductor 36 is provided will be called sequentially first to fourth layers from the one nearest to the electric conductor 30. The layer where the electric conductor 37 is provided will be called a fifth layer.

In the above configuration, the memory cell MC is formed in a region where the memory pillars MP and the electric conductors 36 are in contact. As a result, the cell chain CC0 is formed by the film 34A of the memory pillar MP and the electric conductors 36 in the first to fourth layers. The cell chain CC1 is formed by the film 34B of the memory pillar MP and the electric conductors 36 in the first to fourth layers. In addition, the pillar select transistor STp0 is formed in a region where the film 34A and the electric conductor 37 are in contact in each memory pillar MP. The pillar select transistor STp1 is formed in a region where the film 34B and the electric conductor 37 are in contact.

Figure 7:
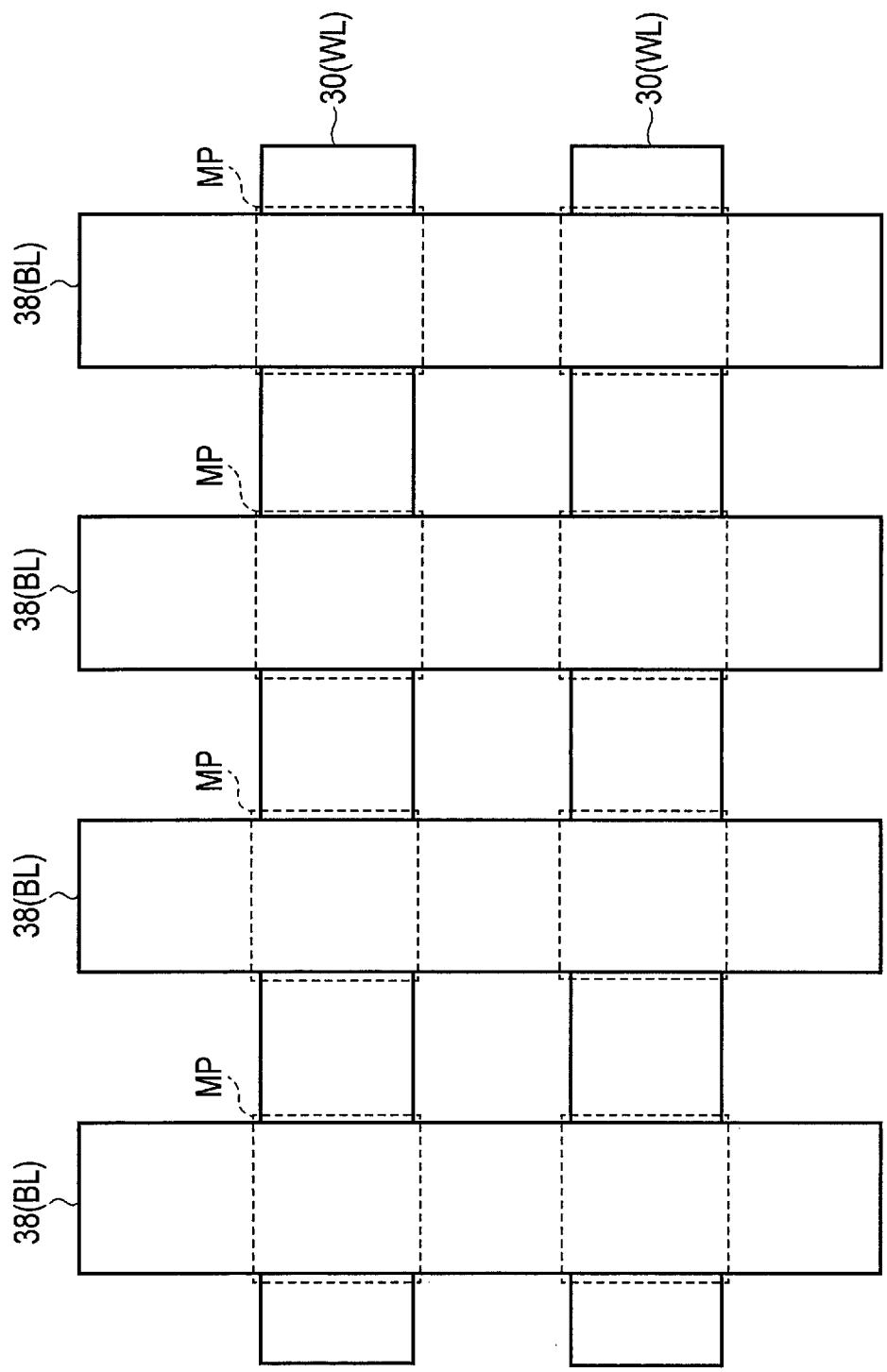
FIG. 7 is a plan layout diagram of the memory cell array included in the semiconductor memory device according to the first embodiment.

Next, a plan layout of the memory cell array 10 will be described using FIG. 7. FIG. 7 illustrates a layout of the electric conductors which correspond to the word lines WL and the bit lines BL in the XY plane of the memory cell array 10, and the memory pillars MP. As illustrated in FIG. 7, a plurality of electric conductors 38 serving as the bit line BL extends in the Y direction, and is arranged in the X direction. Therefore, the electric conductor 30 and the electric conductor 38 intersect in the XY plane, and the memory pillar MP is provided in the intersection region.

Figure 10:
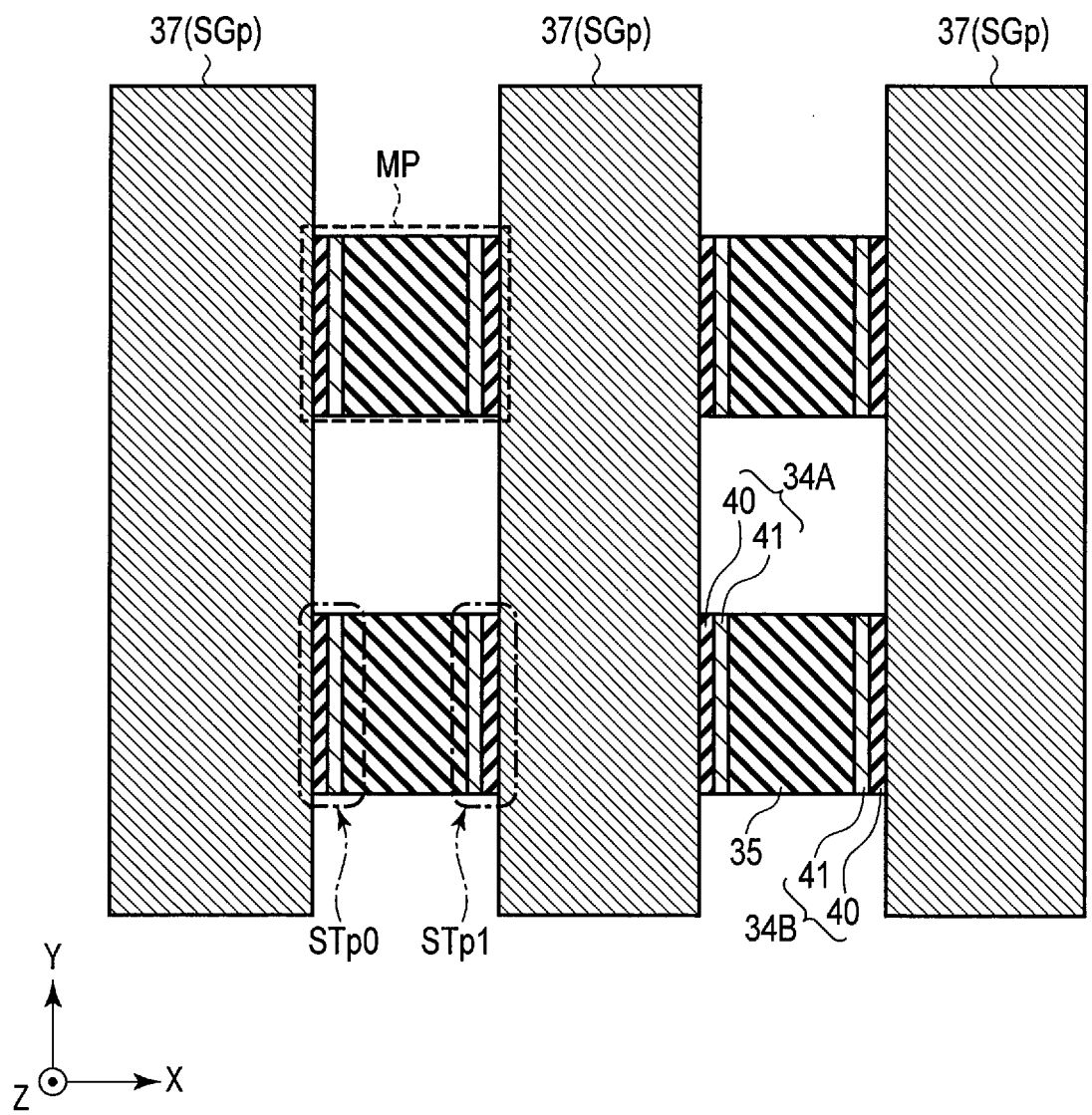

Next, the description will be given using FIGS. 8 to 10 about a detailed sectional structure of the memory cell array 10. FIG. 8 illustrates a sectional surface in the XZ plan of the memory pillar MP. FIGS. 9 and 10 illustrate a sectional surface in the XY plan of the memory pillar MP. FIG. 9 corresponds to the sectional surface containing any one of the first to fourth layers illustrated in FIG. 8. FIG. 10 corresponds to the sectional surface containing the fifth layer illustrated in FIG. 8.

As illustrated in FIG. 8, each of the films 34A and 34B includes a gate insulating film 40, a channel layer 41, and a variable resistance layer 42. The gate insulating film 40, the channel layer 41, and the variable resistance layer 42 respectively correspond to the gate insulating film 22, the channel layer 23, and the variable resistance layer 24 described in FIG. 4.

The insulating layer 35 extends in the Z direction in each memory pillar MP, and is interposed between the channel layers 41 of the films 34A and 34B in the X direction. The channel layers 41 of the films 34A and 34B and the insulating layer 35 are interposed between the gate insulating films 40 of the films 34A and 34B. In the first to fourth layers, the variable resistance layer 42 of the film 34A is provided between the channel layer 41 of the film 34A and the insulating layer 35. The variable resistance layer 42 of the film 34B is provided between the channel layer 41 of the film 34B and the insulating layer 35. In the fifth layer, no variable resistance layer is provided in a region between the channel layers 41 of the films 34A and 34B.

In other words, the gate insulating film 40 and the channel layer 41 are provided in each memory pillar MP sequentially from the side surface where the electric conductors 36 and 37 are in contact. Furthermore, the variable resistance layer 42 is provided to be in contact with the channel layer 41 in the first to fourth layers. Then, the insulating layer 35 is provided between the films 34A and 34B. Specifically, in the first to fourth layers, the insulating layer 35 is provided between the variable resistance layers 42 contained in the films 34A and 34B. In the fifth layer, the insulating layer 35 is provided between the channel layers 41 contained in the films 34A and 34B.

As illustrated in FIGS. 8 and 9, the adjacent electric conductors 36 interpose the corresponding memory pillar MP in the X direction. Specifically, the adjacent electric conductors 36 respectively are in contact with the gate insulating films 40 in the films 34A and 34B of the corresponding memory pillar MP. The region, where the electric conductors 36 and the gate insulating films 40 of the films 34A and 34B are in contact, serve as the memory cell MC. In other words, the electric conductor 36 corresponds to the gate electrode 21 described in FIG. 4. Then, a set of memory cells MC sharing the channel layer 41 in the memory pillar MP becomes one cell chain CC.

As illustrated in FIGS. 8 and 10, the adjacent electric conductors 37 interpose the corresponding memory pillar MP in the X direction. Specifically, the adjacent electric conductors 36 respectively are in contact with the gate insulating films 40 in the films 34A and 34B of the corresponding memory pillar MP. The regions, where the electric conductors 37 and the gate insulating films 40 of the films 34A and 34B are in contact, serve as the pillar select transistors STp0 and STp1.

In addition, as illustrated in FIG. 8, an electric conductor 39 is provided between the memory pillar MP and the electric conductor 38. The electric conductor 39 is a via contact VC which electrically connects the memory pillar MP and the bit line BL. In this example, the channel layers 41 contained in the films 34A and 34B in one memory pillar MP are electrically connected to one bit line BL.

As described above, the semiconductor memory device 1 according to this embodiment is provided with two cell chains CC and the pillar select transistor STp corresponding to each cell chain CC by the films 34A and 34B in the memory pillar MP and the electric conductors 36 and 37.

Furthermore, in the configuration described above, the electric conductors 30 and 38 contain, for example, aluminum, copper, or tungsten. For example, polysilicon may be used as the materials of the electric conductors 36 and 37 and the channel layer 41. For example, silicon oxide ($SiO_2$) may be used as the materials of the insulating layer 35 and the gate insulating film 40. For example, a phase change material is used for the variable resistance layer 42, and may contain germanium, antimony, and tellurium.

[1-2] Operation of Semiconductor Memory Device 1

Next, the description will be given about the read operation and the write operation of the semiconductor memory device 1 according to the first embodiment. Furthermore, in the following description, it is assumed that the transistor of which the gate is applied with an "H" level voltage (> Vss) enters the ON state, and the transistor of which the gate is applied with the voltage Vss enters the OFF state.

[1-2-1] Read Operation

First, the description will be given using FIG. 11 about the read operation of the semiconductor memory device 1. FIG.

11 illustrates exemplary waveforms of voltages applied to various wires in the read operation.

Figure 11:
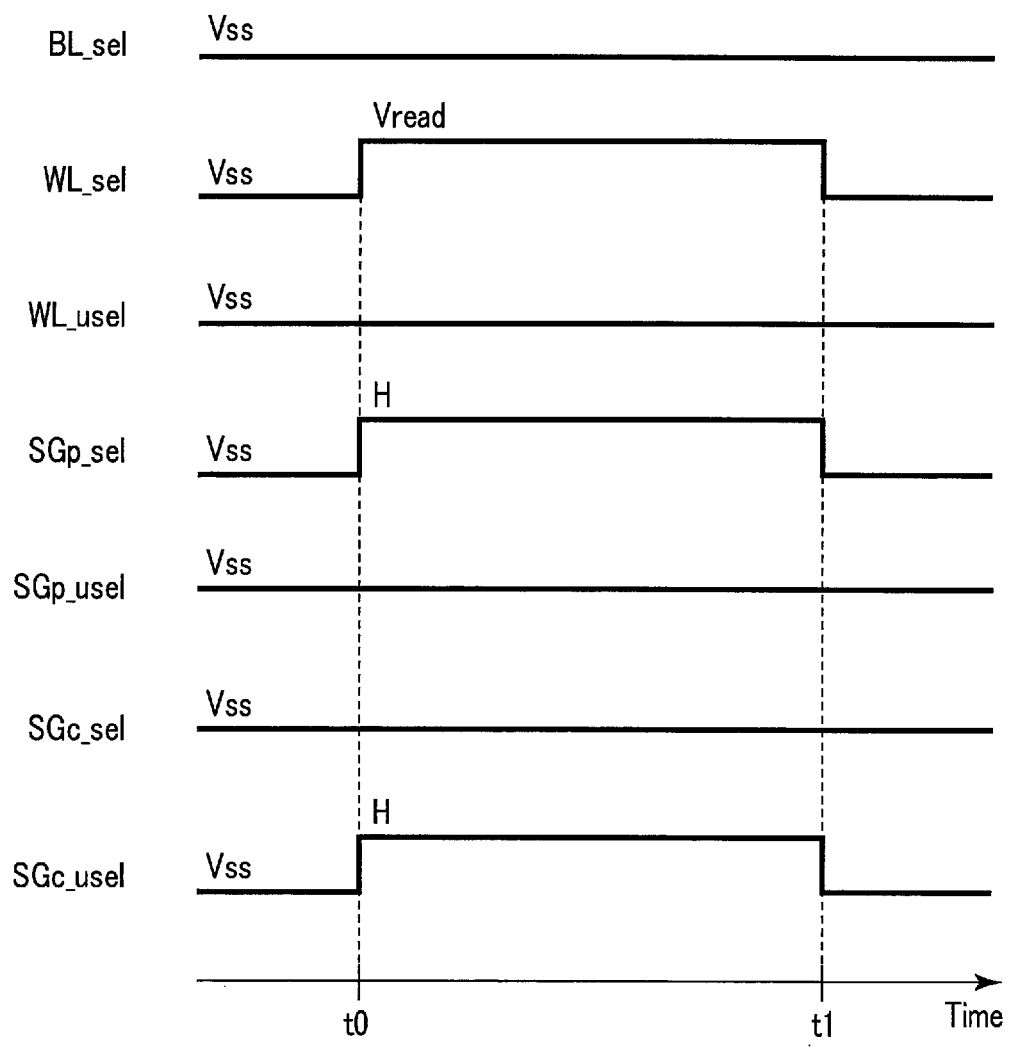
FIG. 11 is a timing chart of a read operation in the semiconductor memory device according to the first embodiment.

As illustrated in FIG. 11, when the semiconductor memory device 1 is in an initial state before the read operation, the write driver 17 applies the voltage Vss to the bit line BL, and the word line driver 14 applies the voltage Vss to the word line WL. In addition, the pillar driver 15 and the cell driver 16 apply the voltage Vss to the pillar select line SGp and the cell select line SGc, respectively.

When the read operation starts at time t0, the sense amplifier SA applies the voltage Vss to the global bit line GBL. Then, when the column driver 13 selects the bit line BL, the current path is formed between the global bit line GBL and a selected bit line BL_sel, and the voltage of the selected bit line BL_sel becomes Vss. The word line driver 14 applies a voltage Vread to a selected word line WL_sel, and applies the voltage Vss to a unselected word line WL_usel. The voltage Vread is a read voltage not to make the variable resistance layer of the variable resistance element VR transferred in phase, and is higher than the voltage Vss. The pillar driver 15 applies the "H" level voltage to the selected pillar select line SGp_sel, and applies the voltage Vss to the unselected pillar select line SGp_usel. The cell driver 16 applies the voltage Vss to the selected cell select line SGc_sel, and applies the "H" level voltage to the unselected cell select line SGc_usel.

In a period from time t0 to time t1, the sense amplifier SA determines the data read from the selected memory cell MC. Then, when the read operation ends at time t1, the semiconductor memory device 1 returns to the initial state.

The specific example of the read operation described above is illustrated in FIG. 12. FIG. 12 illustrates a situation in a case where the data is read from the memory cell MC2 contained in the cell chain CC1 of the memory unit MU1 in the circuit diagram described in FIG. 3.

As illustrated in FIG. 12, in a case where the data of the memory cell MC2 contained in the cell chain CC1 of the memory unit MU1 is read, the bit line BL0, the word line WL1, the pillar select line SGp1, and the cell select line SGc2 are selected. Specifically, the voltage Vss is applied to the bit line BL0, and the voltage Vread is applied to the word line WL1. The voltage Vss is applied to the selected cell select line SGc2 and the unselected pillar select line SGp. The "H" level voltage is applied to the selected pillar select line SGp1 and the unselected cell select line SGc.

Therefore, in the memory unit MU1, the pillar select transistor STp0 enters the OFF state, and the transistor STp1 enters the ON state. In addition, since a forward bias is applied to the diode DI, the current flows from the word line WL1 to the memory unit MU1. The current flowing into the memory unit MU1 flows to the bit line BL0 through the cell chain CC1 since the transistor STp0 of the memory unit MU1 enters the OFF state. In addition, in the cell chain CC1, the cell select transistor STc of the memory cell MC2 enters the OFF state, and the transistor STc of the other memory cell MC enters the ON state. Therefore, the current flows through the variable resistance element VR in the memory cell MC2. In the other memory cell MC, the current flows through the channel of the transistor STc. Furthermore, since a reverse bias is applied to the diode DI connected to the unselected word line WL_usel, the current nearly does not flow to the corresponding memory pillar MP.

Through the operation described above, the semiconductor memory device 1 causes the current to flow to the variable resistance element VR of the selected memory cell MC. Then, the sense amplifier SA senses the current, and determines whether the data is read from the selected memory cell MC.

[1-2-2] Write Operation

Figure 13:
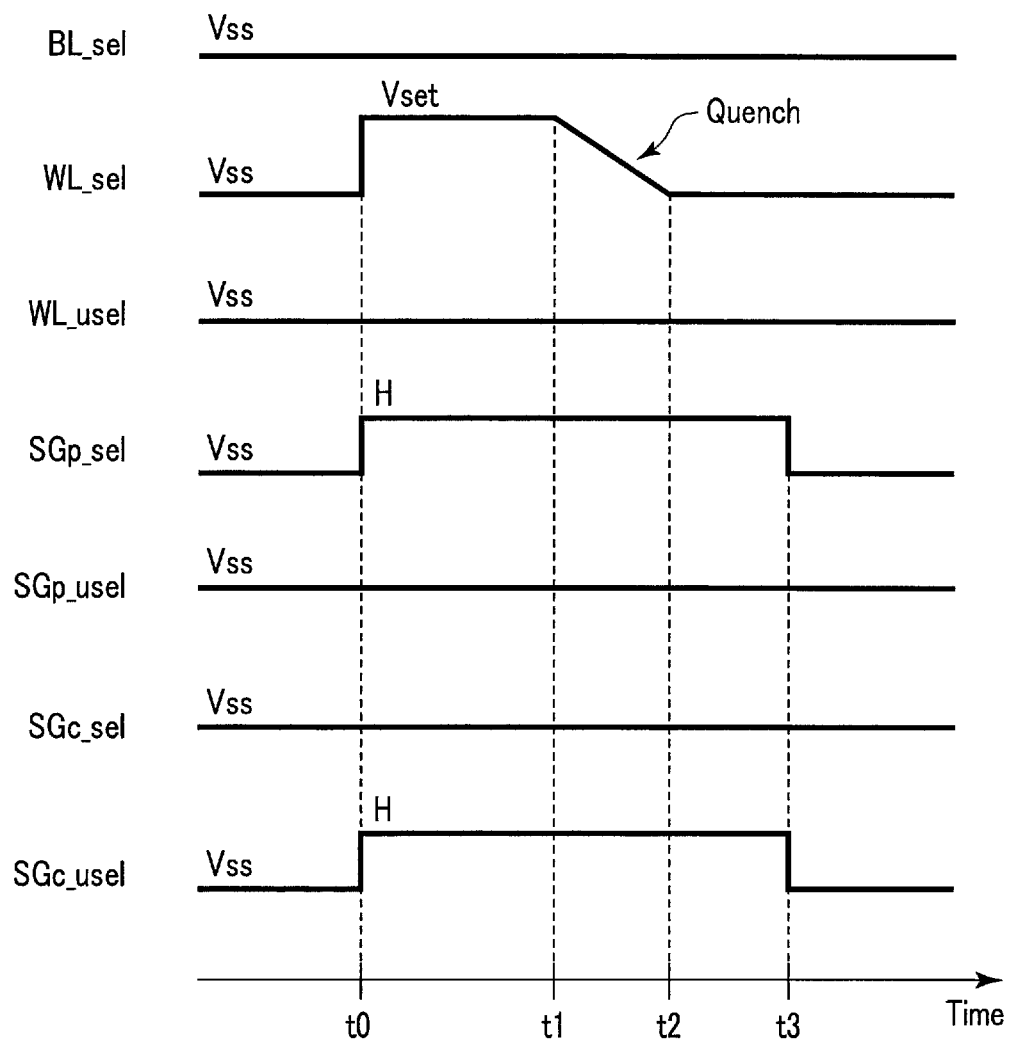
FIGS. 13 and 14 are timing charts of a write operation in the semiconductor memory device according to the first embodiment.
Figure 14:
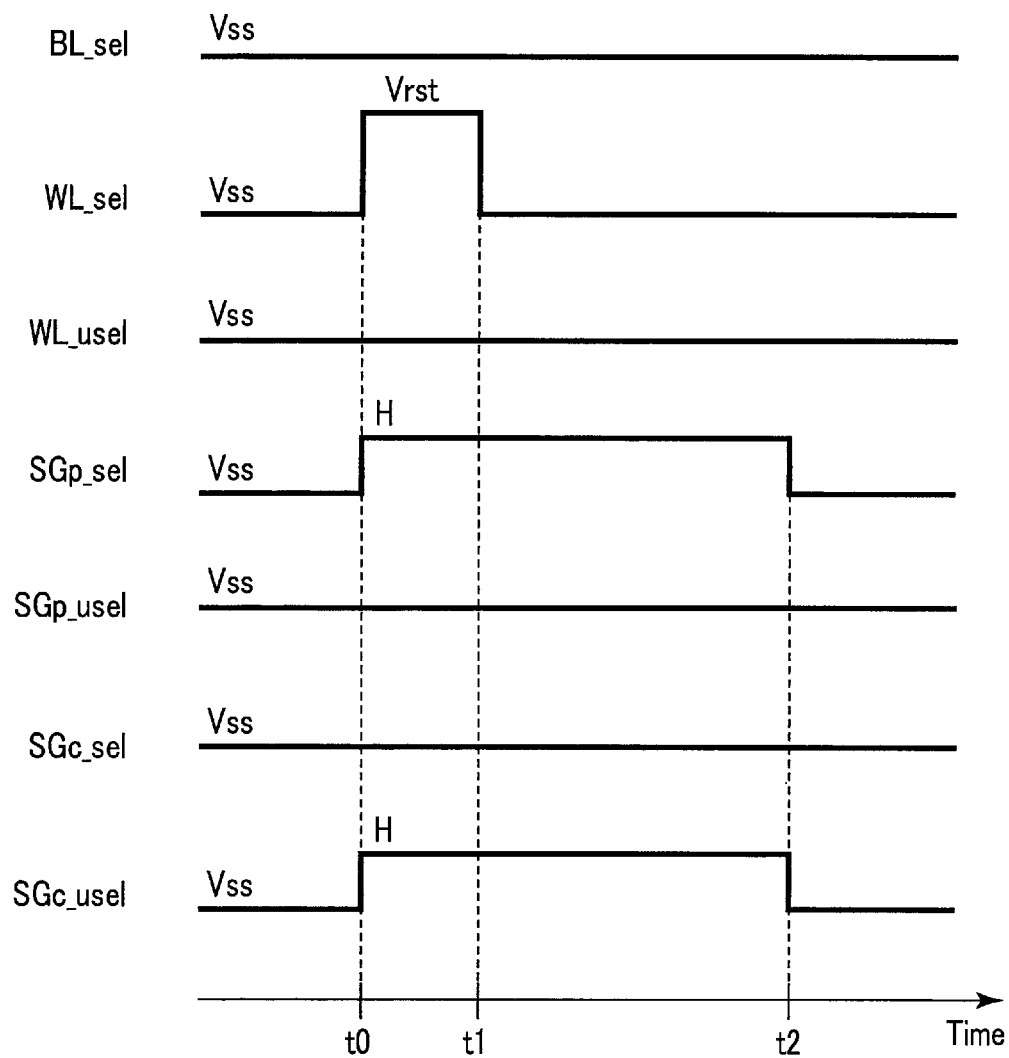

Next, the description will be given using FIGS. 13 and 14 about the write operation in the semiconductor memory device 1 focusing on a difference from the read operation. FIG. 13 illustrates exemplary waveforms of voltages applied to various wires in a set program operation. FIG. 14 illustrates exemplary waveforms of voltages applied to various wires in a reset program operation. The set program operation is a write operation in which the variable resistance element VR is transferred from the high resistance state to the low resistance state. The reset program operation is a write operation in which the variable resistance element VR is transferred from the low resistance state to the high resistance state.

First, the description will be given about the set program operation of the semiconductor memory device 1. As illustrated in FIG. 13, the initial state before the set program operation is similar to that of the read operation described using FIG. 11.

When the set program operation starts at time t0, the write driver 17 applies the voltage Vss to the global bit line GBL. Then, when the column driver 13 selects the bit line BL, the voltage Vss is applied to the selected bit line BL_sel. The word line driver 14 applies a voltage Vset to the selected word line WL_sel, and applies the voltage Vss to the unselected word line WL_usel. The voltage Vset is a voltage which is higher than the voltage Vss and set to change the resistive state of the selected memory cell. The other operations at time t0 are similar to those at time t0 of FIG. 11, and thus the description thereof will be omitted.

In a period from time t0 to time t1, the current flows to the variable resistance element VR of the selected memory cell MC to generate Joule heat, and the variable resistance layer 42 is heated. Then, the word line driver 14 gradually lowers the voltage applied to the selected word line from Vset during a period from time t1 to time t2. Therefore, the variable resistance layer 42 corresponding to the selected memory cell MC is slowly quenched, and the variable resistance layer 42 becomes stable in the crystalline state. Then, when the read operation ends at time t3, the semiconductor memory device 1 returns to the initial state.

Through the operation described above, the semiconductor memory device 1 can make the variable resistance layer 42 corresponding to the selected memory cell MC transferred in phase from the amorphous state to the crystalline state. In other words, through the set program operation, the semiconductor memory device 1 can make the variable resistance element VR transferred from the high resistance state to the low resistance state, and can make the memory cell MC transferred from the reset state to the set state.

Next, the description will be given about the reset program operation of the semiconductor memory device 1. As illustrated in FIG. 14, the initial state before the set program operation is similar to that of the read operation described using FIG. 11.

When the reset program starts at time t0, the write driver 17 applies the voltage Vss to the global bit line GBL. Then, when the column driver 13 selects the bit line BL, the voltage Vss is applied to the selected bit line BL_sel. The word line driver 14 applies a voltage Vrst to the selected word line WL_sel, and applies the voltage Vss to the unselected word line WL_usel. The voltage Vrst is equal to or more than the voltage Vset. The other operations at time t0 are similar to those at time t0 described using FIG. 11, and thus the description thereof will be omitted.

In a period from time t0 to time t1, the current flows to the variable resistance element VR of the selected memory cell MC to generate Joule heat, and the variable resistance layer 42 is heated. Then, the word line driver 14 applies the voltage Vss to the selected word line WL_sel at time t1. Therefore, the variable resistance layer 42 corresponding to the selected memory cell MC is quickly quenched, and the crystalline state of the variable resistance layer 42 becomes stable in the amorphous state. Then, when the read operation ends at time t2, the semiconductor memory device 1 returns to the initial state. Furthermore, the period from time t0 to time t1 in FIG. 14 is shorter than the period from time t0 to time t1 in FIG. 13.

Through the operation described above, the semiconductor memory device 1 can make the variable resistance layer 42 corresponding to the selected memory cell MC transferred in phase from the crystalline state to the amorphous state. In other words, the semiconductor memory device 1 can make the variable resistance element VR transferred from the low resistance state to the high resistance state by the reset program operation, and can make the memory cell MC transferred from the set state to the reset state.

[1-3] Effects of First Embodiment

According to the semiconductor memory device 1 of this embodiment, a storage capacity of the semiconductor memory device 1 can be made large. Hereinafter, the description will be given about the effects in detail.

Two cell chains CC are provided in correspondence with one memory pillar MP in the semiconductor memory device 1 according to this embodiment. Specifically, the facing films 34A and 34B are provided in each memory pillar MP. The films 34A and 34B are separated by the insulating layer 35. The electric conductors 36 serving as the cell select line SGc interpose the memory pillar MP and are in contact with the gate insulating films 40 of the films 34A and 34B. The electric conductors 37 serving as the pillar select lines SGp0 and SGp1 interpose the memory pillar MP and are in contact with the gate insulating films 40 of the films 34A and 34B. Then, the channel layers 41 contained in the films 34A and 34B are in contact with the variable resistance layers 42 in the region interposed between the electric conductors 36, and do not be in contact with the variable resistance layers in the region interposed between the electric conductors 37. In the layer where the electric conductors 37 are provided, no variable resistance layer is provided in the region between the channel layers 41 of the films 34A and 34B.

Each of the intersections between the films 34A and 34B and the electric conductor 36 serves as the memory cell MC containing the cell select transistor STc and the variable resistance element VR. In addition, the intersections between the films 34A and 34B and the electric conductor 37 serve as the pillar select transistors STp0 and STp1 respectively. The memory cells MC are provided in a plurality of layers, and the sets of the memory cells MC formed in the films 34A and 34B become the cell chains CC0 and CC1.

Then, the semiconductor memory device 1 according to this embodiment can select one of the cell chains CC0 and CC1 by changing the voltage to be applied to the pillar select lines SGp0 and SGp1. In other words, the semiconductor memory device 1 can make the current flow only to one cell chain CC in two cell chains CC provided corresponding to the memory pillar MP, and can perform the read operation and the write operation on each cell chain CC.

As described above, the semiconductor memory device 1 according to this embodiment is provided with two cell chains CC corresponding to one memory pillar MP. In other words, in the semiconductor memory device 1 according to this embodiment, two memory cells MC can be formed in the region interposed between two electric conductors 36 corresponding to the cell select line SGc in one memory pillar MP. In this way, since the semiconductor memory device 1 according to this embodiment can make the storage capacity large in a unit of memory pillar MP, the entire storage capacity of the semiconductor memory device 1 can be made large.

FIG. 15 is a circuit configuration according to a modification of the semiconductor memory device 1 according to this embodiment. This configuration is different from the circuit configuration illustrated in FIG. 2 in the connection direction of the diode DI. Specifically, as illustrated in FIG. 15, the diode DI corresponding to the memory unit MU is configured such that the anode is connected to one ends of the cell chains CC0 and CC1, and the cathode is connected to the word line WL corresponding to the cathode. The other circuit configurations are similar to the circuit configurations described using FIGS. 2 and 3.

An exemplary operation of the semiconductor memory device 1 having such a circuit configuration is illustrated in FIG. 16. FIG. 16 illustrates waveforms of the read operation in the semiconductor memory device 1 according to the modification of this embodiment, and is different from the waveforms illustrated in FIG. 11 in the voltage values to be applied to the selected bit line BL_sel, the selected word line WL_sel, and the unselected word line WL_usel. Specifically, as illustrated in FIG. 15, the sense amplifier SA applies the voltage Vread to the global bit line GBL at time t0. Then, when the column driver 13 selects the bit line BL, the current path is formed between the global bit line GBL and the selected bit line BL_sel, and the voltage of the selected bit line BL_sel becomes Vread. The word line driver 14 applies the voltage Vss to the selected word line WL_sel, and applies the voltage Vread to the unselected word line WL_usel. The other operations are similar to those described using FIG. 11.

A specific example of the read operation described above is illustrated in FIG. 17. FIG. 17 is a circuit diagram to which this modification to the circuit diagram illustrated in FIG. 3 is applied, illustrating a situation in a case where the data is read from the memory cell MC2 contained in the cell chain CC1 of the memory unit MU1. The operation state illustrated in FIG. 17 is different from that described using FIG. 12 in that the flow of current is opposite.

Specifically, the voltage Vread is applied to the bit line BL0, and the voltage Vss is applied to the word line WL1, so that the forward bias is added to the diode DI provided between the bit line BL0 and the word line WL1. Therefore, the current flows from the bit line BL0 into the memory unit MU1. Then, the current flowing into the memory unit MU1 flows to the word line WL1 through the cell chain CC1 since the transistor STp0 of the memory unit MU1 enters the OFF state. The other operations are similar to those described using FIG. 12.

In this way, the semiconductor memory device 1 according to the modification of this embodiment can perform the read operation by changing the voltage values to be applied to the bit line BL and the word line WL. Furthermore, the write operation of the semiconductor memory device 1 according to the modification of this embodiment can be performed by changing the applying voltage similarly to the read operation.

[2] Second Embodiment

Next, the description will be given about the semiconductor memory device 1 according to a second embodiment.

The semiconductor memory device 1 according to this embodiment is configured such that the electric conductor corresponding to the pillar select line SGp passes through the inside of each memory pillar MP in the semiconductor memory device 1 according to the first embodiment. Hereinafter, the description will be given focusing on differences from the first embodiment.

[2-1] Configuration of Semiconductor Memory Device 1

[2-1-1] Circuit Configuration of Memory Cell Array 10

First, the circuit configuration of the memory cell array 10 will be described using FIG. 18. FIG. 18 is a circuit diagram of the memory cell array 10 in the semiconductor memory device 1 according to this embodiment. The circuit configuration illustrated in FIG. 18 has a different configuration from that described using FIG. 2 of the first embodiment in the configurations of the bit line BL, the pillar select line SGp, and the pillar select transistors STp0 and STp1.

Specifically, as illustrated in FIG. 18, the memory unit MU is provided in correspondence with two bit lines BL and one word line WL. Hereinafter, the description will be given mainly focusing on the bit lines BL0 and BL1, and the memory unit MU1 corresponding to the word line WL1.

One ends of the cell chains CC0 and CC1 are connected to the word line WL1 through the diode DI. Specifically, the cathode of the diode DI is connected to the other ends of the cell chains CC0 and CC1, and the anode of the diode DI is connected to the word line WL1. The other ends of the cell chains CC0 and CC1 are connected to one ends of the transistors STp0 and STp1 respectively. The other ends of the transistors STp0 and STp1 are connected to the bit lines BL0 and BL1 respectively. The gates of the transistors STp0 and STp1 are commonly connected to the pillar select line SGp0.

In the above configuration, one bit line BL in two bit lines BL corresponding to each memory unit MU shares the word line WL, and is shared by the adjacent memory unit MU. Specifically, for example, the transistor STp1 of the memory unit MU1 and the transistor STp0 of the memory unit MU3 are commonly connected to the bit line BL1. In other words, the facing pillar select transistors STp share the word line WL, and share the bit line BL with the adjacent memory unit MU.

In addition, the gates of the transistors STp0 and STp1 in the memory unit MU1 are connected to the gates of the transistors STp0 and STp1 in the memory unit MU0 respectively. In other words, in the memory units MU which share the bit line BL and are connected to the different word lines WL, the gates of the transistors STp0 and STp1 are commonly connected. In other words, in the memory units MU sharing the bit line BL, the pillar select transistors STp0 and STp1 share the same pillar select line SGp.

Figure 19:
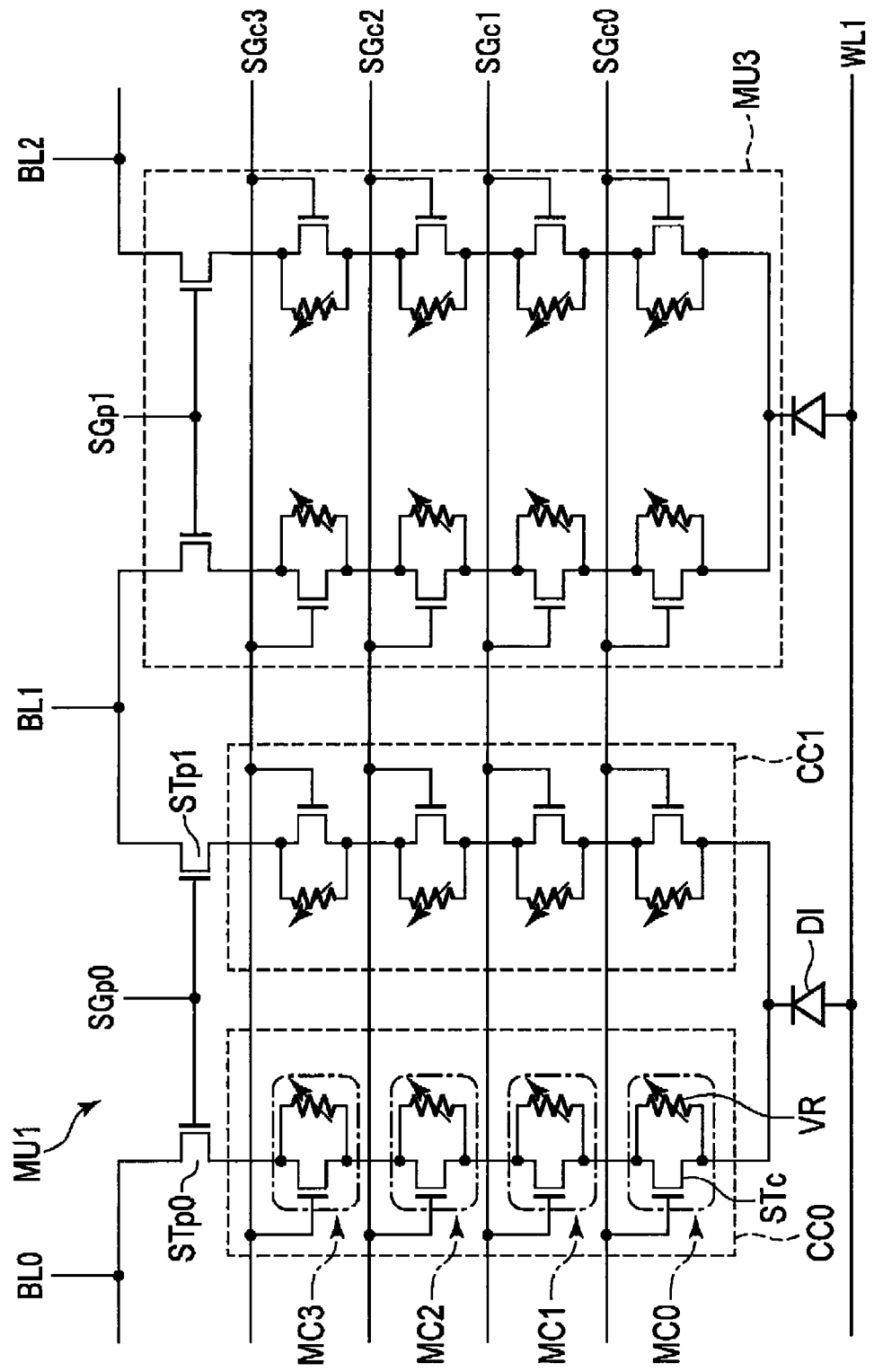

As described above, in this embodiment, the different bit lines BL are connected to the cell chains CC0 and CC1 in each memory unit MU. Furthermore, a detailed circuit configuration of the cell chain CC contained in the memory unit MU and the cell select line SGc are illustrated in FIG. 19. FIG. 19 is a circuit diagram illustrating a specific circuit configuration of the cell chain CC and the cell select line SGc focusing on the memory unit MU connected to the word line WL1 in FIG. 18. As illustrated in FIG. 19, the detailed circuit configurations of the cell chain CC and the cell select line SGc are similar to those described using FIG. 3 in the first embodiment, and thus the description thereof will be omitted.

[2-1-2] Structure of Memory Cell Array 10

Next, the entire structure of the memory cell array 10 will be described using FIG. 20. FIG. 20 is a plan layout diagram of the memory cell array 10, which is different from the plan layout described using FIG. 7 of the first embodiment in the arrangement of the memory pillar MP. Specifically, as illustrated in FIG. 20, the memory pillar MP is disposed on the electric conductor 30 and between the adjacent electric conductors 38.

Figure 21:
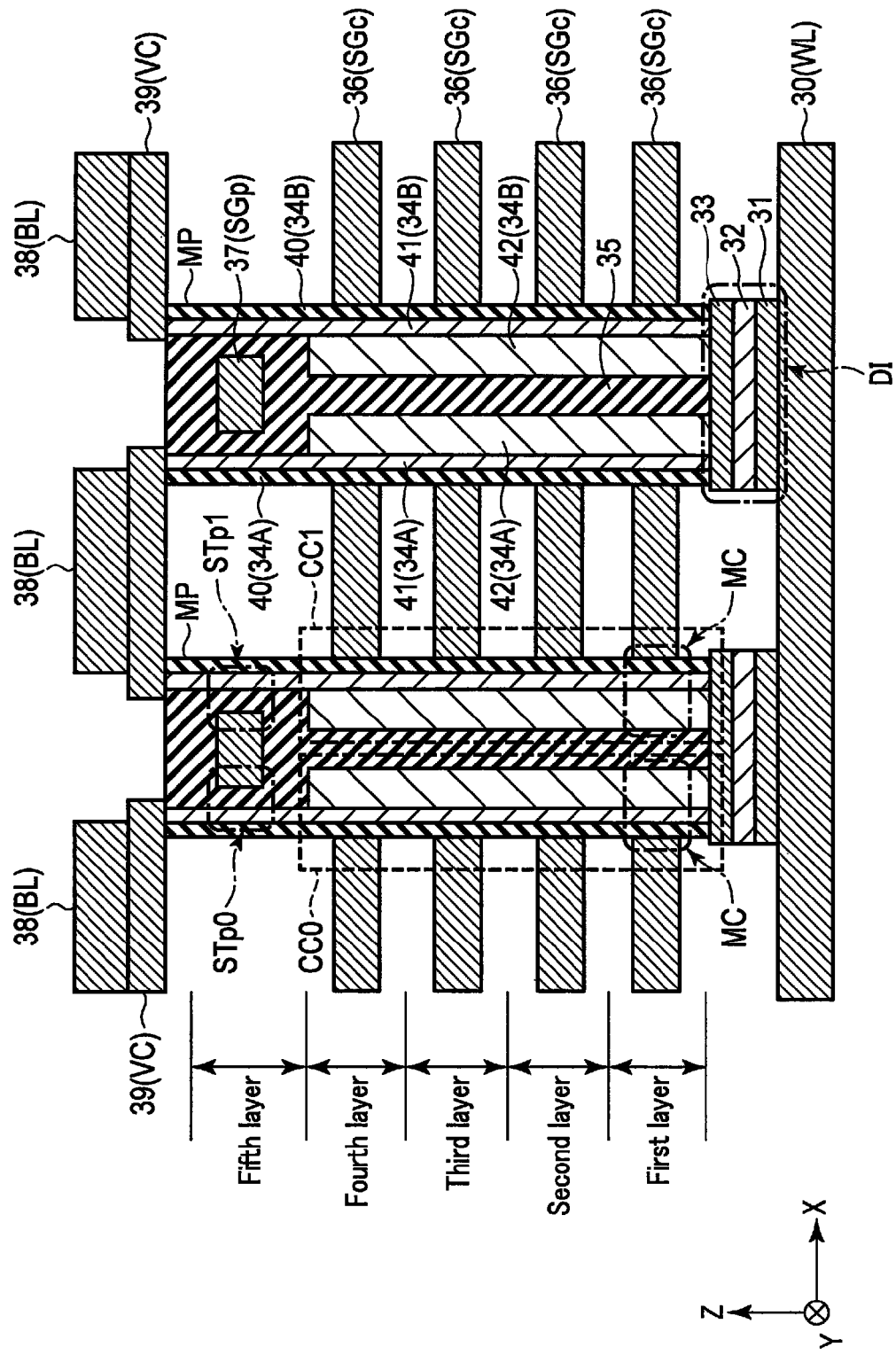

A sectional structure of the memory cell array 10 according to this embodiment is illustrated in FIGS. 21 and 22. FIG. 21 illustrates a sectional surface of the memory pillar MP in the XZ plane. FIG. 22 illustrates a sectional surface of the memory pillar MP in the XY plane. FIG. 22 corresponds to the sectional surface containing the fifth layer illustrated in FIG. 21.

The sectional structure illustrated in FIG. 21 is different from that described using FIG. 8 of the first embodiment in the arrangement of the electric conductors 37 to 39. Specifically, the electric conductor 37 corresponding to the pillar select line SGp in the fifth layer passes through the inside of the memory pillar MP.

More specifically, as illustrated in FIGS. 21 and 22, the electric conductors 37 in the fifth layer passes through between the channel layers 41 of the films 34A and 34B, and are in contact with the channel layer 41 of the films 34A and 34B through the insulating layer 35. In this embodiment, the insulating layer 35 between the electric conductor 37 and the channel layer 41 serves as the gate insulating film of the pillar select transistor STp. In addition, as illustrated in FIG. 22, the electric conductor 37 corresponding to the pillar select line SGp passes and extends through the insulating layer 35 of the memory pillar MP arranged in the Y direction.

In addition, as illustrated in FIG. 21, the different electric conductor 39 is provided on the cell chains CC0 and CC1 contained in the memory pillar MP. In addition, the electric conductor 39 is provided to link the channel layer 41 of the film 34A in the one memory pillar MP in the adjacent memory pillars MP in the X direction and the channel layer 41 of the film 34B in the other memory pillar MP. Then, the electric conductor 38 corresponding to the bit line BL is provided on each of the electric conductor 39.

Furthermore, the description in this embodiment has been made about an example in a case where the insulating layer 35 provided in the memory pillar MP serves as the gate insulating film in the pillar select transistor STp, but the invention is not limited thereto. For example, the insulating layer 35 and the gate insulating film in the transistor STp may be separately formed, or may be formed in a different composition.

[2-2] Operation of Semiconductor Memory Device 1

Next, the description will be given about the read operation as an exemplary operation of the semiconductor memory device 1 according to the second embodiment. The waveforms of the voltages to be applied to various wiring in the read operation of the semiconductor memory device 1 according to this embodiment is similar to those of FIG. 11 described in the first embodiment.

A specific example of the read operation of the semiconductor memory device 1 according to this embodiment is illustrated in FIG. 23. FIG. 23 illustrates a situation in a case where the data is read of the memory cell MC2 contained in the cell chain CC1 of the memory unit MU1 in the circuit diagram described in FIG. 19.

As illustrated in FIG. 23, in a case where the data of the memory cell MC2 contained in the cell chain CC1 of the memory unit MU1 is read, the bit line BL1, the word line WL1, the pillar select line SGp0, and the cell select line SGc2 are selected. Specifically, the voltage Vss is applied to the bit line BL1, and the voltage Vread is applied to the word line WL1. The "H" level voltage is applied to the selected pillar select line SGp0, and the voltage Vss is applied to the unselected pillar select line SGp. The voltage Vss is applied to the selected cell select line SGc2, and the "H" level voltage is applied to the unselected cell select line SGc.

Therefore, the pillar select transistors STp0 and STp1 enter the ON state in the memory unit MU1. In addition, a potential difference occurs between the bit line BL1 and the word line WL1, and the forward bias is applied to the corresponding diode DI through the memory unit MU1, so that the current flows from the word line WL1 to the memory unit MU1. The current flowing into the memory unit MU1 flows to the bit line BL1 through the cell chain CC1. Furthermore, the current does not flow to the other memory units MU connected to the word line WL1 since the pillar select transistors STp0 and STp1 enter the OFF state. The operation is similar to the read operation described in the first embodiment. When the read operation ends at time t1, the semiconductor memory device 1 returns to the initial state.

As described above, the semiconductor memory device 1 according to this embodiment can make the current flow to one cell chain CC contained in the memory unit MU, and can perform the read operation. In addition, the semiconductor memory device 1 according to this embodiment can perform the write operation (the set program operation and the reset program operation) by selecting a memory cell similarly to the read operation. The waveforms of the voltages to be applied to various wires in the write operation are similar to those of FIGS. 13 and 14 used for describing the first embodiment.

[2-3] Effects of Second Embodiment

According to the semiconductor memory device 1 of this embodiment, the effects similar to the first embodiment can be obtained. Hereinafter, the description will be given about the effects in detail.

The semiconductor memory device 1 according to this embodiment is different from the semiconductor memory device 1 according to the first embodiment in that the electric conductor 37 corresponding to the pillar select line SGp passes through the inside of the memory pillar MP. Specifically, the electric conductor 37 also passes through the insulating layer 35, and is in contact with the channel layers 41 of the films 34A and 34B through the insulating layer 35. The insulating layer 35 between the electric conductor 37 and the film 34A serves as a gate oxide film of the pillar select transistor ST0. The insulating layer 35 between the electric conductor 37 and the film 34B serves as a gate oxide film of the pillar select transistor ST1.

Furthermore, in the semiconductor memory device 1 according to this embodiment, the different bit line BL is connected to each cell chain CC. One bit line BL is shared with the word line WL, and shared with the adjacent memory unit MU. Even in such a case, the semiconductor memory device 1 can select one of the cell chains CC0 and CC1 by controlling the voltage to be applied to the selected or unselected bit line BL and the voltage to be applied to the pillar select transistor STp for each memory unit MU. In other words, the semiconductor memory device 1 can perform the read operation and the write operation for each cell chain CC similarly to the first embodiment.

As described above, the semiconductor memory device 1 according to this embodiment can be provided with two cell chains CC in one memory unit MU. Therefore, the semiconductor memory device 1 according to this embodiment can make the storage capacity in a unit of memory pillar MP large similarly to the first embodiment, so that the entire storage capacity of the semiconductor memory device 1 can be large.

FIG. 24 is a circuit configuration according to a modification of the semiconductor memory device 1 according to this embodiment. This configuration is different from the circuit configuration illustrated in FIG. 15 in the direction of connecting the diode DI. Specifically, as illustrated in FIG. 24, the diode DI corresponding to each memory unit MU is configured such that the anode is connected to one ends of the cell chains CC0 and CC1, and the cathode is connected to the corresponding word line WL. The other circuit configurations are similar to those described using FIGS. 15 and 16.

In addition, various operations of the semiconductor memory device 1 according to the modification of this embodiment may be configured to control the voltage similarly to the modification of the first embodiment. For example, a specific example of the read operation of the semiconductor memory device 1 according to this embodiment is illustrated in FIG. 25. FIG. 25 is a circuit diagram to which this modification of the circuit diagram illustrated in FIG. 16 is applied, illustrating a situation in a case where the data is read from the memory cell MC2 contained in the cell chain CC1 of the memory unit MU1. The operation state illustrated in FIG. 25 is different from that described using FIG. 23 in that the direction of current is opposite.

Specifically, the forward bias is added to the diode DI provided between the bit line BL1 and the word line WL1 by applying the voltage Vread to the bit line BL1, and by applying the voltage Vss to the word line WL1. Therefore, the current flows from the bit line BL1 into the memory unit MU1. Then, the current flowing into the memory unit MU1 flows to the word line WL1 through the cell chain CC1. The other operations are similar to those described using FIG. 23.

In this way, the semiconductor memory device 1 according to the modification of this embodiment can perform the read operation by changing the voltage to be applied to the bit line BL and the word line WL. Furthermore, the write operation of the semiconductor memory device 1 according to the modification of this embodiment can be performed by changing the applying voltage similarly to the read operation.

[3] Third Embodiment

Next, the description will be given about the semiconductor memory device 1 according to a third embodiment. The semiconductor memory device 1 according to this embodiment is different from the semiconductor memory device 1 according to the first embodiment in that the pillar select transistor STp is not provided, and the different bit line BL is connected to each cell chain CC. Hereinafter, the description will be given about differences between the first and second embodiments.

[3-1] Configuration of Semiconductor Memory Device 1
[3-1-1] Circuit Configuration of Memory Cell Array 10

First, the description will be given about a circuit configuration of the memory cell array 10 using FIG. 26. FIG. 26 is a circuit diagram of the memory cell array 10 in the semiconductor memory device 1 according to this embodiment. The circuit configuration illustrated in FIG. 26 is different from that described using FIG. 2 of the first embodiment in that the connection relation of the bit line BL is different and each memory unit MU does not include the pillar select transistor STp.

Specifically, as illustrated in FIG. 26, the memory unit MU is provided between two bit lines BL and one word line WL. Hereinafter, the description will be given mainly focusing on the bit lines BL0 and BL1, and the memory unit MU1 corresponding to the word line WL1.

One ends of the cell chains CC0 and CC1 are connected to the word line WL1 through the diode DI. Specifically, the cathode of the diode DI is connected to the other ends of the cell chains CC0 and CC1, and the anode of the diode DI is connected to the word line WL1. The other ends of the cell chains CC0 and CC1 are connected to the bit lines BL0 and BL1 respectively.

In addition, the respective memory units MU share the word line WL similarly to the second embodiment, and do not share the bit line BL in the adjacent memory units MU. Specifically, in the adjacent memory units MU1 and MU3 connected to the word line WL1, the memory unit MU1 is connected to the bit lines BL0 and BL1, and the memory unit MU3 is connected to the bit lines BL2 and BL3. Furthermore, the number of bit lines BL in the memory cell array 10 corresponds to the number of cell chains CC contained in the memory unit MU connected to one word line WL for example.

As described above, in this embodiment, the different bit lines BL are associated to the cell chains CC0 and CC1 in each memory unit MU. Furthermore, a detailed circuit configuration of the cell chain CC contained in the memory pillar MP and the cell select line SGc are illustrated in FIG. 27. FIG. 27 is a circuit diagram illustrating a specific circuit configuration of the cell chain CC and the cell select line SGc focusing on the memory unit MU connected to the word line WL1 in FIG. 26. As illustrated in FIG. 27, the detailed circuit configuration of the cell chain CC and the cell select line SGc is similar to that described using FIG. 3 in the first embodiment, and thus the description thereof will be omitted.

[3-1-2] Structure of Memory Cell Array 10

Figure 28:
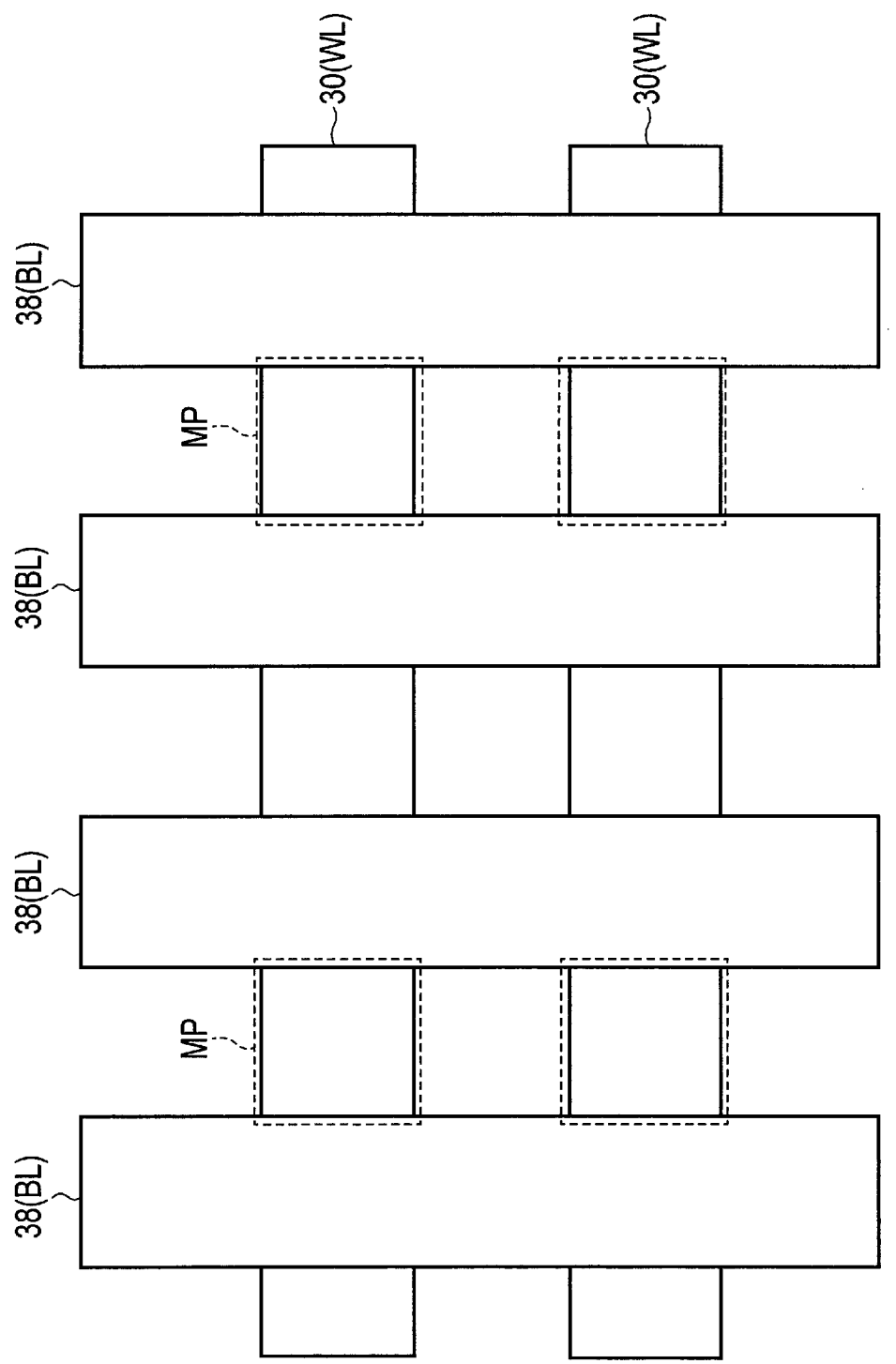
FIG. 28 is a plan layout diagram of the memory cell array included in the semiconductor memory device according to the second embodiment.

Next, the entire structure of the memory cell array 10 will be described using FIG. 28. FIG. 28 is a plan layout diagram of the memory cell array 10, and is different from the play layout described using FIG. 20 of the second embodiment in the arrangement of the memory pillar MP. Specifically, as illustrated in FIG. 28, two electric conductors 38 are paired, and the memory pillar MP is disposed for every pair. In other words, the memory pillar MP is disposed for every two bit lines BL in the electric conductors 38 which are arranged in the X direction.

The sectional structure of the memory cell array 10 according to this embodiment is illustrated in FIG. 29. FIG. 29 illustrates a sectional surface of the memory pillar MP in the plane formed in the X and Z directions. The sectional structure illustrated in FIG. 29 is different from that described using FIG. 21 of the second embodiment in that the fifth layer of the memory pillar MP is omitted and the electric conductors 38 and 39 shared by the adjacent memory pillars MP are separated.

Specifically, as illustrated in FIG. 29, the channel layers 41 of the films 34A and 34B in the respective memory pillars MP are in contact with different electric conductors 39. Then, the electric conductor 38 corresponding to the bit line BL is provided on each electric conductor 39. In addition, the adjacent memory pillars MP do not share the electric conductors 38 and 39. The other structures are similar to those of FIG. 21 described in the second embodiment.

[3-2] Operation of Semiconductor Memory Device 1

Next, the description will be given about the read operation as an exemplary operation of the semiconductor memory device 1 according to the third embodiment. The waveforms of the voltages to be applied to various wires in the read operation of the semiconductor memory device 1 according to this embodiment are illustrated in FIG. 30. The waveforms illustrated in FIG. 30 are similar to those of FIG. 11 described in the first embodiment (that is, those from which the waveform of the pillar select line SGp is omitted), and thus the description thereof will be omitted.

Figure 31:
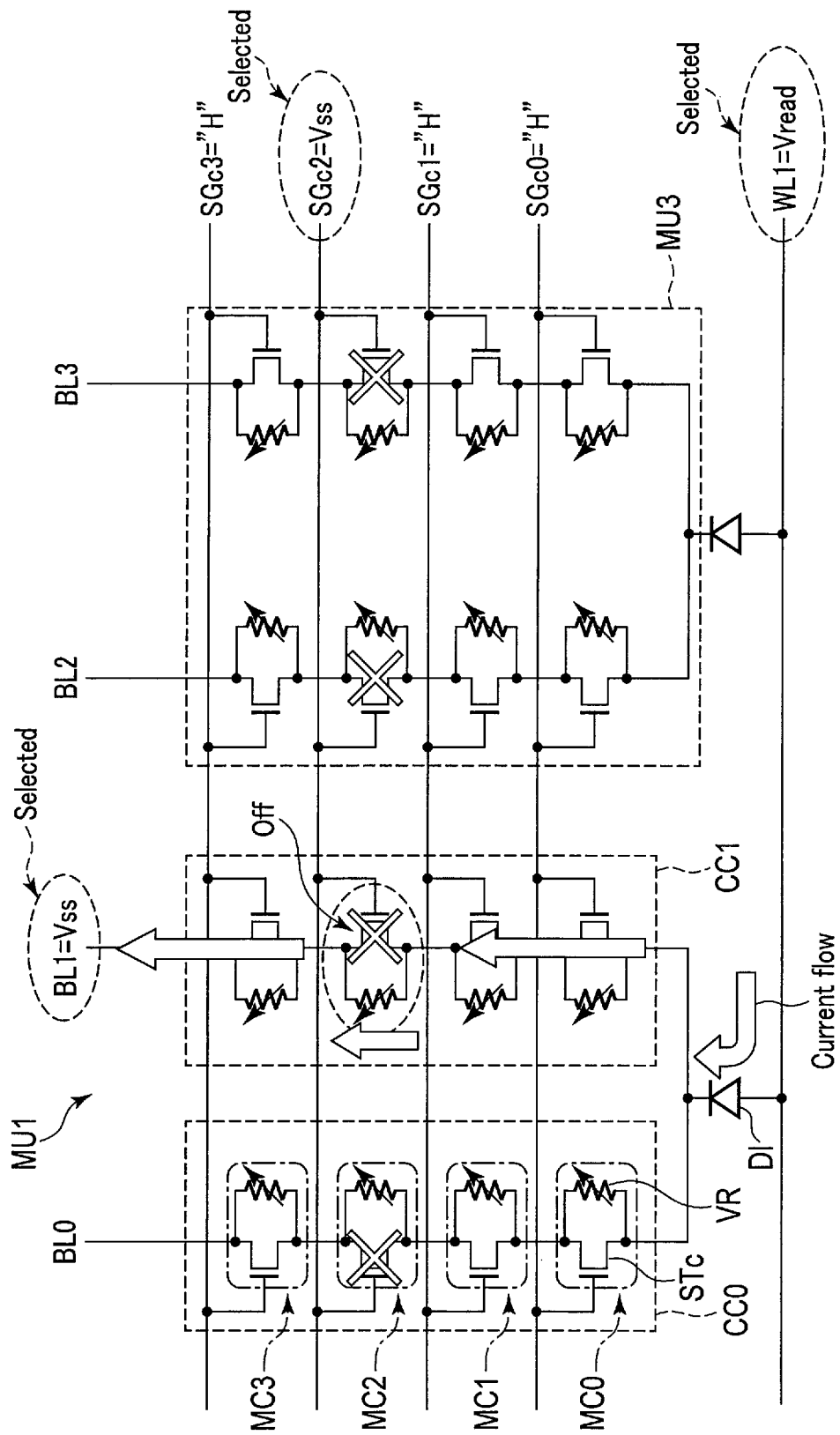
FIG. 31 is a circuit diagram for describing the read operation in the semiconductor memory device according to the third embodiment.

A specific example of the read operation of the semiconductor memory device 1 according to this embodiment is illustrated in FIG. 31. FIG. 31 illustrates a situation in a case where the data is read from the memory cell MC2 contained in the cell chain CC1 of the memory unit MU1 in a circuit diagram described in FIG. 27.

As illustrated in FIG. 31, in a case where the data of the memory cell MC2 contained in the cell chain CC1 of the memory unit MU1 is read, the bit line BL1, the word line WL1, and the cell select line SGc2 are selected. Specifically, the voltage Vss is applied to the bit line BL1, and the voltage Vread is applied to the word line WL1. The voltage Vss is applied to the selected cell select line SGc2, and the "H" level voltage is applied to the unselected cell select line SGc.

Therefore, a potential difference occurs between the bit line BL1 and the word line WL1, and the forward bias is applied to the corresponding diode DI through the memory unit MU1, and thus the current flows from the word line WL1 into the memory unit MU1. The current flowing into the memory unit MU1 flows to the bit line BL1 through the cell chain CC1. The operation is similar to the read operation described in the first embodiment. When the read operation ends at time t1, the semiconductor memory device 1 returns to the initial state.

As described above, the semiconductor memory device 1 according to this embodiment can make the current flow to one cell chain CC contained in the memory unit MU, and can perform the read operation. In addition, the semiconductor memory device 1 according to this embodiment can perform the write operation (the set program operation and the reset program operation) by selecting a memory cell similarly to the read operation. The waveforms of the voltages to be applied to various wires in the write operation are similar to those from which the waveform of the pillar select line SGp is omitted in FIGS. 13 and 14 described in the first embodiment.

[3-3] Effects of Third Embodiment

According to the semiconductor memory device 1 of this embodiment, a process difficulty level can be lowered more than that of the first and second embodiments. Hereinafter, the description will be given about the effects in detail.

The semiconductor memory device 1 according to this embodiment is different from the semiconductor memory device 1 according to the first embodiment in that the cell chains CC0 and CC1 in one memory unit MU are allocated with different bit lines BL, and the pillar select transistor STp is omitted.

In addition, in the semiconductor memory device 1 according to this embodiment, the word line WL is shared, and the bit line BL is not shared by the adjacent memory units MU. Therefore, the semiconductor memory device 1 can select one cell chain CC among the memory units MU connected to the common word line WL by the voltage to be applied to the selected and unselected bit lines BL. In other words, the semiconductor memory device 1 can perform the read operation and the write operation for each cell chain CC similarly to the first embodiment.

As described above, the semiconductor memory device 1 according to this embodiment can be configured such that two cell chains CC are provided in one memory pillar MP. Therefore, the semiconductor memory device 1 according to this embodiment can make the entire storage capacity of the semiconductor memory device 1 large.

In addition, in the semiconductor memory device 1 according to this embodiment, the word line WL is not shared, and the bit line BL is not shared by the adjacent memory units. Therefore, the semiconductor memory device 1 according to this embodiment can be made large in an arrange gap between the memory pillars MP, so that a process difficulty level of the semiconductor memory device 1 can be lowered.

In addition, the semiconductor memory device 1 according to this embodiment can be configured such that the pillar driver 15 is omitted. Therefore, the semiconductor memory device 1 according to this embodiment can suppress the region of the semiconductor memory device 1, and the manufacturing costs can be suppressed.

FIG. 32 is a circuit configuration of a modification of the semiconductor memory device 1 according to this embodiment. This configuration is different from the circuit configuration illustrated in FIG. 26 in the connection direction of the diode DI. Specifically, as illustrated in FIG. 32, the diode DI corresponding to each memory unit MU is configured such that the anode is connected to one ends of the cell chains CC0 and CC1, and the cathode is connected to the corresponding word line WL. The other circuit configurations are similar to those of the circuit configuration described using FIGS. 26 and 27.

Figure 33:
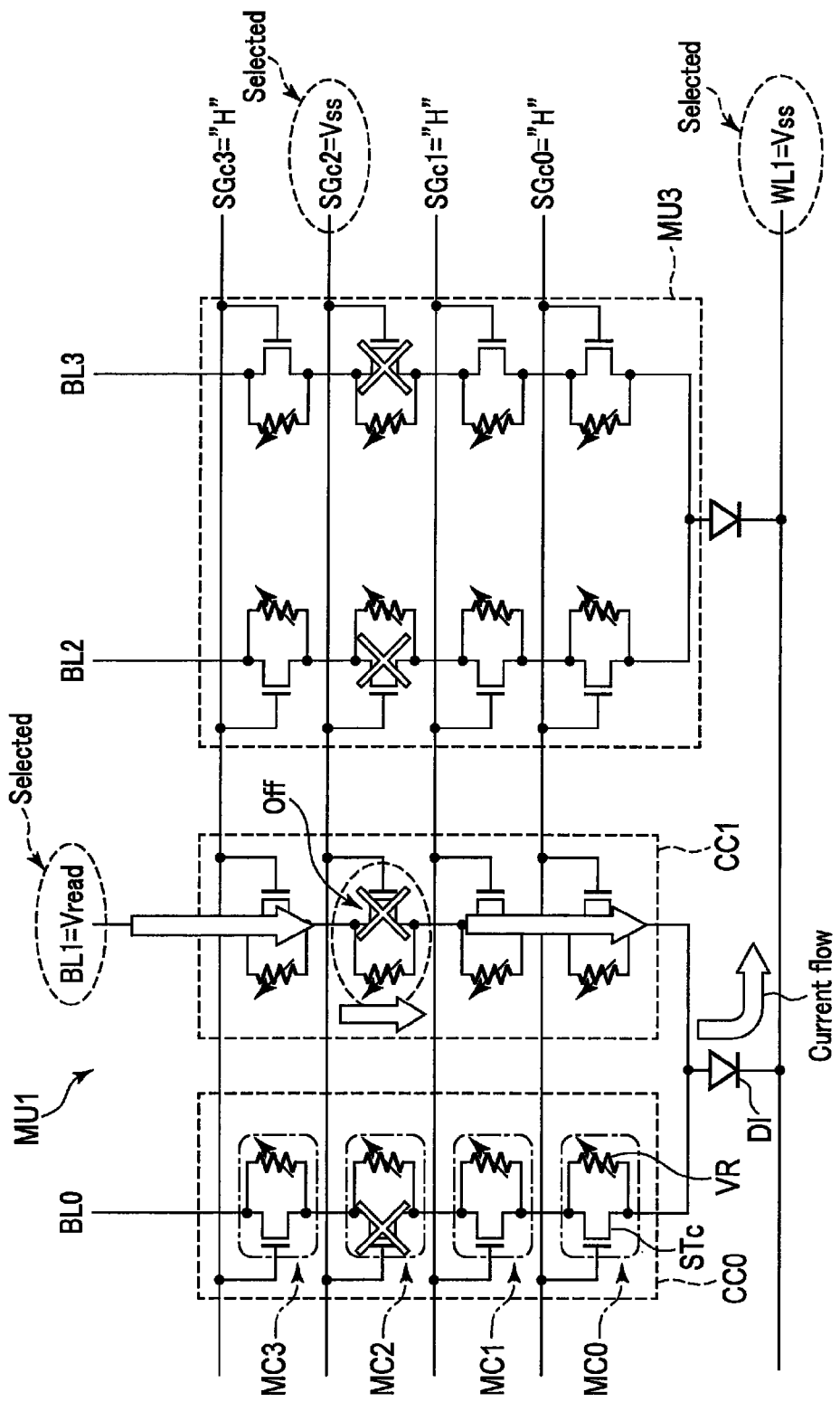
FIG. 33 is a circuit diagram for describing the read operation in the semiconductor memory device according to the modification of the third embodiment.

In addition, various operations of the semiconductor memory device 1 according to the modification of this embodiment may be configured to control the voltage similarly to the modification of the first embodiment. For example, a specific example of the read operation of the semiconductor memory device 1 according to this embodiment is illustrated in FIG. 33. FIG. 33 is a circuit diagram to which this modification of the circuit diagram illustrated in FIG. 27 is applied, illustrating a situation in a case where the data is read from the memory cell MC2 contained in the cell chain CC1 of the memory unit MU1. The operation state illustrated in FIG. 33 is different from that described using FIG. 31 in that the direction of the current is opposite.

Specifically, the forward bias is added to the diode DI provided between the bit line BL1 and the word line WL1 by applying the voltage Vread to the bit line BL1, and by applying the voltage Vss to the word line WL1. Therefore, the current flows from the bit line BL1 into a memory pillar MP1. Then, the current flowing into the memory unit MU1 flows to the word line WL1 through the cell chain CC1. The other operations are similar to those described using FIG. 31.

In this way, the semiconductor memory device 1 according to the modification of this embodiment can perform the read operation by changing the voltage to be applied to the bit line BL and the word line WL. Furthermore, the write operation of the semiconductor memory device 1 according to the modification of this embodiment can be performed by changing the applying voltage similarly to the read operation.

[4] Fourth Embodiment

Next, the description will be given about the semiconductor memory device 1 according to a fourth embodiment. The semiconductor memory device 1 according to this embodiment is configured such that one ends of two cell chains CC contained in each memory unit MU are connected to the transistors, and various operations are performed by controlling the bit line connected to the other ends of two cell chains CC and a source line. Hereinafter, the description will be given about differences from the first to third embodiments.

[4-1] Configuration of Semiconductor Memory Device 1

[4-1-1] Circuit Configuration of Memory Cell Array 10

First, the description will be given about the circuit configuration of the memory cell array 10 using FIG. 34. FIG. 34 is a circuit diagram of the memory cell array 10 in the semiconductor memory device 1 according to this embodiment. The circuit configuration illustrated in FIG. 34 is different from that described using FIG. 2 of the first embodiment in that a plurality of source lines SL is provided, and the pillar select transistor STp2 is provided in place of the diode DI.

Specifically, the source line SL and the bit line BL are disposed alternately as illustrated in FIG. 34. For example, k source lines are provided similarly to the bit lines BL. In other words, one bit line BL is disposed between the adjacent source lines SL, and one source line SL is disposed between the adjacent bit lines BL.

The transistor STp2 is provided in correspondence with each memory unit MU. The gate of the transistor STp2 is connected to the corresponding word line WL, and one end and the other end of the transistor STp2 are connected to the cell chains CC0 and CC1 in the corresponding memory unit MU. In other words, the transistor STp2 controls the current flowing between the cell chains CC0 and CC1 of the memory unit MU on the basis of the voltage applied to the word line WL.

In addition, the memory pillar MP is provided between one bit line BL and one word line WL. Then, for example, k bit lines BL and k source lines SL are provided. Hereinafter, the description will be described focusing on the bit line BL0, the source line SL0, and the memory unit MU1 corresponding to the word line WL1.

One ends of the cell chains CC0 and CC1 are connected to one end and the other end of the transistor STp2 respectively. The other ends of the cell chains CC0 and CC1 are connected to the source line SL0 and the bit line BL0 through the pillar select transistors STp0 and STp1, respectively.

As described above, the bit line BL, the source line SL, and the word line WL are associated in each memory unit MU of this embodiment. In addition, similarly to the second embodiment, each memory unit MU is configured such that the word line WL is shared, and the bit line BL are shared with the adjacent memory unit MU on one side. Furthermore, each memory unit MU is configured such that the word line WL is shared, and the source line SL is shared with the adjacent memory unit MU on the other side.

Furthermore, a detailed circuit configuration of the cell chain CC contained in the memory unit MU and the cell select line SGc is illustrated in FIG. 35. FIG. 35 is a circuit diagram illustrating a specific circuit configuration of the cell chain CC and the cell select line SGc focusing on the memory unit MU connected to the word line WL1 in FIG. 34. As illustrated in FIG. 35, in the memory cell array 10 according to this embodiment, a cell select line SGc_o corresponding to the cell chain CC0 and a cell select line SGc_e corresponding to the cell chain CC1 are provided.

Specifically, in each the memory unit MU, a cell select line SGc0_o is connected to the memory cell MC1 of the cell chain CC0, and a cell select line SGc0_e is connected to the memory cell MC1 of the cell chain CC1. Similarly, cell select lines SGc1_o and SGc1_e are connected to the memory cells MC1 of the cell chains CC0 and CC1 respectively. Cell select lines SGc2_o and SGc2_e are connected to the memory cells MC2 of the cell chains CC0 and CC1 respectively. Cell select lines SGc3_o and SGc3_e are connected to the memory cells MC3 of the cell chains CC0 and CC1 respectively. The other circuit configurations are similar to those described using FIG. 3 in the first embodiment, and thus the description thereof will be omitted.

[4-1-2] Configuration of Peripheral Circuit of Memory Cell Array 10

Next, a detailed configuration of the memory cell array 10 and the peripheral circuit will be described using FIG. 36. FIG. 36 corresponds to FIG. 5 described in the first embodiment, and the semiconductor memory device 1 further includes a source line driver 19.

As illustrated in FIG. 36, the source line driver 19 is connected to the source lines SL0 to SL(k−1), and selects one source line SL. The source line driver 19 applies a desired voltage to the selected source line and the unselected source line SL.

In addition, the cell driver 16 is connected to the cell select lines SGc0_o to SGc3_o corresponding to the cell chain CC0, and the cell select lines SGc0_e to SGc3_e corresponding to the cell chain CC1. Then, the cell driver 16 selects any one cell select line SGc among the cell select lines SGc0_o to SGc3_o and the cell select lines SGc0_e to SGc3_e. In addition, the pillar driver 15 in this embodiment is connected to the pillar select lines SGp0 to SGp(m−1), and selects a plurality of pillar select lines SGp. The other configurations are similar to those of FIG. 5 described in the first embodiment.

[4-1-3] Structure of Memory Cell Array 10

Figure 37:
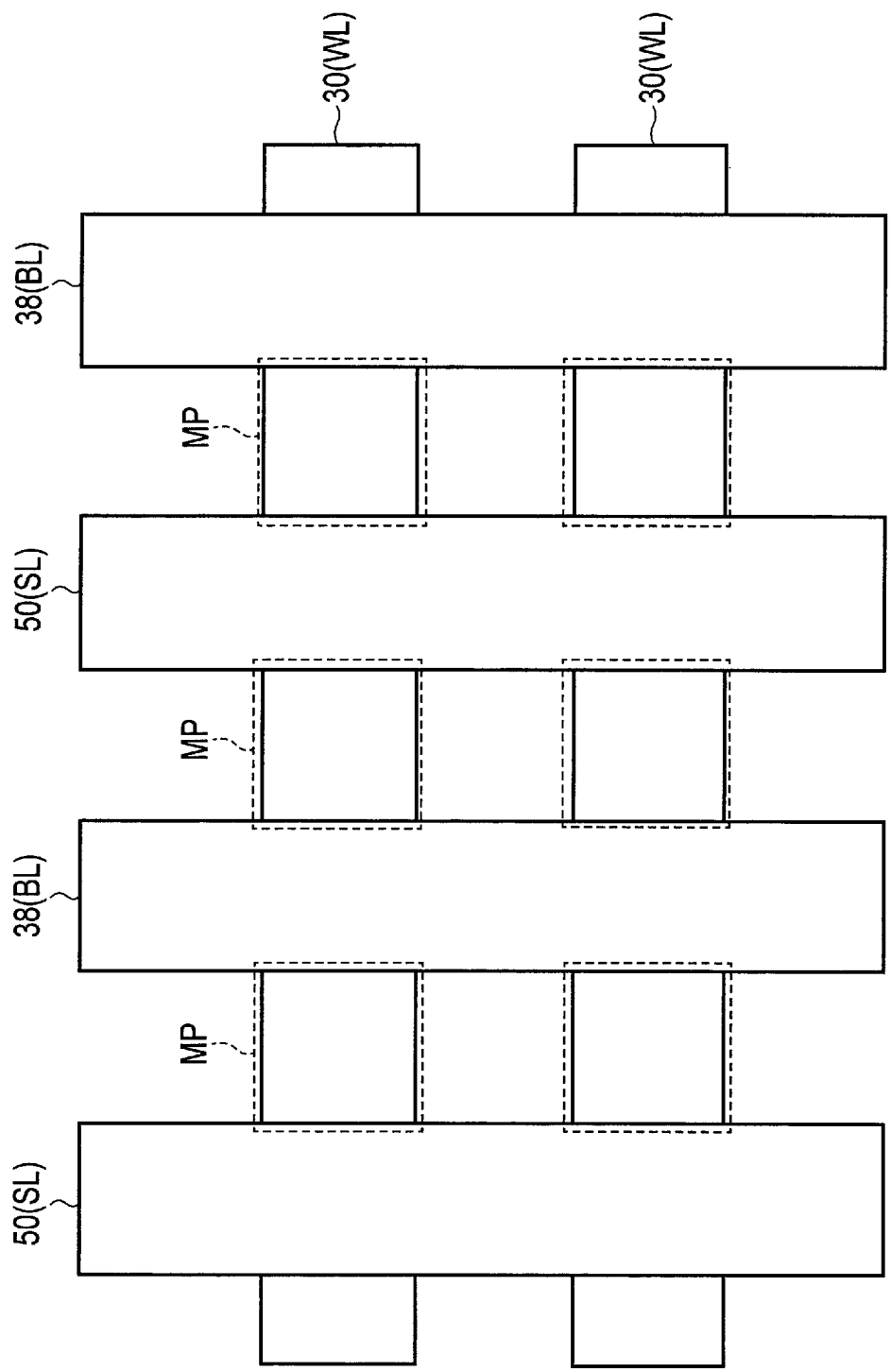
FIG. 37 is a plan layout diagram of the memory cell array included in the semiconductor memory device according to the fourth embodiment.

Next, the entire structure of the memory cell array 10 will be described using FIG. 37. FIG. 37 is a plan layout diagram of the memory cell array 10. As illustrated in FIG. 37, a plurality of electric conductors 50 is provided in the memory cell array 10.

The electric conductor 50 extends in the Y direction for example, and is disposed alternately together with the electric conductor 38 in the X direction. One electric conductor 50 serves as one source line SL. In addition, as illustrated in FIG. 37, the memory pillar MP is disposed between the electric conductors 38 and 50 and the electric conductor 30. In addition, each memory pillar is partially overlapped with the electric conductors 30, 38, and 50.

Figure 38:
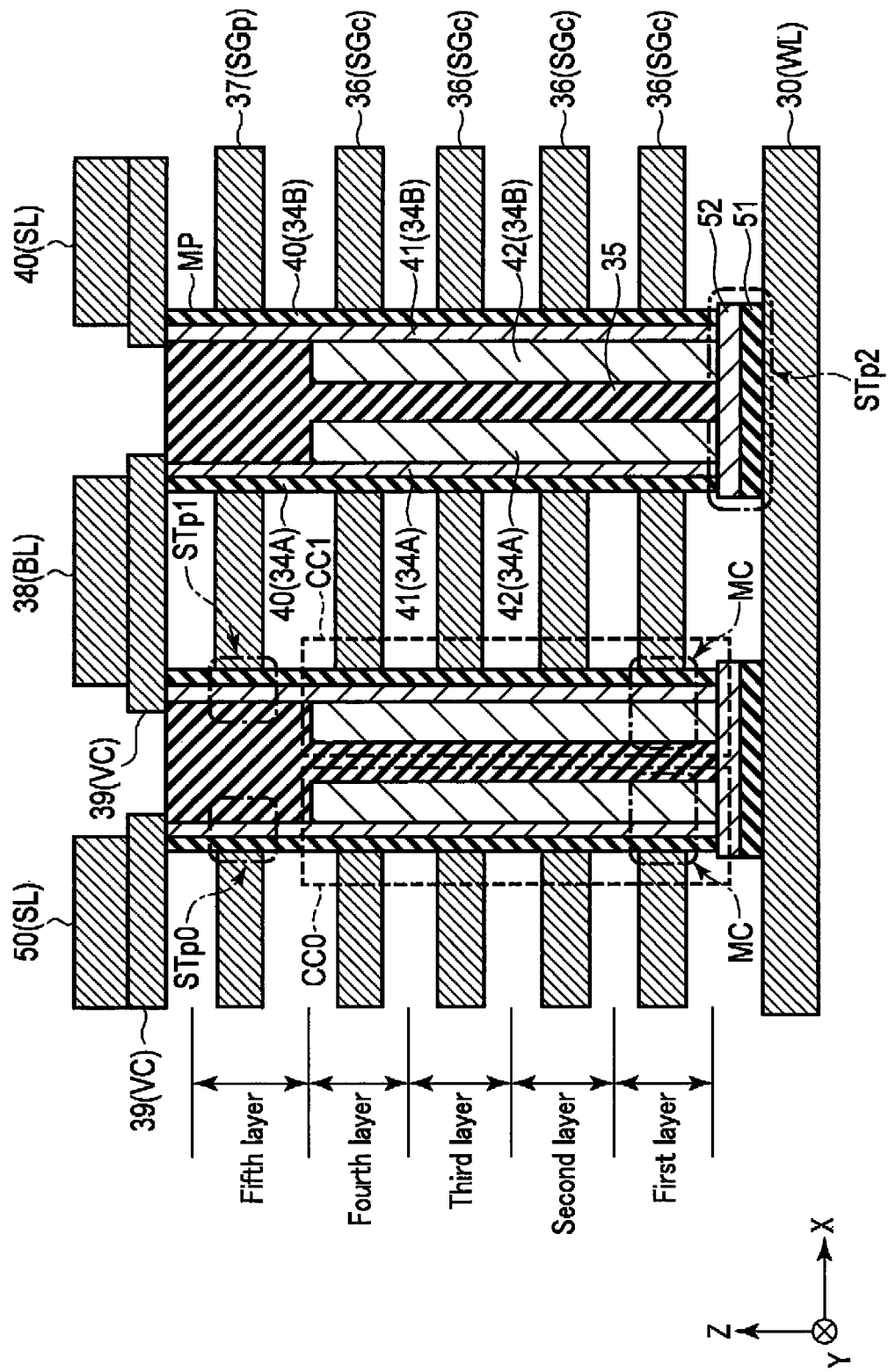
FIG. 38 is a sectional view of the memory cell array included in the semiconductor memory device according to the fourth embodiment.

The sectional structure of the memory cell array 10 according to this embodiment is illustrated in FIG. 38. FIG. 38 illustrates a sectional surface of the memory pillar MP in a plane formed by the X direction and the Z direction. The sectional structure illustrated in FIG. 38 is different from that described using FIG. 8 of the first embodiment in that the arrangement of the electric conductors 37 to 39 are different, and part of the electric conductor 38 is replaced to the electric conductor 50. In addition, in the memory cell array 10, the electric conductors 31 to 33 corresponding to the diode DI are replaced to a gate insulating film 51 and a channel layer 52 corresponding to the pillar select transistor STp2.

As illustrated in FIG. 38, different electric conductors 39 are provided on the cell chains CC0 and CC1 contained in the memory pillar MP. In addition, in the adjacent memory pillars MP, the electric conductor 39 is provided to link the channel layer 41 of the film 34A in the memory pillar MP on one side, and the channel layer 41 of the film 34B in the memory pillar MP on the other side. Then, the electric conductor 38 corresponding to the bit line BL or the electric conductor 50 corresponding to the source line SL is provided on each electric conductor 39.

In addition, as illustrated in FIG. 38, the pillar select transistor STp2 is provided between each memory pillar MP and the corresponding electric conductor 30. Specifically, the gate insulating film 51 and the channel layer 52 are sequentially stacked on the electric conductor 30. Then, the channel layer 52 is electrically connected to the channel layer 41 of the films 34A and 34B in the corresponding memory pillar MP.

Furthermore, the configurations of the gate insulating film 51 and the channel layer 52 are similar to those of the gate insulating film 40 and the channel layer 41 for example. In addition, the other configurations of the semiconductor memory device 1 according to this embodiment are similar to those of FIG. 8 described in the first embodiment.

[4-2] Operation of Semiconductor Memory Device 1

Next, the description will be given about the read operation as an exemplary operation of the semiconductor memory device 1 according to the fourth embodiment. FIG. 39 illustrates waveforms of the voltages to be applied to various wires in the read operation of the semiconductor memory device 1 according to this embodiment.

As illustrated in FIG. 39, the semiconductor memory device 1 is configured such that the voltage Vss is applied to the bit line BL, the source line SL, the word line WL, the pillar select line SGp, and the cell select line SGc in the initial state before the read operation.

When the read operation starts at time t0, the sense amplifier SA applies the voltage Vread to the global bit line GBL. Then, when the column driver 13 selects the bit line BL, the current path is formed between the global bit line GBL and the selected bit line BL_sel, and the voltage of the selected bit line BL_sel becomes Vread. The source line driver 19 applies the voltage Vss to the selected source line SL_sel, and applies the voltage Vread to the unselected source line SL_usel. The word line driver 14 applies the "H" level voltage to the selected word line WL_sel, and applies the voltage Vss to the unselected word line WL_usel. The operation is similar to the read operation described in the first embodiment. When the read operation ends at time t1, the semiconductor memory device 1 returns to the initial state.

Figure 40:
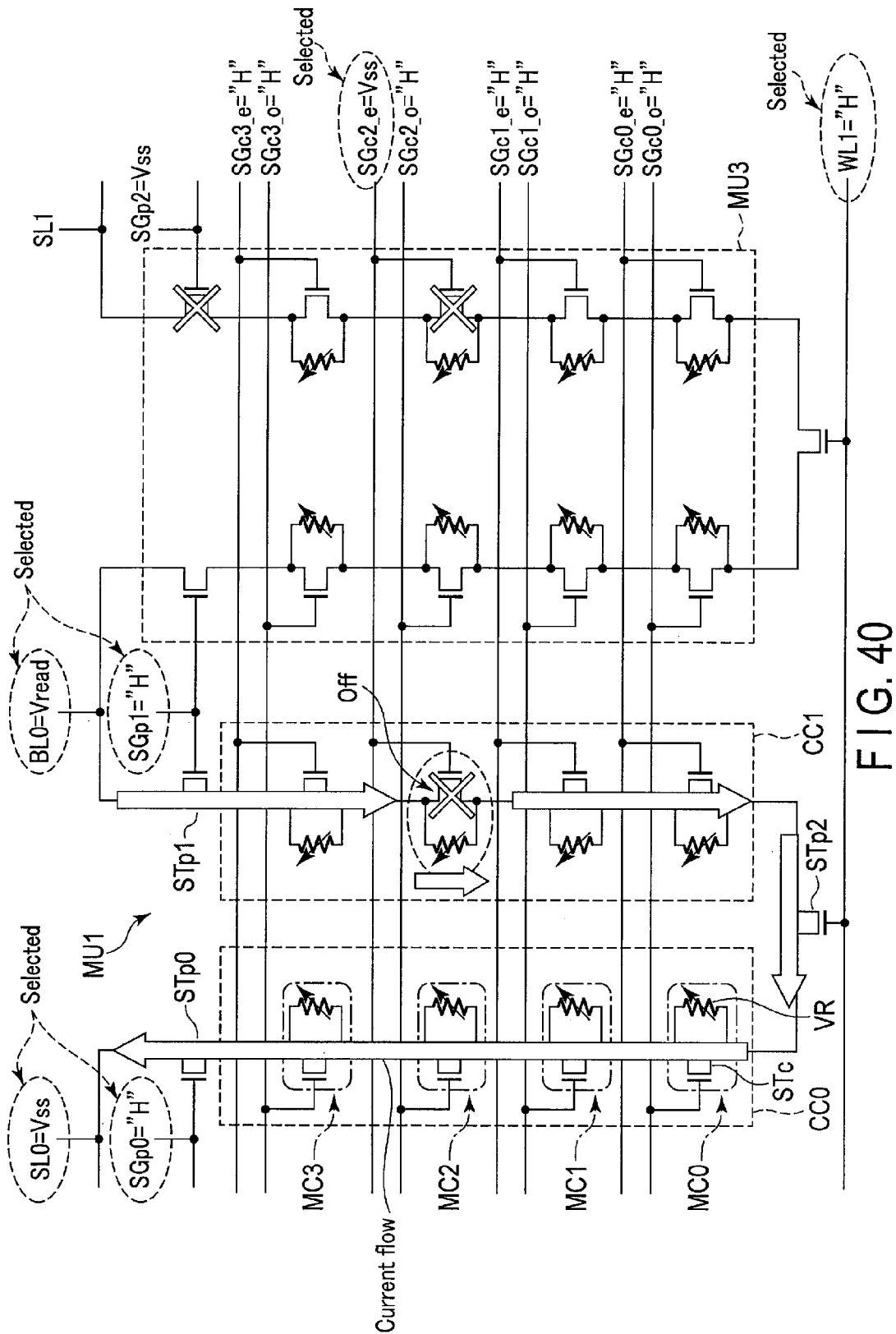
FIG. 40 is a circuit diagram for describing the read operation in the semiconductor memory device according to the fourth embodiment.

A specific example of the read operation described above is illustrated in FIG. 40. FIG. 40 illustrates a situation in a case where the data is read of the memory cell MC2 contained in the cell chain CC1 of the memory unit MU1 in the circuit diagram described in FIG. 35.

As illustrated in FIG. 40, in a case where the data is read of the memory cell MC2 contained in the cell chain CC1 of the memory unit MU1, the bit line BL0, the source line SL0, the word line WL1, the pillar select lines SGp0 and SGp1, and the cell select line SGc2_e are selected. Specifically, the voltage Vread is applied to the bit line BL0, and the voltage Vss is applied to the source line SL0. The "H" level voltage is applied to the selected pillar select lines SGp0 and SGp1, and the voltage Vss is applied to the unselected pillar select line SGp. The voltage Vss is applied to the selected cell select line SGc2_e, and the "H" level voltage is applied to the unselected cell select line SGc.

Therefore, the pillar select transistors STp0 and STp1 enter the ON state in the memory unit MU1. In addition, the pillar select transistor STp2 connected to the word line WL1 enters the ON state, and a potential difference occurs between the bit line BL0 and the source line SL0. Then, the current flowing from the bit line BL0 into the memory unit MU1 flows to the source line SL0 sequentially through the cell chain CC1, the pillar select transistor STp2, and the cell chain CC0. At this time, in the memory pillar MP1, the voltage Vss is applied on to the cell select line SGc2_e, and the "H" level voltage is applied to the other cell select lines SGc. Therefore, the current flows only to the memory cell MC2 in the cell chain CC1 through the variable resistance element VR, and the current flows to the channel of the transistor STc in the other memory cells MC.

Furthermore, the pillar select transistor STp2 connected to the unselected word line WL_usel is applied with the voltage Vss and enters the OFF state. Therefore, the current does not flow into the corresponding memory unit MU. In addition, while the pillar select transistor STp2 connected to the selected word line WL_sel enters the ON state, one or both of the pillar select transistors STp0 and STp1 enter the OFF state in the memory unit MU other than the memory unit MU containing the selected memory cell MC. Therefore, the current does not flow into the memory pillar MP.

As described above, the semiconductor memory device 1 according to this embodiment can make the current flow to two cell chains CC contained in the memory unit MU to perform the read operation. In addition, the semiconductor memory device 1 according to this embodiment can perform the write operation (the set program operation and the reset program operation) by selecting a memory cell similarly to the read operation. The waveforms of the voltages to be applied to various wires in the write operation can be performed by changing the applying voltage similarly to the read operation, and thus the description thereof will be omitted.

[4-3] Effects of Fourth Embodiment

According to the semiconductor memory device 1 according to this embodiment, the same effects as those of the first and second embodiments can be obtained. Hereinafter, the description will be given about the effects in detail.

The semiconductor memory device 1 according to this embodiment is different from the semiconductor memory device 1 according to the first embodiment in that the pillar select transistor STp2 is provided in place of the diode DI, and one source line SL and one bit line BL are connected to the memory unit MU. Specifically, in each memory unit MU, for example, the source line SL, the pillar select transistor STp0, the cell chain CC0, the pillar select transistor STp2, the cell chain CC1, the pillar select transistor STp1, and the bit line BL are connected in series. The word line WL is connected to the gate of the pillar select transistor STp2, and the current flowing between the cell chains CC0 and CC1 in each memory pillar MP is controlled by the voltage to be applied to the word line WL.

Furthermore, the semiconductor memory device 1 according to this embodiment is provided with the cell select line SGc which can be controlled for each cell chain CC in each layer. Specifically, the cell select line SGc_o corresponding to the memory cell MC of the cell chain CC0 and the cell select line SGc_e corresponding to the memory cell MC of the cell chain CC1 are provided in the same layer.

In such a configuration, the semiconductor memory device 1 causes a potential difference between the bit line BL and the source line SL corresponding to the memory unit MU containing the selected memory cell MC, so that the current flows to the selected memory cell MC. Then, the semiconductor memory device 1 applies different voltages to the cell select line SGc_o or SGc_e corresponding to the selected memory cell MC and the unselected cell select line SGc, so that the current flows to the variable resistance element VR of the selected memory cell MC. In other words, the semiconductor memory device 1 can select the memory cell MC disposed in the same layer for every cell chain CC, and can perform the various operations on one memory cell MC.

As described above, the semiconductor memory device 1 according to this embodiment can be configured such that two cell chains CC are provided in one memory pillar MP similarly to the first and second embodiments. Therefore, the semiconductor memory device 1 according to this embodiment can make the entire storage capacity of the semiconductor memory device 1 large similarly to the first and second embodiments.

In addition, the semiconductor memory device 1 according to this embodiment is provided with the pillar select transistor STp2 as an element to select the memory pillar MP. A manufacturing process in a case where the transistor is formed can be simplified more than that in a case where the diode DI is formed. In other words, the manufacturing process of the semiconductor memory device 1 according to this embodiment can be simplified more than that in the first to third embodiments.

[5] Modifications

The semiconductor memory device 1 according to the above embodiments includes a variable resistance memory includes first to third insulating layers, first and second variable resistance layers, first and second semiconductor layers, and first and second electric conductors. The first insulating layer (35 in FIG. 8) extends in a first direction. The first insulating layer is disposed between the first and second variable resistance layers (42 in FIG. 8) in a second direction different from the first direction. The first insulating layer and the first and second variable resistance layers are disposed between the first and second semiconductor layers (41 in FIG. 8) in the second direction. The first insulating layer, the first and second variable resistance layers and the first and second semiconductor layers are disposed between the second and third insulating layers (40 in FIG. 8) in the second direction. First and second electric conductors (36 in FIG. 8) provided in a first layer. The first and second electric conductors are in contact with the second and third insulating layers respectively. The first to third insulating layers, the first and second variable resistance layers and the first and second semiconductor layers are disposed between the first and second electric conductors in the second direction.

Therefore, it is possible to increase the storage capacity of the semiconductor memory device.

Furthermore, the semiconductor memory device 1 is not limited to the above configuration, and can be applied to various forms. For example, the semiconductor memory device 1 according to the above embodiments has been described about an example that the via contact VC is formed in one stage, but the invention is not limited thereto. For example, the via contact VC may be provided in two stages to electrically connect the memory pillar MP and the bit line BL. In addition, in such a case, the via contacts VC to be connected may be provided in different electric conductors.

In addition, the above embodiments have been described about an example in a case where the sense amplifier SA or the write driver 17 applies various voltages only to the selected bit line BL, but the invention is not limited thereto. For example, the peripheral circuits of the memory cell array 10 may be configured to apply a different voltage to the unselected bit line BL in various operations. In such a configuration, almost the same voltage to the unselected word line WL is applied to the unselected bit line BL in various operations. Therefore, it is possible to suppress the current flowing into the unselected memory pillar MP in various operation.

In addition, in the above embodiments, the reference current generator RC contained in the sense amplifier module 18 is provided with the structure similar to that of the memory cell MC for example. While not limited to the above structure, a fixed resistor may be used as the reference current generator RC.

In addition, the above embodiments have been described about a case where the 1-bit data is stored in each memory cell MC for example, but the invention is not limited thereto. For example, the memory cell MC may store 2 or more bits of data. In such a case, a resistance state of the variable resistance element VR contained in the memory cell MC can take at least three or more resistance states. In addition, for example, it may be configured such that the reference current generator RC also can generate a plural types of reference currents similarly according to three or more resistance states of the variable resistance element VR.

In addition, the fourth embodiment has been described about a case where the adjacent memory pillars MP shares the bit line BL or the source line SL, but the invention is not limited thereto. For example, the semiconductor memory device 1 according to the fourth embodiment may be provided with the bit line BL and the source line SL in each memory pillar MP similarly to the third embodiment.

Furthermore, in the above embodiments, timings of various operation of the semiconductor memory device 1 may be slightly shifted. For example, the timings to apply various voltages to the bit line BL, the word line WL, the pillar select line SGp, and the cell select line SGc may be shifted from time t0 illustrated in FIG. 11.

In addition, the expression "connection" in this specification indicates an electrical connection, and does not exclude a connection between elements through another element.

In addition, the expression "the transistor enters the ON state" in this specification indicates a state where a voltage equal to or more than a threshold is applied to the gate of the transistor, and a predetermined value of current flows between the drain and the source of the transistor. In addition, the expression "the transistor enters the OFF state" indicates a state where a voltage less than the threshold is applied to the gate of the transistor, and a current flowing between the drain and the source of the transistor is suppressed. Furthermore, in a case where the transistor enters the OFF state, a minute leakage current may flow between the drain and the source of the transistor.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A variable resistance memory comprising:
a first insulating layer extending in a first direction;
first and second variable resistance layers, the first insulating layer being disposed between the first and second variable resistance layers in a second direction different from the first direction;
first and second semiconductor layers, the first insulating layer and the first and second variable resistance layers being disposed between the first and second semiconductor layers in the second direction;
second and third insulating layers, the first insulating layer, the first and second variable resistance layers and the first and second semiconductor layers being disposed between the second and third insulating layers in the second direction;
first and second electric conductors provided in a first layer, the first and second electric conductors being in contact with the second and third insulating layers respectively, the first to third insulating layers, the first and second variable resistance layers and the first and second semiconductor layers being disposed between the first and second electric conductors in the second direction;
third and fourth electric conductors provided in a second layer different from the first layer, the third and fourth electric conductors being in contact with the second and third insulating layers respectively, the first to third insulating layers and the first and second semiconductor layers being disposed between the third and fourth electric conductors in the second direction;
a fifth electric conductor being in contact with one ends of the first and second semiconductor layers in the first direction;
a sixth electric conductor that extends in a third direction different from the first direction, and is in contact with the fifth electric conductor, the fifth electric conductor being disposed between the one ends of the first and second semiconductor layers and the sixth electric conductor;
a seventh electric conductor being in contact with the other ends of the first and second semiconductor layers in the first direction;
an eighth electric conductor that extends in a fourth direction different from the first to third directions, and is in contact with the seventh electric conductor, the seventh electric conductor being disposed between the other ends of the first and second semiconductor layers and the eighth electric conductor,
a first memory cell that is disposed between the first and second electric conductors, and includes part of the first variable resistance layer; and
a second memory cell that is disposed between the first and second electric conductors, and includes part of the second variable resistance layer,
wherein no variable resistance layer is provided in a region between the third and fourth electric conductors,
wherein the fifth electric conductor has a rectifying function between the sixth electric conductor and the first and second semiconductor layers,
wherein the first and second variable resistance layers each take a high resistance state or a low resistance state, and
in a read operation of the first memory cell,
a first voltage is applied to the first and second electric conductors, a second voltage higher than the first voltage is applied to the third electric conductor, a third voltage lower than the second voltage is applied to the fourth electric conductor, a fourth voltage is applied to the sixth electric conductor, and a fifth voltage different from the fourth voltage is applied to the eighth electric conductor.

2. The memory of claim 1, wherein
the first to fourth electric conductors extend in the fourth direction.

3. The memory of claim 1, further comprising:
ninth and tenth electric conductors provided in a third layer between the first and second layers, the ninth and tenth electric conductors being in contact with the second and third insulating layers respectively, the first to third insulating layers, the first and second variable resistance layers and the first and second semiconductor layers being disposed between the ninth and tenth electric conductors in the second direction, wherein a sixth voltage higher than the first voltage is applied to the ninth and tenth electric conductors in the read operation of the first memory cell.

4. The memory of claim 1, further comprising:

a fourth insulating layer extending in the first direction;

third and fourth variable resistance layers, the fourth insulating layer being disposed between the third and fourth variable resistance layers in the second direction;

third and fourth semiconductor layers, the fourth insulating layer and the third and fourth variable resistance layers being disposed between the third and fourth semiconductor layers in the second direction;

fifth and sixth insulating layers, the fourth insulating layer, the third and fourth variable resistance layers and the third and fourth semiconductor layers being disposed between the fifth and sixth insulating layers in the second direction, the fifth insulating layer being in contact with the first and third electric conductors;

a ninth electric conductor provided in the first layer, the ninth electric conductor being in contact with the sixth insulating layer, the fourth to sixth insulating layers, the third and fourth variable resistance layers and the third and fourth semiconductor layers being disposed between the first and ninth electric conductors in the second direction;

a tenth electric conductor provided in the second layer, the tenth electric conductor being in contact with the sixth insulating layer, the fourth to sixth insulating layers and the third and fourth semiconductor layers being disposed between the third and tenth electric conductors in the second direction;

an eleventh electric conductor being in contact with one ends of the third and fourth semiconductor layers in the first direction, the eleventh electric conductor being disposed between the one ends of the third and fourth semiconductor layers and the sixth electric conductor;

a twelfth electric conductor being in contact with the other ends of the third and fourth semiconductor layers in the first direction; and a thirteenth electric conductor that extends in the fourth direction, and is in contact with the twelfth electric conductor, the twelfth electric conductor being disposed between the other ends of the third and fourth semiconductor layers and the thirteenth electric conductor, wherein no variable resistance layer is provided in a region between the third and tenth electric conductors, and the eleventh electric conductor has a rectifying function between the sixth electric conductor and the third and fourth semiconductor layers.

5. The memory of claim 4, further comprising:

a first memory cell that is disposed between the first and second electric conductors, and includes part of the first variable resistance layer; and a second memory cell that is disposed between the first and second electric conductors, and includes part of the second variable resistance layer, wherein the first and second variable resistance layers each take a high resistance state or a low resistance state, and in a read operation of the first memory cell, a first voltage is applied to the first, second, and ninth electric conductors, a second voltage higher than the first voltage is applied to the third electric conductor, a third voltage lower than the second voltage is applied to the fourth and tenth electric conductors, a fourth voltage is applied to the sixth electric conductor, and a fifth voltage different from the fourth voltage is applied to the eighth electric conductor.

6. The memory of claim 1, wherein the first and second variable resistance layers contain germanium, antimony, and tellurium.

7. A variable resistance memory comprising:

a first insulating layer extending in a first direction;

first and second variable resistance layers, the first insulating layer being disposed between the first and second variable resistance layers in a second direction different from the first direction;

first and second semiconductor layers, the first insulating layer and the first and second variable resistance layers being disposed between the first and second semiconductor layers in the second direction;

second and third insulating layers, the first insulating layer, the first and second variable resistance layers and the first and second semiconductor layers being disposed between the second and third insulating layers in the second direction;

first and second electric conductors provided in a first layer, the first and second electric conductors being in contact with the second and third insulating layers respectively, the first to third insulating layers, the first and second variable resistance layers and the first and second semiconductor layers being disposed between the first and second electric conductors in the second direction;

third and fourth electric conductors being in contact with one ends of the first and second semiconductor layers in the first direction respectively; and fifth and sixth electric conductors extending in a third direction different from the first and second direction, the fifth and sixth electric conductors being in contact with the third and fourth electric conductors respectively, the third electric conductor being disposed between the one ends of the first semiconductor layer and the fifth electric conductor, the fourth electric conductor being disposed between the one ends of the second semiconductor layer and the sixth electric conductor;

a seventh electric conductor being in contact with the other ends of the first and second semiconductor layers in the first direction;

an eighth electric conductor that extends in a fourth direction different from the first to third directions, and is in contact with the seventh electric conductor, the seventh electric conductor being disposed between the other ends of the first and second semiconductor layers and the eighth electric conductor;

a first memory cell that is disposed between the first and second electric conductors, and includes part of the second variable resistance layer; and a second memory cell that is disposed between the first and second electric conductors, and includes part of the second variable resistance layer, wherein the seventh electric conductor has a rectifying function between the eighth electric conductor and the first and second semiconductor layers, wherein the first and second electric conductors extend in the third direction, and wherein the first and second variable resistance layers each take a high resistance state or a low resistance state, and in a read operation of the first memory cell, a first voltage is applied to the first and second electric conductors, a second voltage is applied to the fifth electric conductor, a third voltage different from the second voltage is applied to the sixth electric conductor, a fourth voltage different from the second voltage is applied to the eighth electric conductor.

8. The memory of claim 7, further comprising:

ninth and tenth electric conductors provided in a second layer different from the first layer, the ninth and tenth electric conductors being in contact with the second and third insulating layers respectively, the first to third insulating layers, the first and second variable resistance layers and the first and second semiconductor layers being disposed between the ninth and tenth electric conductors in the second direction, wherein a fifth voltage higher than the first voltage is applied to the ninth and tenth electric conductors in the read operation of the first memory cell.

9. The memory of claim 7, further comprising:

a fourth insulating layer extending in the first direction;

third and fourth variable resistance layers, the fourth insulating layer being disposed between the third and fourth variable resistance layers in the second direction;

third and fourth semiconductor layers, the fourth insulating layer and the third and fourth variable resistance layers being disposed between the third and fourth semiconductor layers in the second direction;

fifth and sixth insulating layers, the fourth insulating layer, the third and fourth variable resistance layers and the third and fourth semiconductor layers being disposed between the fifth and sixth insulating layers in the second direction, the fifth insulating layer being in contact with the first electric conductor;

a ninth electric conductor provided in the first layer, the ninth electric conductor being in contact with the sixth insulating layer, the fourth to sixth insulating layers, the third and fourth variable resistance layers and the third and fourth semiconductor layers being disposed between the first and ninth electric conductors in the second direction;

tenth and eleventh electric conductor being in contact with one ends of the third and fourth semiconductor layers in the first direction respectively;

twelfth and thirteenth electric conductors extending in the fourth direction, the twelfth and thirteenth electric conductors being in contact with the tenth and eleventh electric conductors respectively, the tenth electric conductor being disposed between the one end of the third semiconductor layer and the twelfth electric conductor, the eleventh electric conductor being disposed between the one end of the fourth semiconductor layer and the thirteenth electric conductor; and fourteenth electric conductor being in contact with the other ends of the third and fourth semiconductor layers in the first direction, the fourteenth electric conductor being disposed between the other ends of the third and fourth semiconductor layers and the eighth electric conductor, wherein the fourteenth electric conductor has a rectifying function between the eighth electric conductor and the third and fourth semiconductor layers.

10. The memory of claim 7, wherein the first second variable resistance layers contain germanium, antimony and tellurium.

11. A variable resistance memory comprising:

a first insulating layer extending in a first direction;

first and second variable resistance layers, the first insulating layer being disposed between the first and second variable resistance layers in a second direction different from the first direction;

first and second semiconductor layers, the first insulating layer and the first and second variable resistance layers being disposed between the first and second semiconductor layers in the second direction;

second and third insulating layers, the first insulating layer, the first and second variable resistance layers and the first and second semiconductor layers being disposed between the second and third insulating layers in the second direction; and first and second electric conductors provided in a first layer, the first and second electric conductors being in contact with the second and third insulating layers respectively, the first to third insulating layers, the first and second variable resistance layers and the first and second semiconductor layers being disposed between the first and second electric conductors in the second direction;

third and fourth electric conductors being in contact with one ends of the first and second semiconductor layers in the first direction respectively;

fifth and sixth electric conductors extending in a third direction different from the first and second direction, the fifth and sixth electric conductors being in contact with the third and fourth electric conductors respectively, the third electric conductor being disposed between the one ends of the first semiconductor layer and the fifth electric conductor, the fourth electric conductor being disposed between the one ends of the second semiconductor layer and the sixth electric conductor; and a seventh electric conductor that provided in a second layer different from the first layer, extends in the third direction, and passes through between the first and second semiconductor layers, wherein no variable resistance layer is provided in a region between the first and second semiconductor layers in the second layer.

12. The memory of claim 11, further comprising:

an eighth electric conductor being in contact with one ends of the first and second semiconductor layers in the first direction; and a ninth electric conductor that extends in a fourth direction different from the first and third direction, and is in contact with the eighth electric conductor, the eighth electric conductor being disposed between the one ends of the first and second semiconductor layers and the ninth electric conductor, wherein the eighth electric conductor has a rectifying function between the ninth electric conductor and the first and second semiconductor layers.

13. The device of claim 12, further comprising:

a first memory cell that is disposed between the first and second electric conductors, and includes part of the first variable resistance layer; and a second memory cell that is disposed between the first and second electric conductors, and includes part of the second variable resistance layer, wherein the first and second variable resistance layers each take a high resistance state or a low resistance state, and in a read operation of the first memory cell, a first voltage is applied to the first and second electric conductors, a second voltage is applied to the fifth electric conductor, a third voltage different from the second voltage is applied to the ninth electric conductor, a fourth voltage higher than the first voltage is applied to the seventh electric conductor.

14. The memory of claim 12, further comprising:

a fourth insulating layer extending in the first direction;

third and fourth variable resistance layers, the fourth insulating layer being disposed between the third and fourth variable resistance layers in the second direction;

third and fourth semiconductor layers, the fourth insulating layer and the third and fourth variable resistance layers being disposed between the third and fourth semiconductor layers in the second direction;

fifth and sixth insulating layers, the fourth insulating layer, the third and fourth variable resistance layers and the third and fourth semiconductor layers being disposed between the fifth and sixth insulating layers in the second direction, the fifth insulating layer being in contact with the first electric conductor;

a tenth electric conductor provided in the first layer, the tenth electric conductor being in contact with the sixth insulating layer, the fourth to sixth insulating layers, the third and fourth variable resistance layers and the third and fourth semiconductor layers being disposed between the first and tenth electric conductors in the second direction;

an eleventh electric conductor that is provided in the second layer, extends in the third direction, and passes through between the third and fourth semiconductor layers;

twelfth and thirteenth electric conductors being in contact with one ends of the third and fourth semiconductor layers in the first direction respectively; the twelfth electric conductor being in contact with the fifth electric conductor;

a fourteenth electric conductor that extends in the third direction, and is in contact with the thirteenth electric conductor, the thirteenth electric conductor being disposed between the one ends of the first and second semiconductor layers and the fourteenth electric conductor; and a fifteenth electric conductor being in contact with the other ends of the third and fourth semiconductor layers in the first direction, the fifteenth electric conductor being disposed between the other ends of the third and fourth semiconductor layers and the ninth electric conductor, wherein no variable resistance layer is provided in a region between the third and fourth semiconductor layers in the second layer, and the fifteenth electric conductor has a rectifying function between the ninth electric conductor and the third and fourth semiconductor layers.

15. The memory of claim 14, further comprising:

a first memory cell that is disposed between the first and second electric conductors, and includes part of the first variable resistance layer; and a second memory cell that is disposed between the first and second electric conductors, and includes part of the second variable resistance layer, wherein the first and second variable resistance layers each take a high resistance state or a low resistance state, and in a read operation of the first memory cell, a first voltage is applied to the first, second and tenth electric conductors, a second voltage higher than the first voltage is applied to the seventh electric conductor, a third voltage lower than the second voltage is applied to the eleventh electric conductor, a fourth voltage is applied to the fifth electric conductor, a fifth voltage different from the fourth voltage is applied to the sixth electric conductor, a sixth voltage different from the fourth voltage is applied to the ninth electric conductor.

16. The memory of claim 11, wherein the first and second variable resistance layers contain germanium, antimony and tellurium.

* * * * *